US012146237B2

(12) United States Patent
Kamikawa et al.

(10) Patent No.: US 12,146,237 B2
(45) Date of Patent: Nov. 19, 2024

(54) METHOD OF OBTAINING A SMOOTH SURFACE WITH EPITAXIAL LATERAL OVERGROWTH

(71) Applicant: The Regents of the University of California, Oakland, CA (US)

(72) Inventors: Takeshi Kamikawa, Kyoto (JP); Srinivas Gandrothula, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 636 days.

(21) Appl. No.: 17/285,827

(22) PCT Filed: Oct. 31, 2019

(86) PCT No.: PCT/US2019/059086
§ 371 (c)(1),
(2) Date: Apr. 15, 2021

(87) PCT Pub. No.: WO2020/092722
PCT Pub. Date: May 7, 2020

(65) Prior Publication Data
US 2021/0381124 A1 Dec. 9, 2021

Related U.S. Application Data

(60) Provisional application No. 62/753,225, filed on Oct. 31, 2018.

(51) Int. Cl.
*H01L 21/02* (2006.01)
*C30B 25/04* (2006.01)
(Continued)

(52) U.S. Cl.
CPC .............. *C30B 25/04* (2013.01); *C30B 25/18* (2013.01); *C30B 29/403* (2013.01);
(Continued)

(58) Field of Classification Search
CPC ......... C30B 25/04; C30B 25/18; C30B 25/02; C30B 25/00; C30B 29/403; C30B 29/406;
(Continued)

(56) References Cited

U.S. PATENT DOCUMENTS 7,732,236 B2 * 6/2010 Nakahata .......... H01L 21/02458
257/E33.033
8,809,832 B1 * 8/2014 Peng ................... H01L 21/0242
257/43
(Continued)

FOREIGN PATENT DOCUMENTS

CN      103582934 A       2/2014
JP      2002-261392       9/2002
(Continued)

OTHER PUBLICATIONS

EPO Communication pursuant to Article 94(3) EPC dated Feb. 2, 2023 for EP Application No. 19879049.5.
(Continued)

*Primary Examiner* — Nikolay K Yushin
(74) *Attorney, Agent, or Firm* — Gates & Cooper LLP

(57) ABSTRACT

A method for obtaining a smooth surface of an epi-layer with epitaxial lateral overgrowth. The method does not use miscut orientations and does not suppress the occurrence of pyramidal hillocks, but instead embeds the pyramidal hillocks in the epi-layer. A growth restrict mask is used to limit the expansion of the pyramidal hillocks in a lateral direction. The surface of the epi-layer becomes extremely smooth due to the disappearance of the pyramidal hillocks.

10 Claims, 45 Drawing Sheets

(51) Int. Cl.
  *C30B 25/18* (2006.01)
  *C30B 29/40* (2006.01)
  *H01L 21/78* (2006.01)
  *H01L 29/06* (2006.01)
  *H01L 29/20* (2006.01)
  *H01L 29/40* (2006.01)
  *H01L 33/00* (2010.01)
  *H01L 33/24* (2010.01)
  *H01L 33/32* (2010.01)
  *H01S 5/02* (2006.01)
  *H01S 5/22* (2006.01)
  *H01S 5/343* (2006.01)

(52) U.S. Cl.
  CPC ...... *C30B 29/406* (2013.01); *H01L 21/02389* (2013.01); *H01L 21/0242* (2013.01); *H01L 21/0254* (2013.01); *H01L 21/02647* (2013.01); *H01L 21/7806* (2013.01); *H01L 29/0657* (2013.01); *H01L 29/2003* (2013.01); *H01L 33/007* (2013.01); *H01L 33/24* (2013.01); *H01L 33/32* (2013.01); *H01S 5/0202* (2013.01); *H01S 5/22* (2013.01); *H01S 5/34333* (2013.01); *H01S 2304/12* (2013.01)

(58) Field of Classification Search
  CPC ......... C30B 29/06; C30B 29/04; C30B 29/40; H01L 21/02389; H01L 21/02; H01L 21/0254; H01L 21/02647; H01L 21/7806; H01L 21/78; H01L 21/0242; H01L 21/02458; H01L 21/02513; H01L 21/6836; H01L 29/0657; H01L 29/06; H01L 29/2003; H01L 29/20; H01L 33/007; H01L 33/24; H01L 33/32; H01L 33/22; H01L 33/0075; H01L 33/0093; H01L 33/20; H01L 33/40; H01L 33/341; H01L 33/647; H01L 33/00; H01L 2933/0016; H01L 2933/0066; H01L 2933/0033; H01S 5/0202; H01S 5/0205; H01S 5/0207; H01S 5/22; H01S 5/34333; H01S 5/02212; H01S 5/04252; H01S 5/042; H01S 5/4031; H01S 5/40; H01S 2304/12; H01S 2304/00; H01S 5/18308; H01S 5/18347; H01S 5/3203
  See application file for complete search history.

(56) References Cited

U.S. PATENT DOCUMENTS

| | | | |
|---|---|---|---|
| 10,312,083 B2* | 6/2019 | Liang | H01L 21/02458 |
| 10,424,692 B2* | 9/2019 | Amstatt | H01L 33/18 |
| 2002/0127856 A1 | 9/2002 | Kunisato et al. | |
| 2007/0077674 A1 | 4/2007 | Okuyama et al. | |
| 2007/0164306 A1* | 7/2007 | Nakahata | H01L 21/02389 |
| | | | 257/E33.033 |
| 2008/0315222 A1 | 12/2008 | Kim et al. | |
| 2011/0186810 A1 | 8/2011 | Chao et al. | |
| 2011/0212559 A1 | 9/2011 | Ohmae et al. | |
| 2012/0309269 A1 | 12/2012 | Khayyat et al. | |
| 2014/0131750 A1* | 5/2014 | Peng | H01L 21/02639 |
| | | | 257/94 |
| 2017/0092810 A1 | 3/2017 | Raring et al. | |
| 2018/0211837 A1* | 7/2018 | Liang | H01L 21/02433 |
| 2018/0277717 A1* | 9/2018 | Amstatt | H01L 33/08 |

FOREIGN PATENT DOCUMENTS

| | | |
|---|---|---|
| WO | 2005122267 | 1/2007 |
| WO | 2017168012 A1 | 10/2017 |

OTHER PUBLICATIONS

PCT International Search Report and Written Opinion dated Jan. 22, 2020 for PCT/US2019/59086.

Japanese Notice of Reasons for Refusal (with English translation) dated May 30, 2022 for Japanese Patent Application No. 2021-548562.

European Extended Search Report dated Nov. 25, 2021 for EP Application No. 19879049.5.

Chinese Office Action dated Aug. 22, 2023 for Chinese Application No. 201980087480.0.

Japanese Notice of Reasons for Rejection (with English translation) dated Dec. 7, 2022 for Japanese Patent Application No. 2021-548562.

* cited by examiner

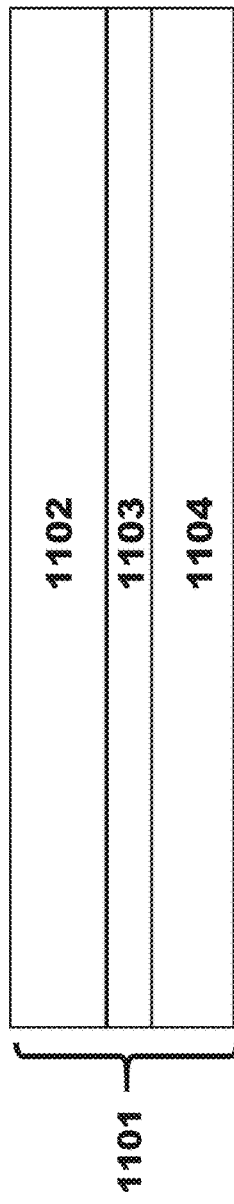
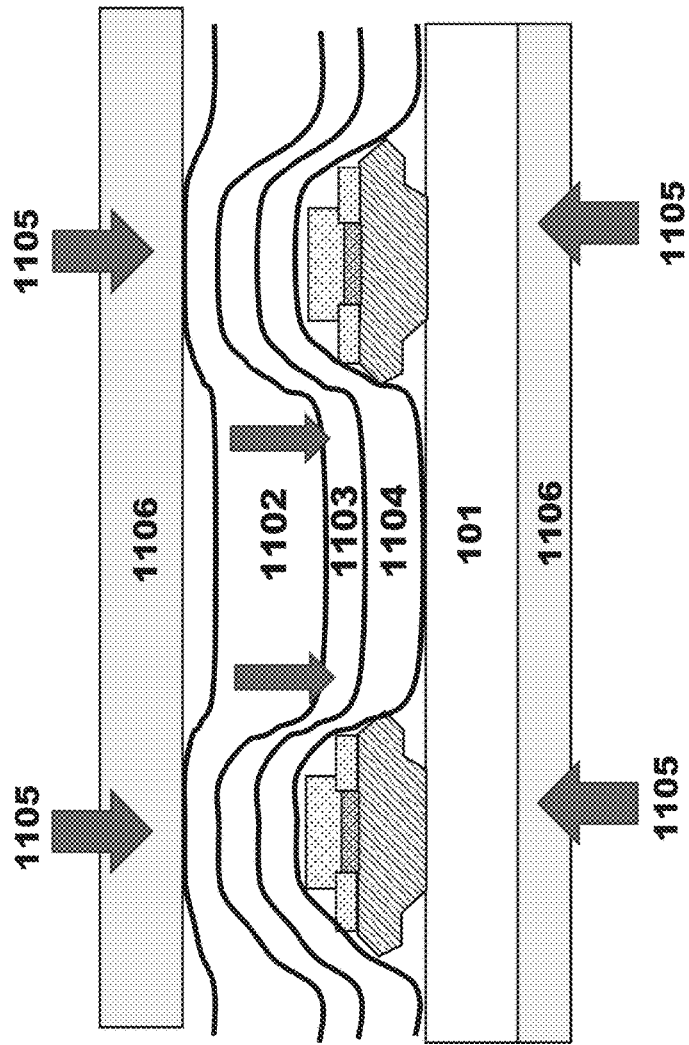
Fig. 11(a)
Fig. 11(b)

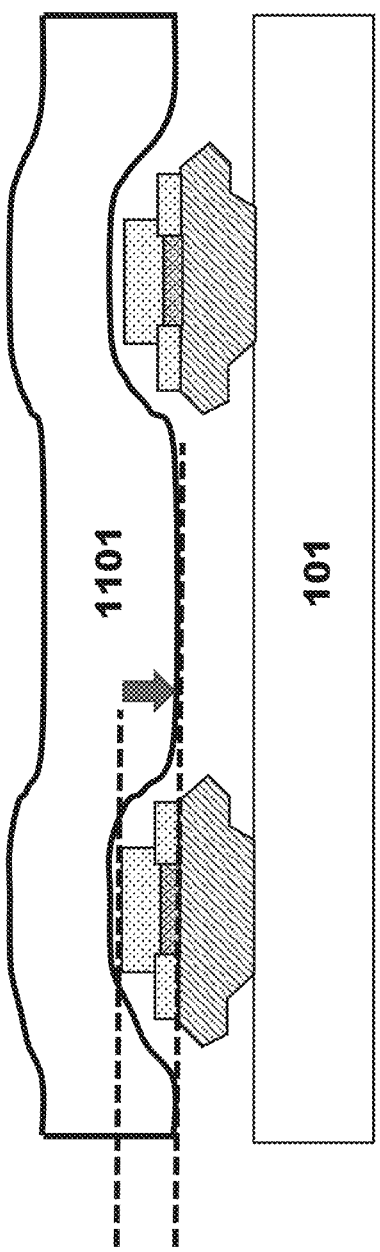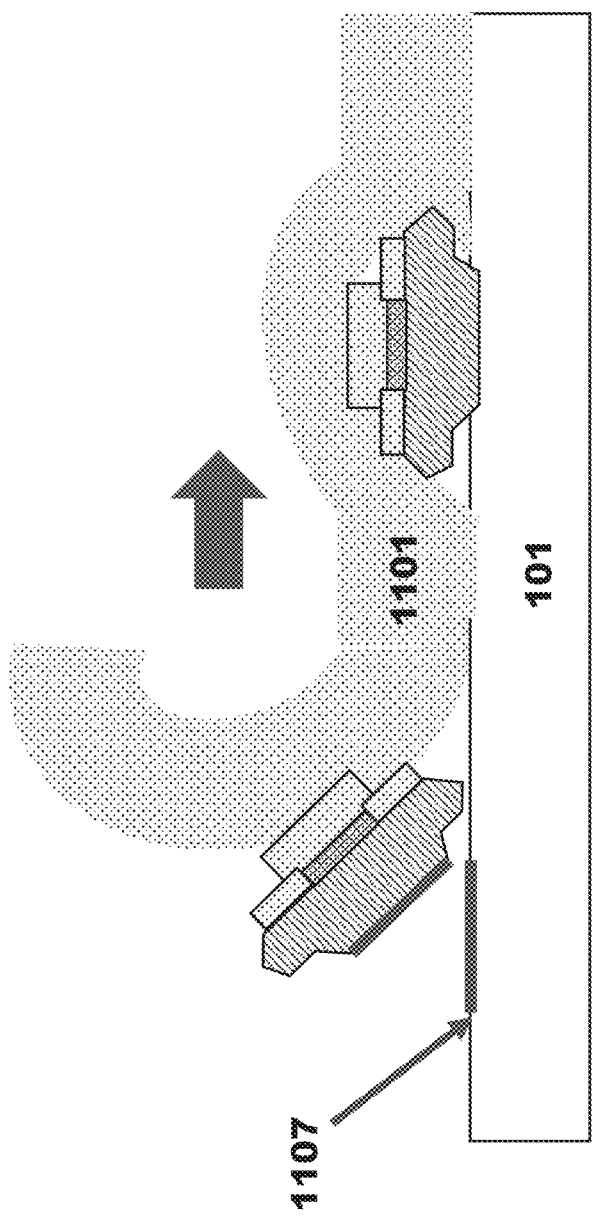

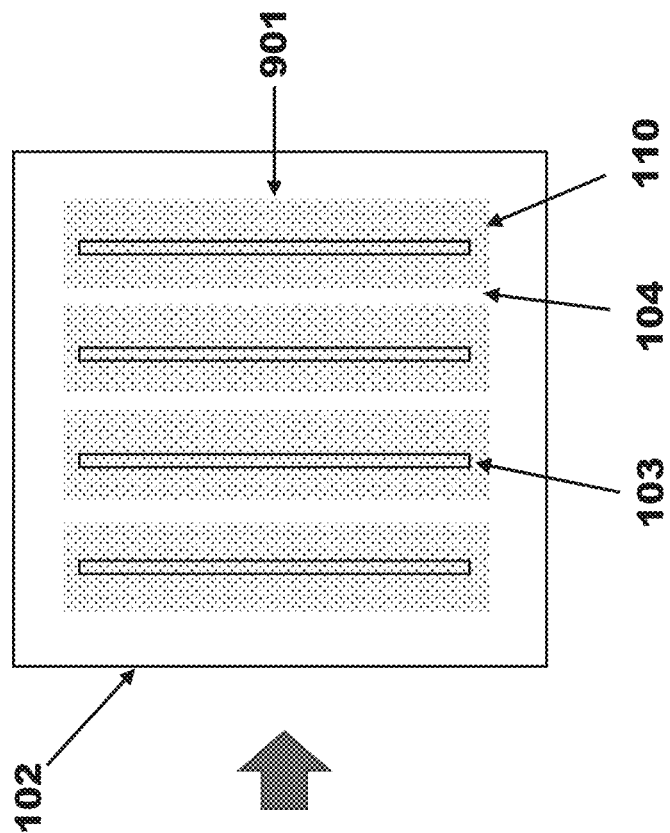
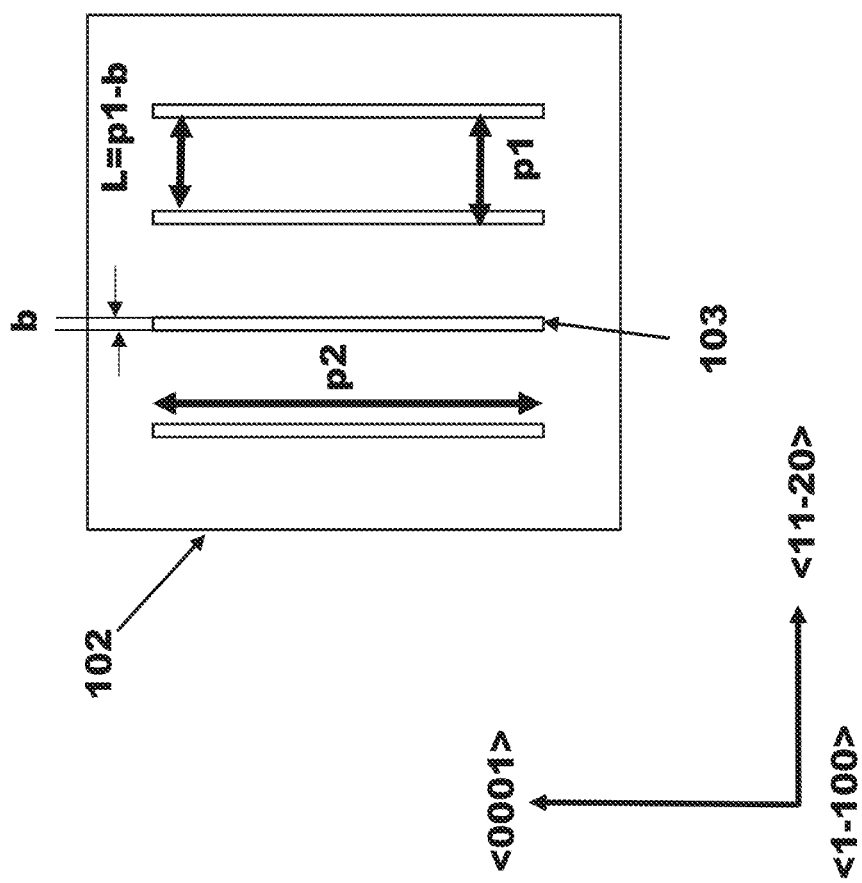
Fig. 13(a)
Fig. 13(b)

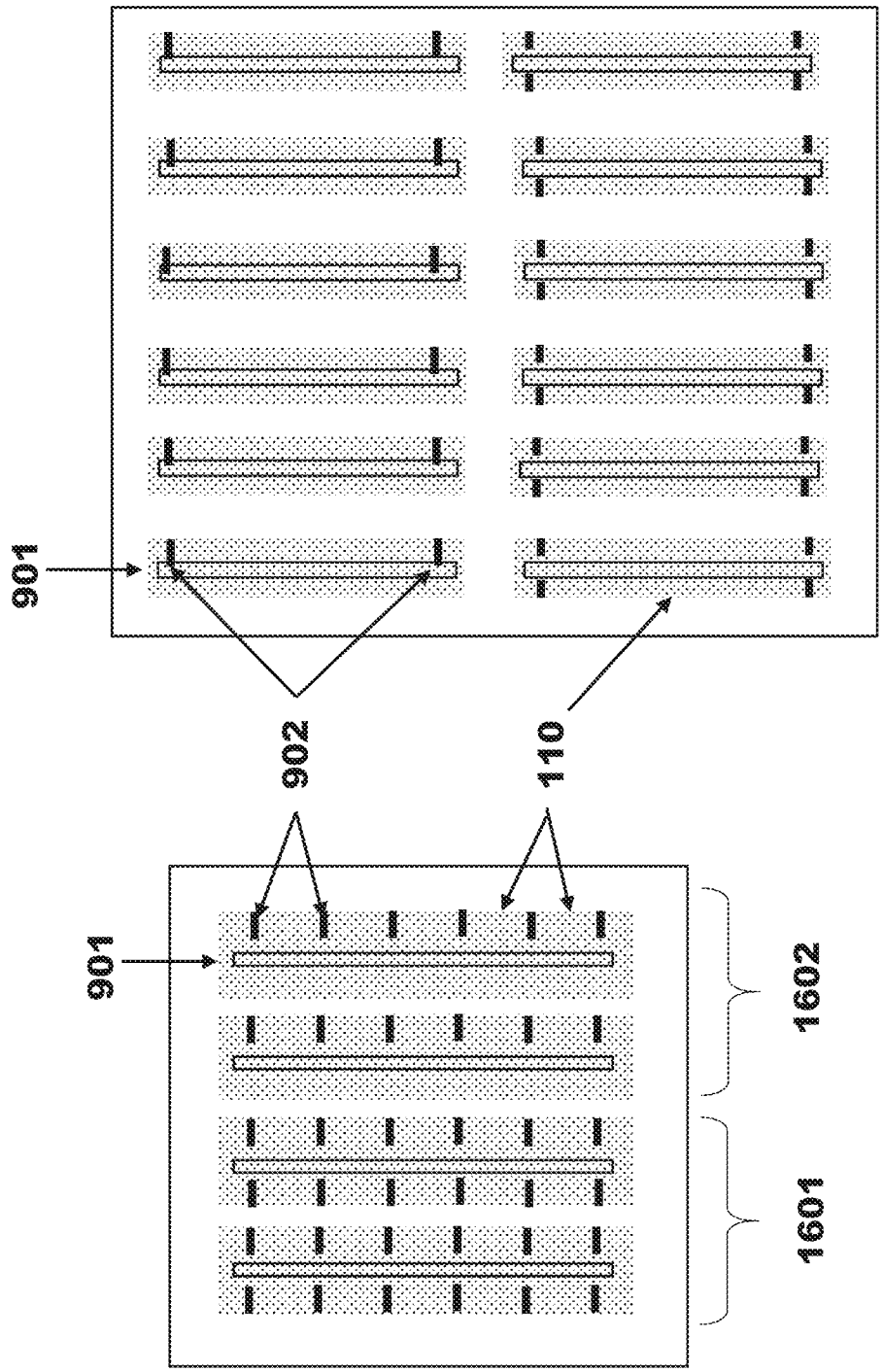

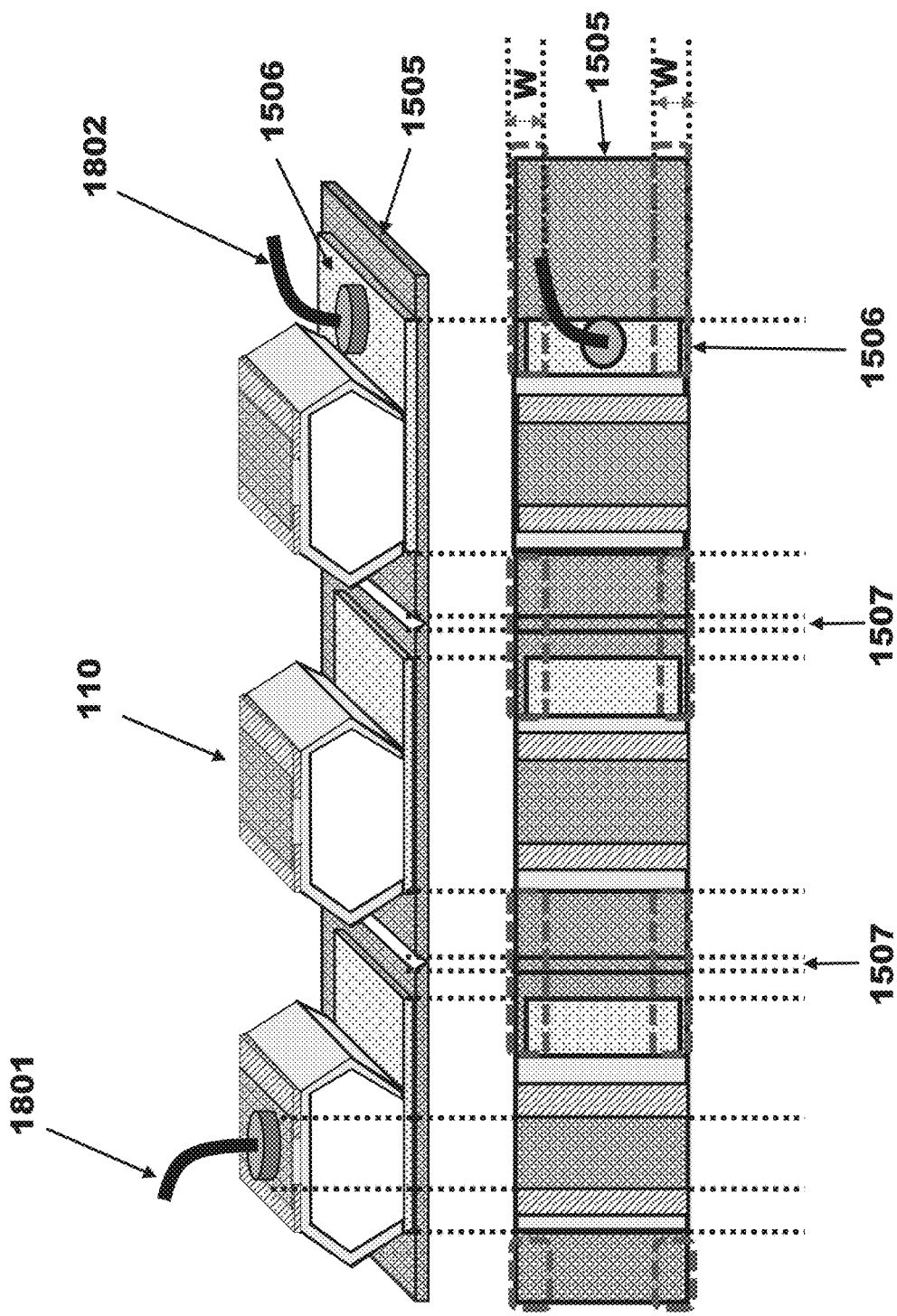

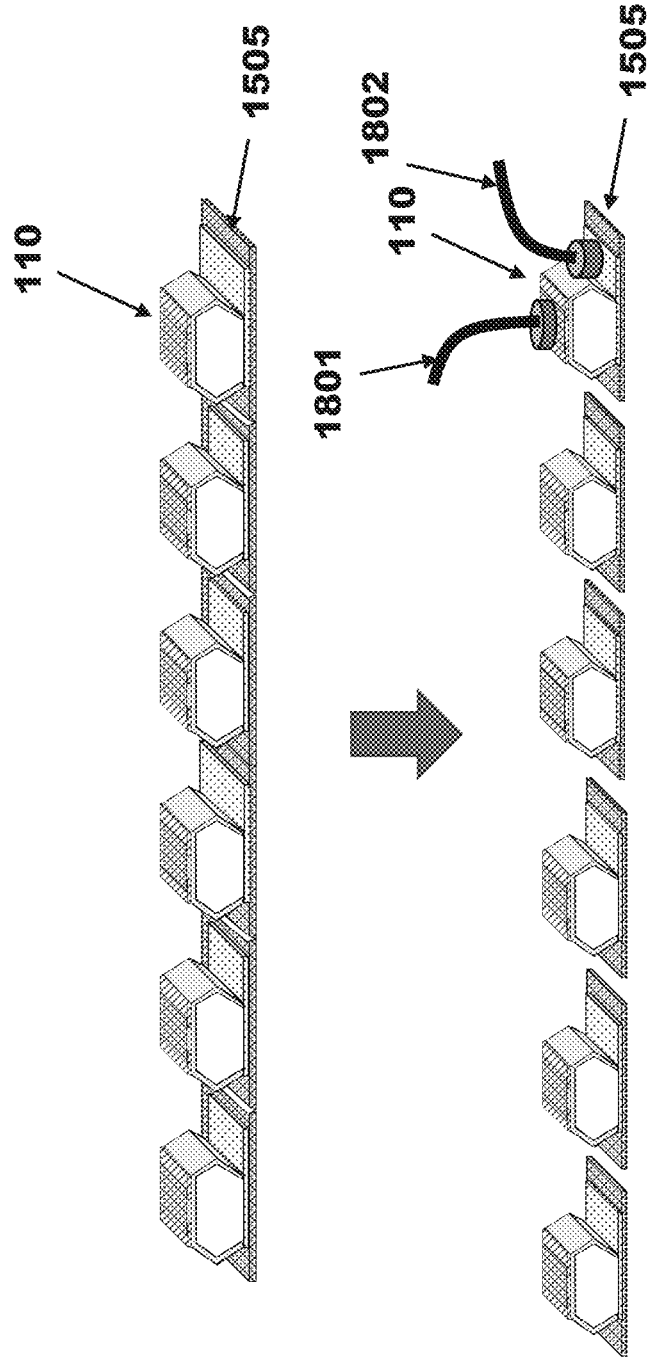

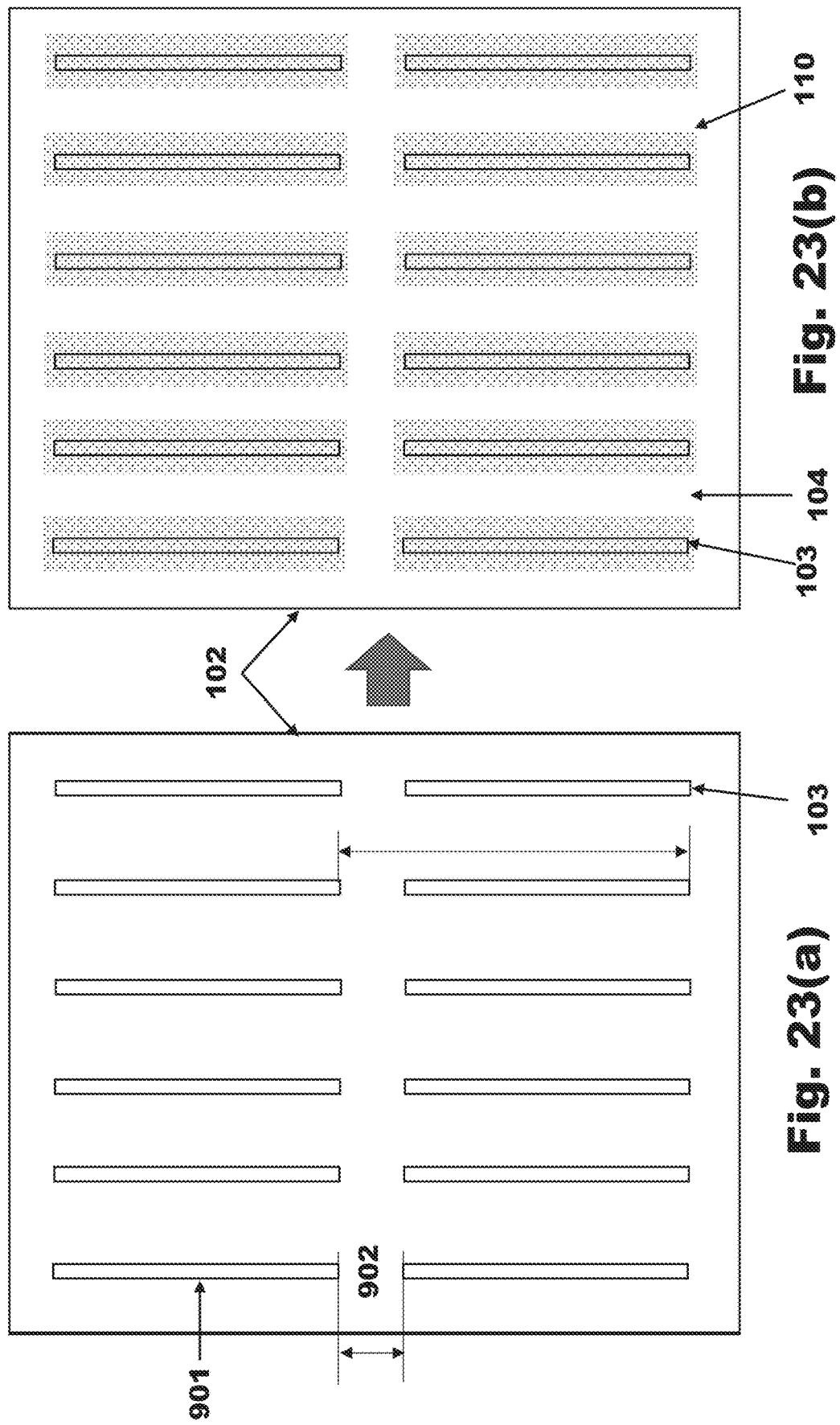

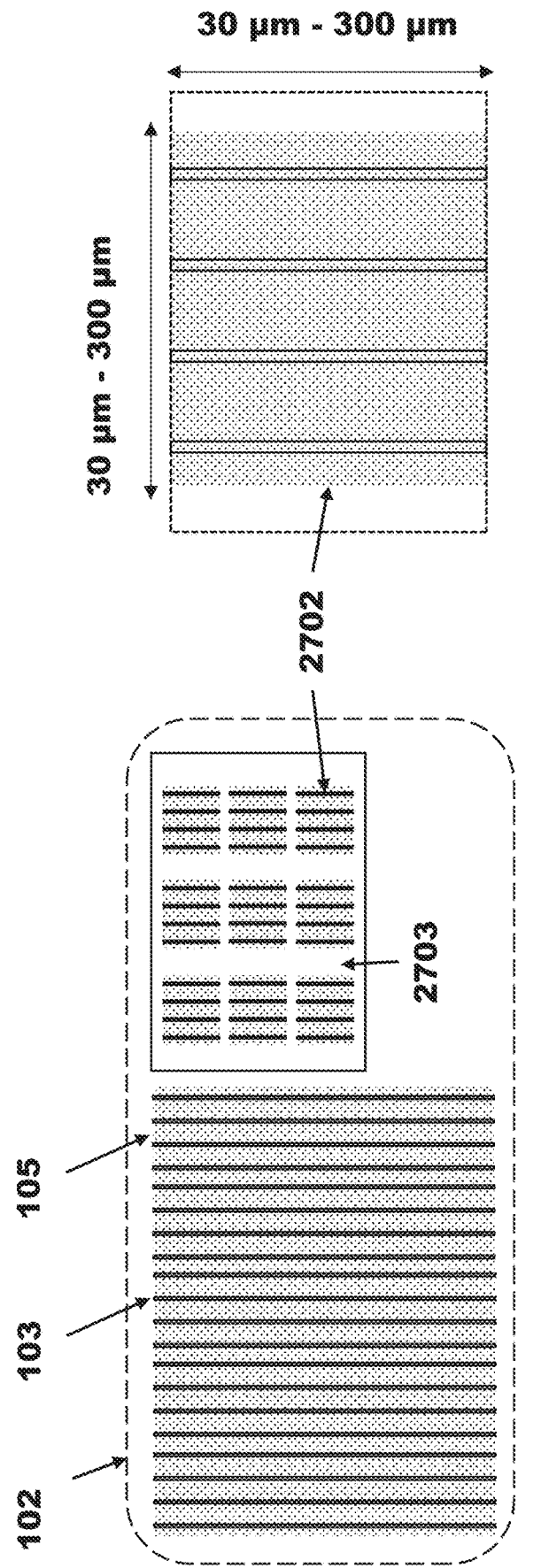

METHOD OF OBTAINING A SMOOTH SURFACE WITH EPITAXIAL LATERAL OVERGROWTH

CROSS REFERENCE TO RELATED APPLICATIONS

This application claims the benefit under 35 U.S.C. Section 119(e) of the following commonly-assigned application:

U.S. Provisional Application Ser. No. 62/753,225, filed on Oct. 31, 2018, by Takeshi Kamikawa and Srinivas Gandrothula, entitled "METHOD OF OBTAINING A SMOOTH SURFACE WITH EPITAXIAL LATERAL OVERGROWTH,";

which application is incorporated by reference herein.

This application is related to the following co-pending and commonly-assigned applications:

PCT International Patent Application No. PCT/US18/31393, filed on May 7, 2018, by Takeshi Kamikawa, Srinivas Gandrothula, Hongjian Li and Daniel A. Cohen, entitled "METHOD OF REMOVING A SUBSTRATE,", which application claims the benefit under 35 U.S.C. Section 119(e) of commonly-assigned U.S. Provisional Patent Application No. 62/502,205, filed on May 5, 2017, by Takeshi Kamikawa, Srinivas Gandrothula, Hongjian Li and Daniel A. Cohen, entitled "METHOD OF REMOVING A SUBSTRATE,";

PCT International Patent Application No. PCT/US18/51375, filed on Sep. 17, 2018, by Takeshi Kamikawa, Srinivas Gandrothula and Hongjian Li, entitled "METHOD OF REMOVING A SUBSTRATE WITH A CLEAVING TECHNIQUE,", which application claims the benefit under 35 U.S.C. Section 119(e) of commonly-assigned U.S. Provisional Patent Application No. 62/559,378, filed on Sep. 15, 2017, by Takeshi Kamikawa, Srinivas Gandrothula and Hongjian Li, entitled "METHOD OF REMOVING A SUBSTRATE WITH A CLEAVING TECHNIQUE,";

PCT International Patent Application No. PCT/US19/25187, filed on Apr. 1, 2019, by Takeshi Kamikawa, Srinivas Gandrothula and Hongjian Li, entitled "METHOD OF FABRICATING NONPOLAR AND SEMIPOLAR DEVICES USING EPITAXIAL LATERAL OVERGROWTH,", which application claims the benefit under 35 U.S.C. Section 119(e) of commonly-assigned U.S. Provisional Patent Application Ser. No. 62/650,487, filed on Mar. 30, 2018, by Takeshi Kamikawa, Srinivas Gandrothula, and Hongjian Li, entitled "METHOD OF FABRICATING NONPOLAR AND SEMIPOLAR DEVICES BY USING LATERAL OVERGROWTH,";

PCT International Patent Application No. PCT/US19/32936, filed on May 17, 2019, by Takeshi Kamikawa and Srinivas Gandrothula, entitled "METHOD FOR DIVIDING A BAR OF ONE OR MORE DEVICES,", which application claims the benefit under 35 U.S.C. Section 119(e) of commonly-assigned U.S. Provisional Application Ser. No. 62/672,913, filed on May 17, 2018, by Takeshi Kamikawa and Srinivas Gandrothula, entitled "METHOD FOR DIVIDING A BAR OF ONE OR MORE DEVICES,"; and PCT International Patent Application No. PCT/US19/34686, filed on May 30, 2019, by Srinivas Gandrothula and Takeshi Kamikawa, entitled "METHOD OF REMOVING SEMICONDUCTING LAYERS FROM A SEMICONDUCTING SUBSTRATE,", which application claims the benefit under 35 U.S.C. Section 119(e) of commonly-assigned U.S. Provisional Application Ser. No. 62/677,833, filed on May 30, 2018, by Srinivas Gandrothula and Takeshi Kamikawa, entitled "METHOD OF REMOVING SEMICONDUCTING LAYERS FROM A SEMICONDUCTING SUBSTRATE,";

all of which applications are incorporated by reference herein.

BACKGROUND OF THE INVENTION

1. Field of the Invention

This invention relates to a method for obtaining a smooth surface of an epi-layer with epitaxial lateral overgrowth (ELO).

2. Description of the Related Art

Some device manufacturers have used nonpolar and semipolar Gallium Nitride (GaN) substrates to produce laser diodes (LDs) and light emitting diodes (LEDs) for lighting, optical storage, etc. Nonpolar and semipolar GaN substrates are used to avoid large pyro- and piezo-electric fields, which can result in significant improvements in the emission efficiency. However, epitaxial growth of III-nitrides along nonpolar and semipolar directions is more difficult than growth along a polar c-plane direction.

According to U.S. Patent Application Publication No. 2017/0092810A1, a number of pyramidal hillocks were observed on the surface of nonpolar m-plane III-nitride films after epitaxial growth. This is a problem when a LD or LED structures are fabricated on the surface, because this surface roughness may cause non-uniformity of optical gain and fluctuations in device processes. It may also decrease the yield of the device processes. Furthermore, reliability of the LDs is affected by hillocks and large surface roughness. See, e.g., Applied Physics Letters 91, 191906 (2007).

It has been known that pyramidal hillocks cause the roughness of a surface of a GaN substrate to deteriorate. In order to prevent pyramidal hillocks from appearing on the epi-layer surface, a method has been used which controlled a mis-cut orientation of the GaN substrate over 1 degree and grew the epi-layer using a Nitrogen carrier gas.

However, the growth conditions for obtaining a smooth surface are very narrow and with strict limitations. One problem is that surface morphology is affected by off-angle orientation, and it is well known that GaN wafers have a large in-plane distribution of mis-cut orientations. This causes the surface morphology of the epi-layer to change at different portions of the substrate, which reduces the yield during mass production. See, e.g., Physica Status Solidi (a), Volume 214, Issue 8, 1600829 (2017).

Furthermore, the hillock's facet dependence on leakage current under reverse-biased conditions was observed, wherein the leakage current distribution was caused by carrier and oxygen concentrations. The leakage current distribution is a problem when making devices, such as LDs, LEDs and power devices, such as Schottky barrier diodes (SBDs) or metal-oxide-semiconductor field-effect-transistors (MOSFETs).

SUMMARY OF THE INVENTION

To overcome the limitations in the prior art described above, and to overcome other limitations that will become apparent upon reading and understanding this specification, the present invention discloses a method for obtaining a smooth surface of an epi-layer with epitaxial lateral overgrowth, wherein the method does not use mis-cut orientations and does not suppress the occurrence of pyramidal hillocks, but instead embeds the pyramidal hillocks in the epi-layer. A growth restrict mask is used to limit the expansion of the pyramidal hillocks in a lateral direction. The surface of the resulting epi-layers are extremely smooth due to the disappearance of the pyramidal hillocks.

BRIEF DESCRIPTION OF THE DRAWINGS

Referring now to the drawings in which like reference numbers represent corresponding parts throughout:

FIGS. 11(a), 11(b), 11(c), 11(d), and 11(e) are schematics illustrating how a polymer film is used to remove a bar of a device from a substrate, according to one embodiment of the present invention.

FIGS. 13(a) and 13(b) are schematics illustrating how a growth restrict mask is used to fabricate bars of devices on a substrate, according to one embodiment of the present invention.

FIGS. 14(a) and 14(b) are SEM images at different magnifications of a surface of a substrate, according to one embodiment of the present invention.

FIGS. 16(a) and 16(b) are schematics illustrating how a growth restrict mask is used to fabricate a bar of a device on a substrate, according to one embodiment of the present invention.

FIGS. 18(a), 18(b), and 18(c) are schematics illustrating how wire bonds and probes are attached to a device, according to one embodiment of the present invention.

FIGS. 19(a) and 19(b) are schematics illustrating how a heat sink plate is divided to separate devices, according to one embodiment of the present invention.

FIGS. 23(a) and 23(b) are schematics illustrating how a growth restrict mask is used to fabricate bars of devices on a substrate, according to one embodiment of the present invention.

FIGS. 27(a), 27(b), 27(c), 27(d), 27(e), 27(f) and 27(g) are schematics illustrating how ELO structures are obtained, according to one embodiment of the present invention.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Overview

The present invention describes a method for obtaining a smooth surface of one or more III-nitride layers, such as GaN layers, using epitaxial lateral overgrowth. In one example, this method is used for fabricating a light-emitting diode, laser diode, Schottky barrier diode, or metal-oxide-semiconductor field-effect-transistor.

This method is not affected by mis-cut orientations on the surface morphology. Moreover, this method does not suppress the occurrence of the pyramidal hillocks, but instead embeds the pyramidal hillocks in the epi-layer by preventing expansion of the pyramidal hillocks, wherein a growth restrict mask is used in order to prevent the expansion of the pyramidal hillocks in a lateral direction. It is believed that the pyramidal hillocks are embedded in the epi-layer gradually. As a result, the surface of the epi-layer is very smooth due to the disappearance of the pyramidal hillocks.

Figure 1:
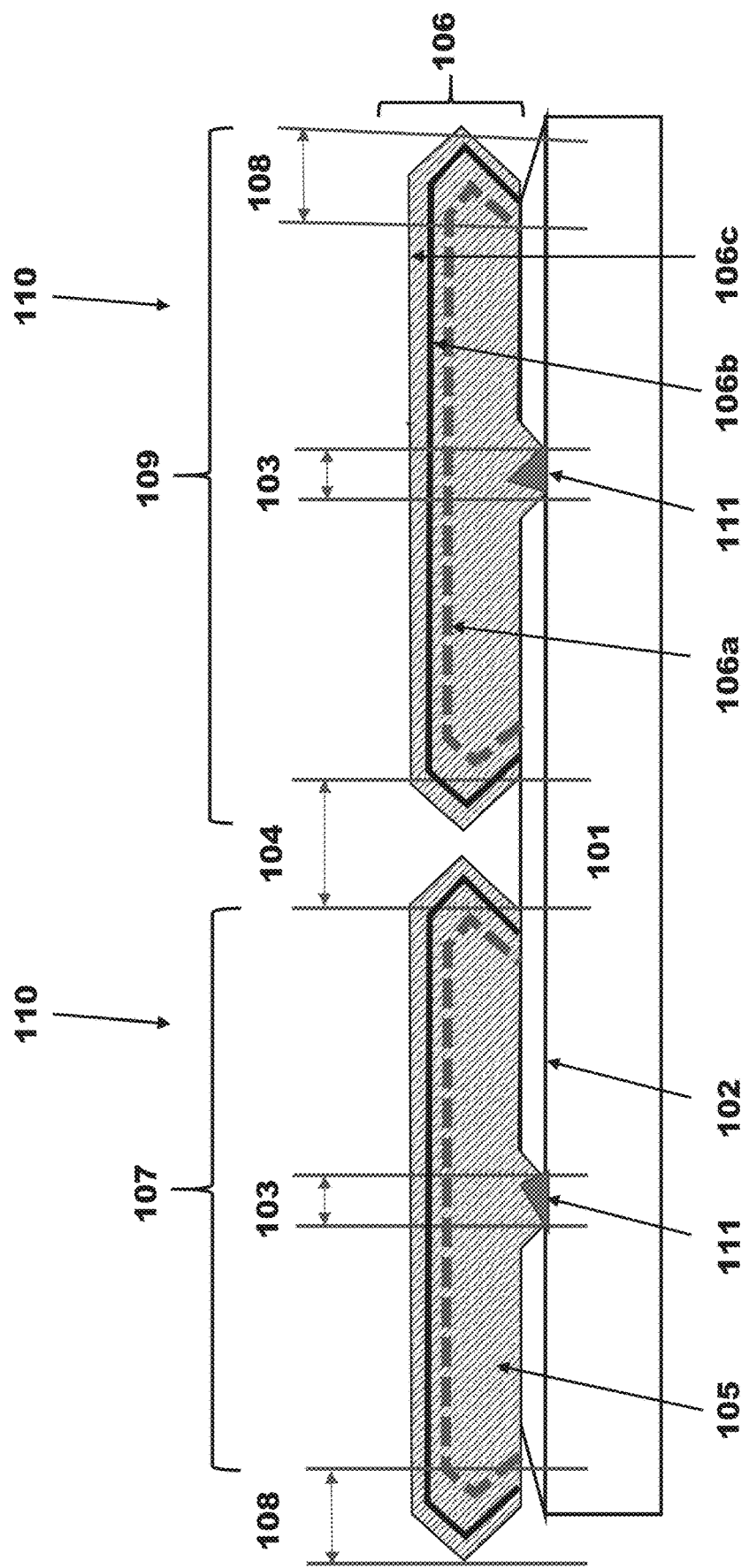
FIG. 1 is a cross-sectional schematic view that illustrates a device structure fabricated, according to one embodiment of the present invention.

FIG. 1 is a cross-sectional view that illustrates a device structure fabricated according to one embodiment of the present invention.

In this example, a III-nitride-based substrate 101 is provided, such as a bulk GaN substrate 101, and a growth restrict mask 102 is formed on or above the substrate 101. Striped opening areas 103 are defined in the growth restrict mask 102.

No-growth regions 104 result when ELO III-nitride layers 105, grown from adjacent opening areas 103 in the growth restrict mask 102, are made not to coalesce on top of the growth restrict mask 102. Preferably, growth conditions are optimized such that the ELO III-nitride layers 105 have a lateral width of 20 µm on a wing region thereof.

Additional III-nitride semiconductor device layers 106 are deposited on or above the ELO III-nitride layers 105, and may include an active region 106a, an electron blocking layer (EBL) 106b, and a cladding layer 106c, as well as other layers.

The thickness of the ELO III-nitride layers 105 is important, because it determines the width of one or more flat surface regions 107 and layer bending regions 108 at the edges thereof adjacent the no-growth regions 104. The width of the flat surface region 107 is preferably at least 5 µm, and more preferably is 10 µm or more, and most preferably is 20 µm or more.

The ELO III-nitride layers 105 and the additional III-nitride semiconductor device layers 106 are referred to as island-like III-nitride semiconductor layers 109, wherein adjacent island-like III-nitride semiconductor layers 109 are separated by the no-growth regions 104. The distance between the island-like III-nitride semiconductor layers 109 adjacent to each other is the width of the no-growth region 104, which is generally 20 µm or less, and preferably 5 µm or less, but is not limited to these values.

Each of the island-like III-nitride semiconductor layers 109 may be processed into a separate device 110. The device 110, which may be a light-emitting diode, laser diode, Schottky barrier diode, or metal-oxide-semiconductor field-effect-transistor, is processed on the flat surface region 107 and/or the opening areas 103. Moreover, the shape of the device 110 generally comprises a bar.

In this embodiment, the occurrence of pyramidal hillocks 111 is not suppressed, but instead the pyramidal hillocks 111 are gradually embedded in the ELO III-nitride layers 105, which prevents the pyramidal hillocks 111 from expanding. The growth restrict mask 102 also limits the expansion of the pyramidal hillocks 111 in a lateral direction. As a result, the surface of the ELO III-nitride layers 105 is extremely smooth due to the disappearance of the pyramidal hillocks 111.

Pyramidal Hillocks

Figure 2:
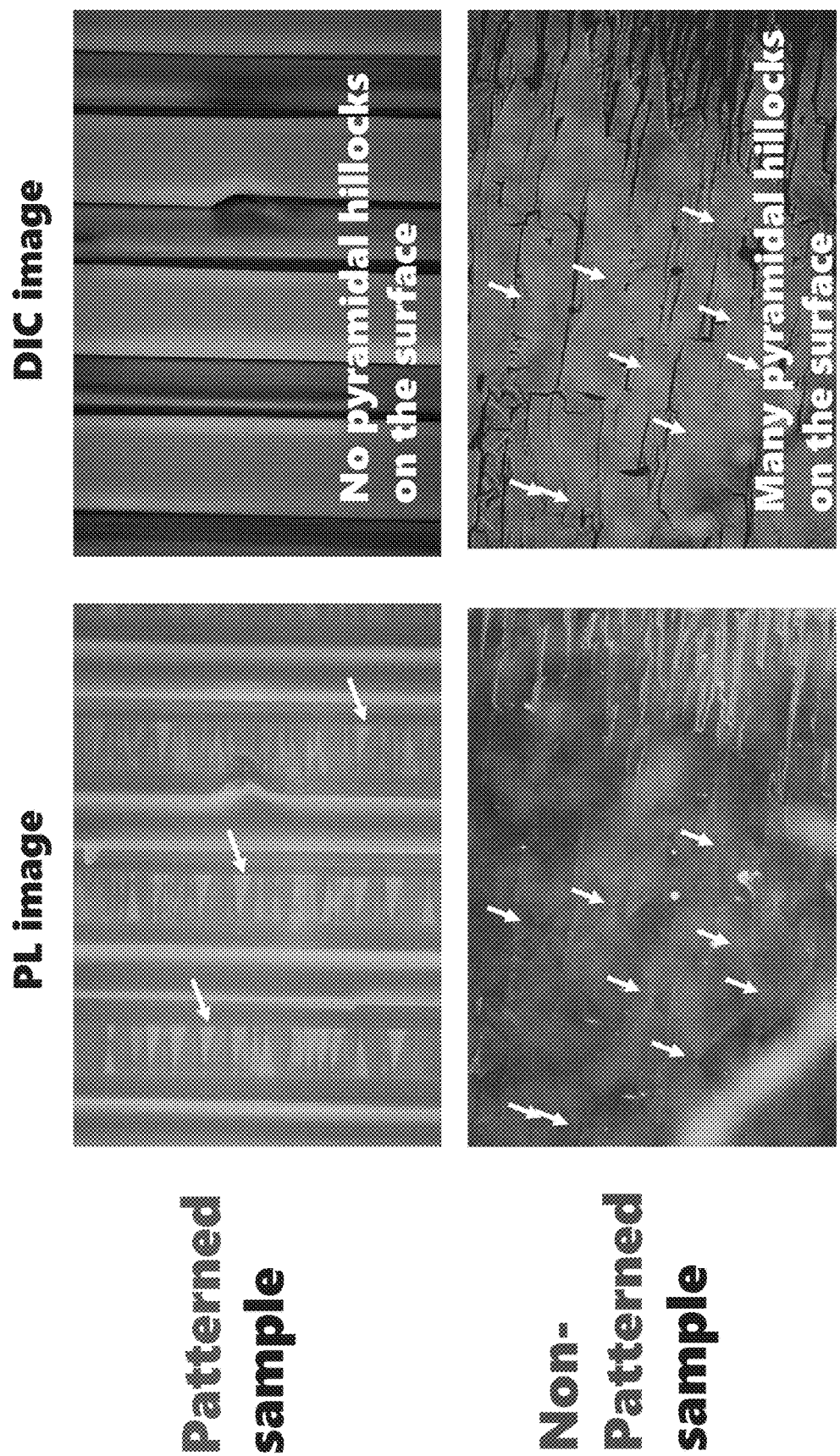
FIG. 2 includes both photoluminescence (PL) images and differential interference contrast (DIC) microscopy measurement images of patterned and non-patterned samples, according to one embodiment of the present invention.

FIGS. 2-4 illustrate why pyramidal hillocks 111 do not occur on the surfaces of epi-layers 105, 106 or 109.

FIG. 2 includes both photoluminescence (PL) images and differential interference contrast (DIC) microscopy measurement images of patterned and non-patterned samples of GaN layers, wherein the samples were co-loaded into a metalorganic chemical vapor deposition (MOCVD) chamber and were grown at the same time. The PL and DIC images show the same locations on the samples.

The PL image shows a difference in intensity of a yellow luminescence of the GaN layer. The GaN layer emits with a broad luminescence spectrum due to the concentration of n-type dopants, such as Si, O, etc., therein. An area of high concentration of n-type dopants emits a yellow luminescence that is brighter than an area of low concentration of n-type dopants.

As noted above, the GaN layer often includes pyramidal hillocks, which typically comprise four facets inclined towards the [0001], [1-210], [000-1], and [-12-10] directions, respectively. Each facet is different in its ease of incorporation of n-type dopants. Therefore, the n-type dopant concentration is different for each facet, which causes the differences in the yellow luminescence intensity. As a result, the existence of the pyramidal hillocks can be identified by PL measurements.

The DIC images, on the other hand, measure surface roughness of the GaN layer. Specifically, the DIC images can only detect information on the surface of the GaN layer.

The non-patterned sample in FIG. 2 is the result of a conventional method used with an epi-ready wafer without processing, while the patterned sample in FIG. 2 is the result of the method of the present invention.

There are a large number of pyramidal hillocks in the non-patterned sample, which are marked with white arrows in FIG. 2. In this case, the pyramidal hillocks are identified in both the PL image and DIC images at the same position, which indicates pyramidal hillocks are appearing on the epi-layer surface.

On the other hand, in the patterned sample, the pyramidal hillocks can be identified only using the PL image and do not appear the surface of the epi-layer shown in the DIC image. The reason for this is that the pyramidal hillocks are embedded in the epi-layer.

Figure 3A:
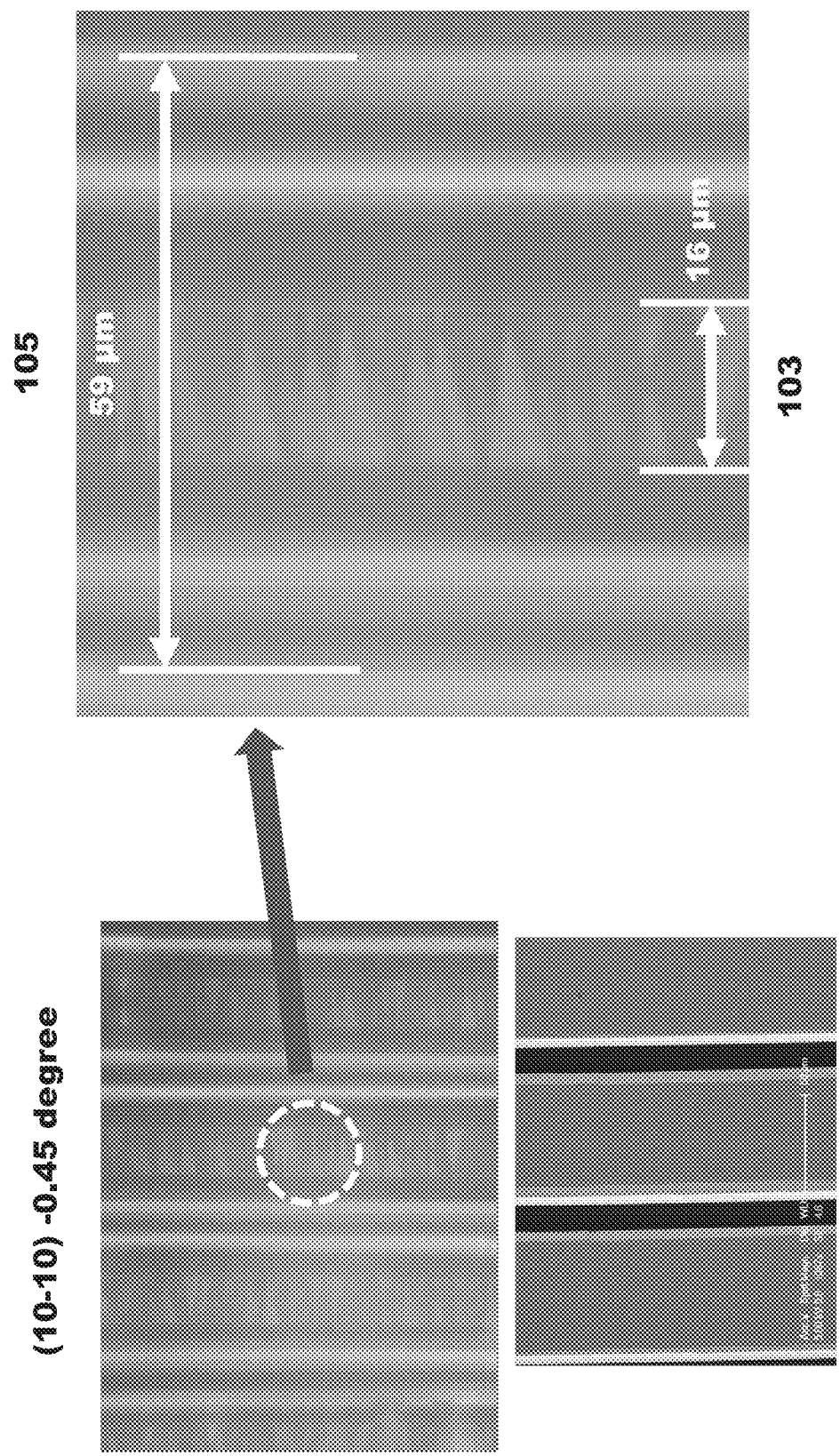
FIGS. 3(a) and 3(b) are images showing that pyramidal hillocks are restricted within an opening area, according to one embodiment of the present invention.
Figure 3B:
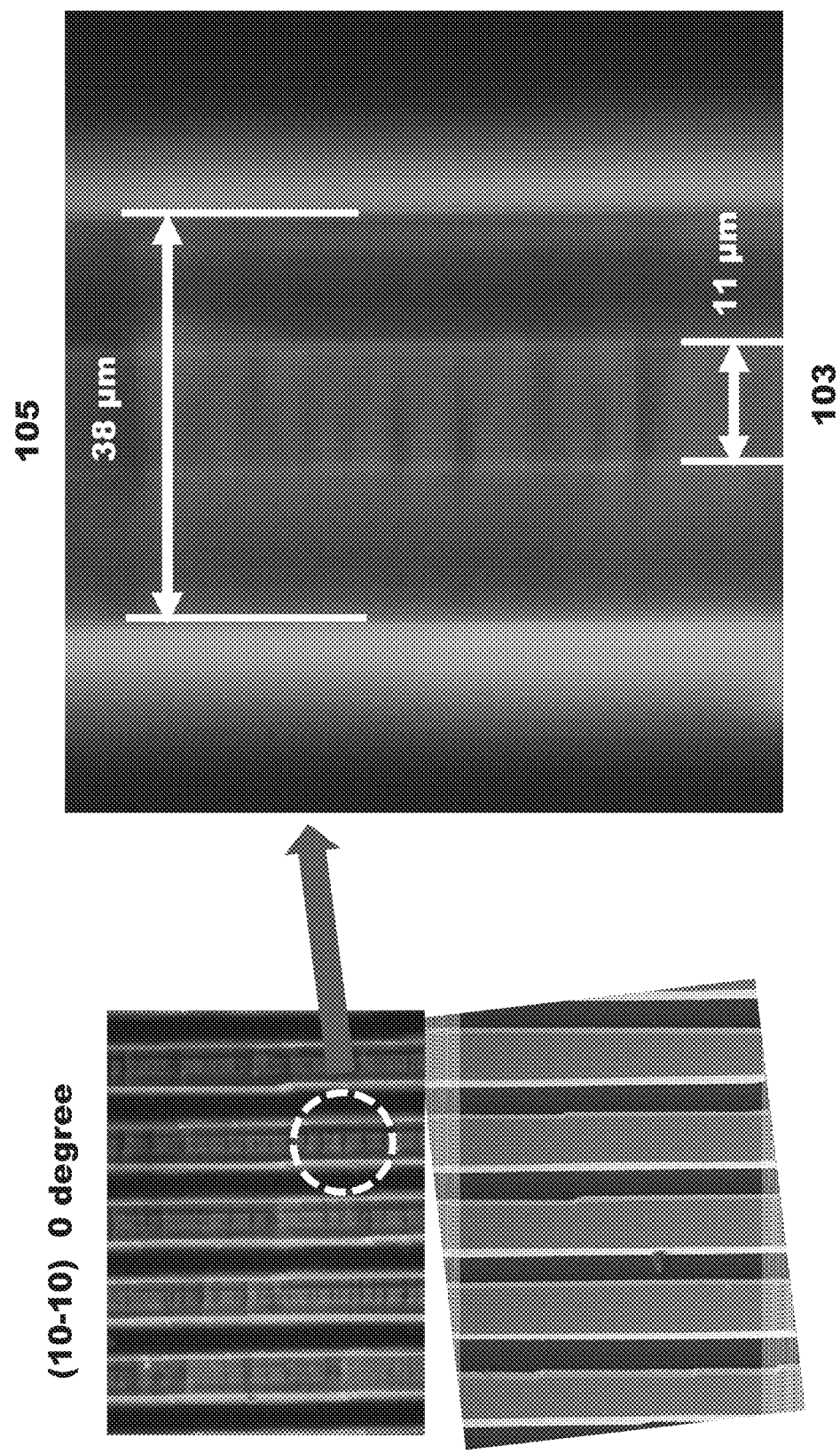

As shown in FIGS. 3(a)-3(b), the pyramidal hillocks are generally restricted to the area of the ELO III-nitride layers 105 within the opening area 103 by the SiO$_2$ growth restrict mask 102, rather than extending across the entire epi-layer 105. In these examples, the widths of the opening area 103 and mis-cut orientations for each sample are defined to be 16.2 µm and −0.45 degrees in FIG. 3(a) and 11 µm and 0 degrees in FIG. 3(b). Note that the positions of the pyramidal hillocks are not always centered in the opening area 103, and the shapes of the pyramidal hillocks are asymmetric.

From this, it can be considered that the pyramidal hillocks occur in the opening area 103 at the beginning of the growth. Moreover, it is thought that the reason the pyramidal hillocks do not expand beyond the opening area 103 is that the size of the pyramidal hillocks is limited by the growth restrict mask 102.

Figure 4A:
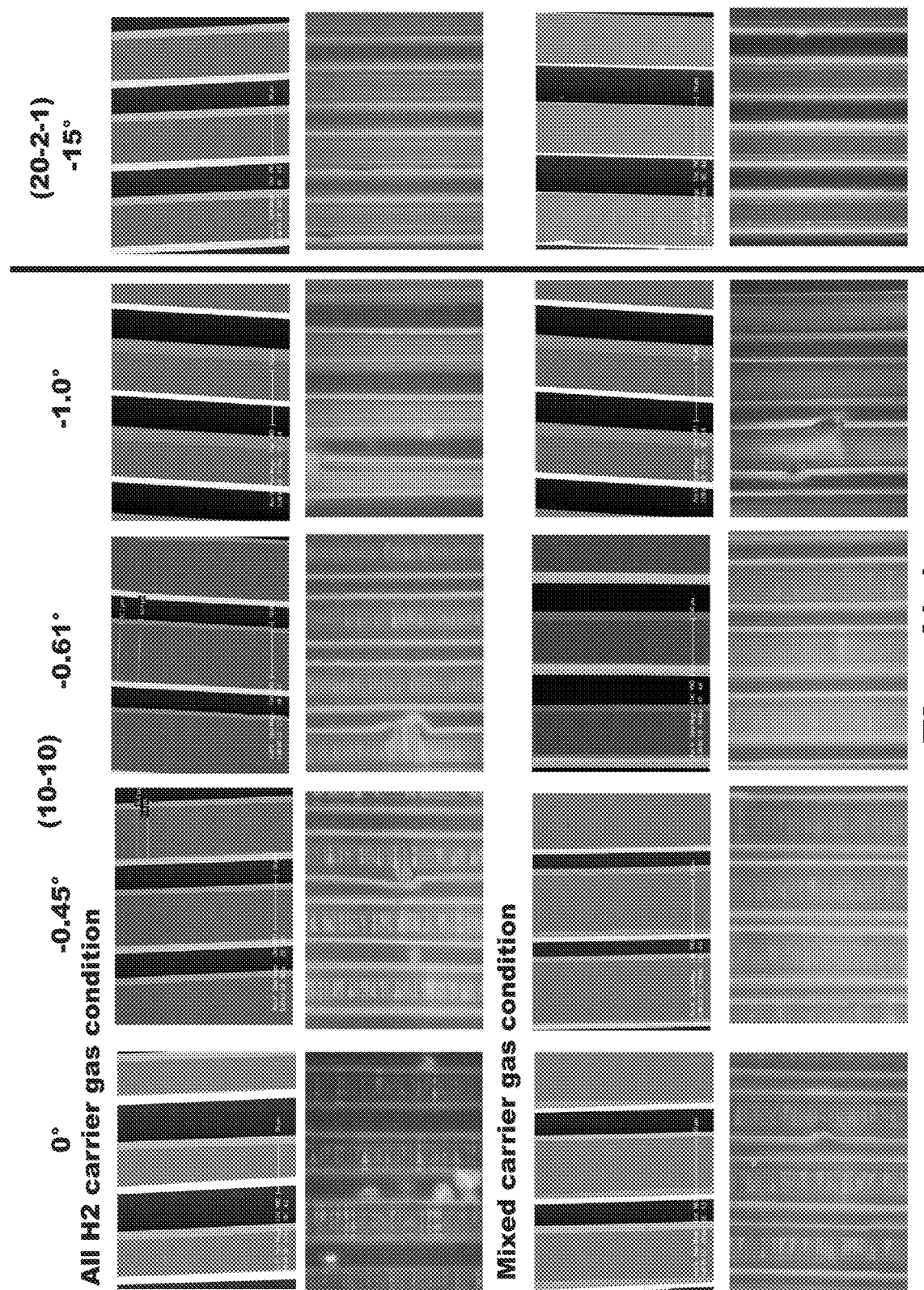
FIG. 4(a) shows scanning electron microscope (SEM) images in rows 1 and 3 and PL images in rows 2 and 4 of an epi-layer surface, with each column representing a different mis-cut orientation angle of the substrate, i.e., 0°, −0.45°, −0.61° and −1.0° mis-cuts for a nonpolar (10-10) substrate and a −15° mis-cut for a semipolar (20-2-1) substrate, according to one embodiment of the present invention.

FIG. 4(a) shows scanning electron microscope (SEM) images in rows 1 and 3 and PL images in rows 2 and 4 of an epi-layer surface, with each column representing a different mis-cut orientation angle of the substrate, i.e., 0°, −0.45°, −0.61° and −1.0° mis-cuts for a nonpolar (10-10) substrate and a −15° mis-cut for a semipolar (20-2-1) substrate. The SEM images show that there are no pyramidal hillocks on the epi-layer surface with each mis-cut orientation. On the other hand, the PL images show a large number of pyramidal hillocks within the opening areas. These pyramidal hillocks were embedded in the epi-layer as mentioned before. The smaller the mis-cut orientation angle, the larger the number of the pyramidal hillocks. The surface morphology is extremely smooth with each mis-cut orientation regardless of the number of pyramidal hillocks.

Figure 4B:
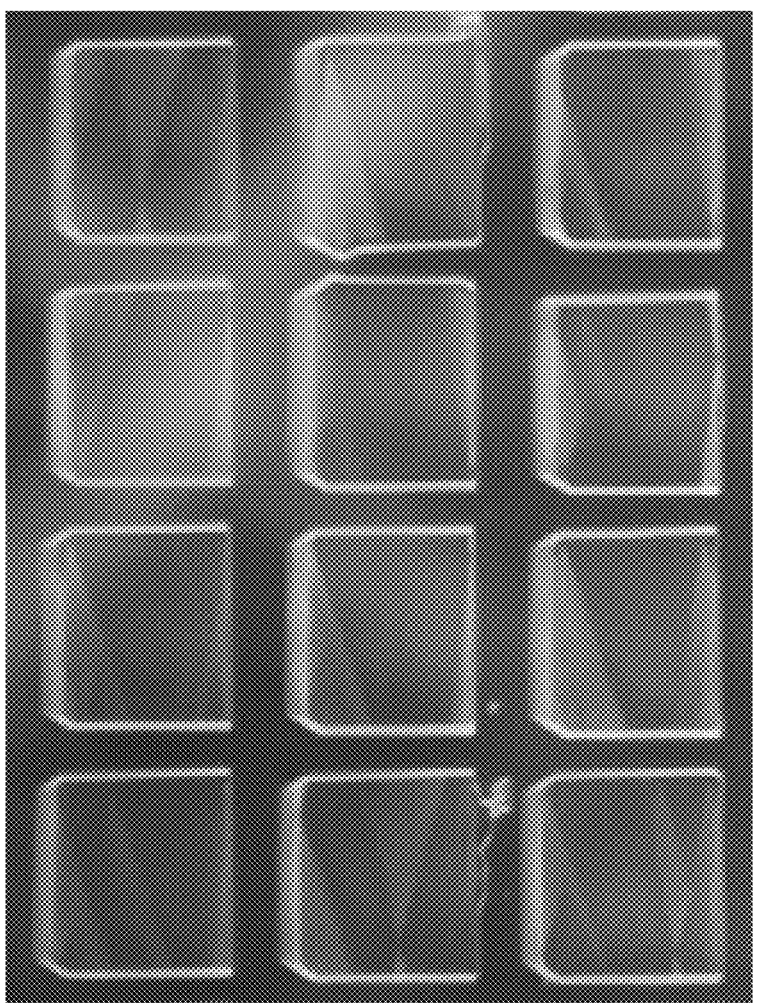
FIG. 4(b) is an image of a 1° mis-cut orientation angle, according to one embodiment of the present invention.

As shown in FIG. 4(b), which is a 1° mis-cut orientation angle, the pyramidal hillocks sometimes occur depending on the growth conditions, or the crystal quality of the substrate, or the situation of the surface. The effect of this method does not depend on the mis-cut orientation angle.

FIGS. 5(a)-5(e) are schematics illustrating how pyramidal hillocks 111 are buried during growth of the ELO III-nitride layers 105 on the substrate 101 through the opening area 103 in the growth restrict mask 102, according to the present invention.

Figure 5:
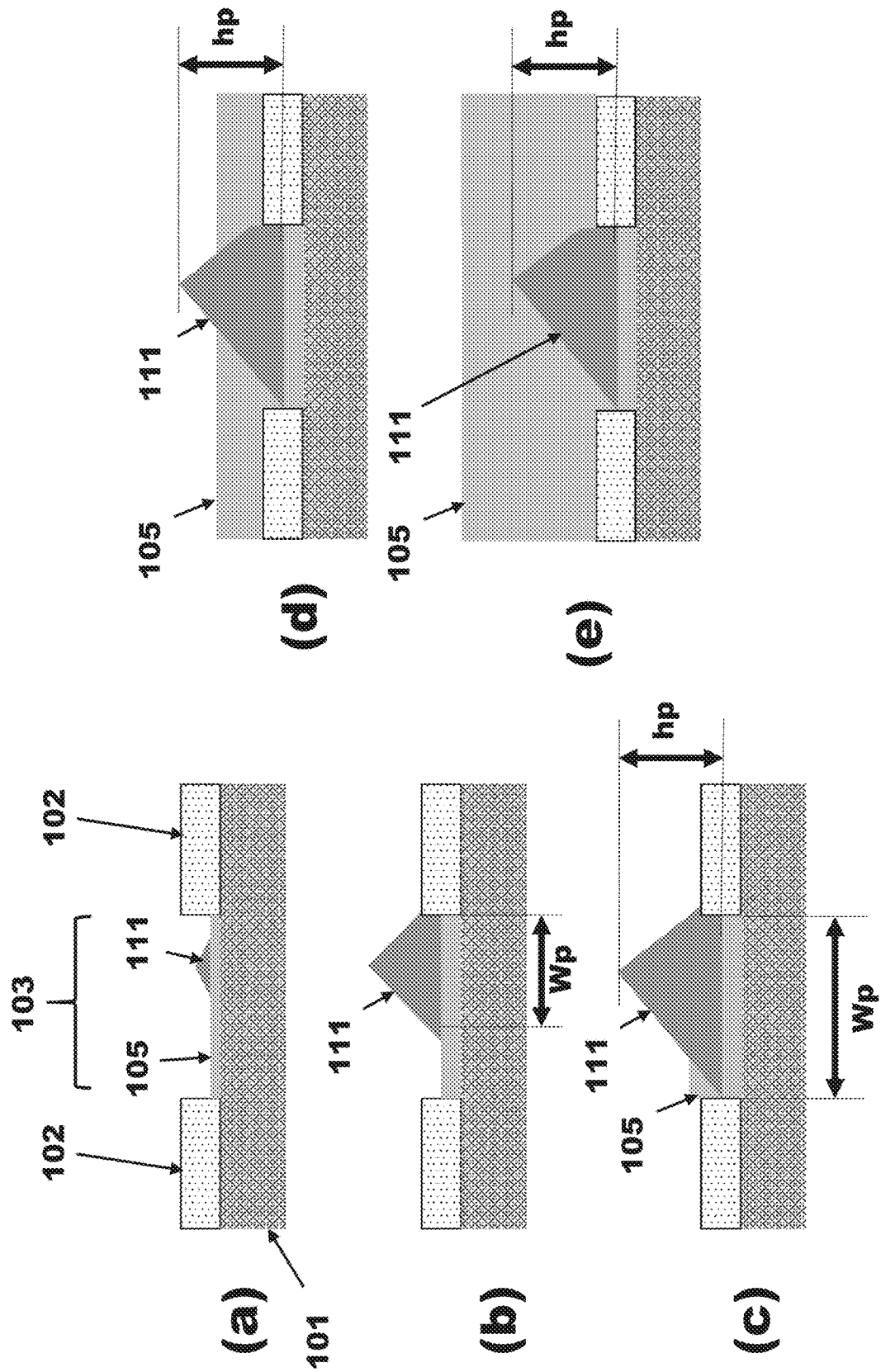
FIGS. 5(a), 5(b), 5(c), 5(d) and 5(e) are schematics illustrating buried pyramidal hillocks during initial growth, according to one embodiment of the present invention.

In FIGS. 5(a) and 5(b), the pyramidal hillocks 111 occur in the opening area 103, with a width wp shown in FIG. 5(b).

In FIG. 5(c), the width wp of the pyramidal hillock 111 equals the width of the opening area 103. In this case, the width wp of the pyramidal hillock 111 is not able to expand beyond the opening area 103.

In FIG. 5(d), the height hp of the pyramidal hillock 111 appears to be limited by the width wp of the opening area 103 in the growth restrict mask 102, and remains the same height as compared to FIG. 5(c), regardless of further growth of epi-layer 105. However, the region around the pyramidal hillock 111 proceeds with the growth of the epi-layer 105, and thus the pyramidal hillock 111 is gradually embedded in the epi-layer 105.

Finally, as shown in FIG. 5(e), the pyramidal hillock 111 is completely embedded in the epi-layer 105. Moreover, the surface morphology of the epi-layer 105 is very smooth and is not affected by the existence of the pyramidal hillock 111.

Figure 6A:
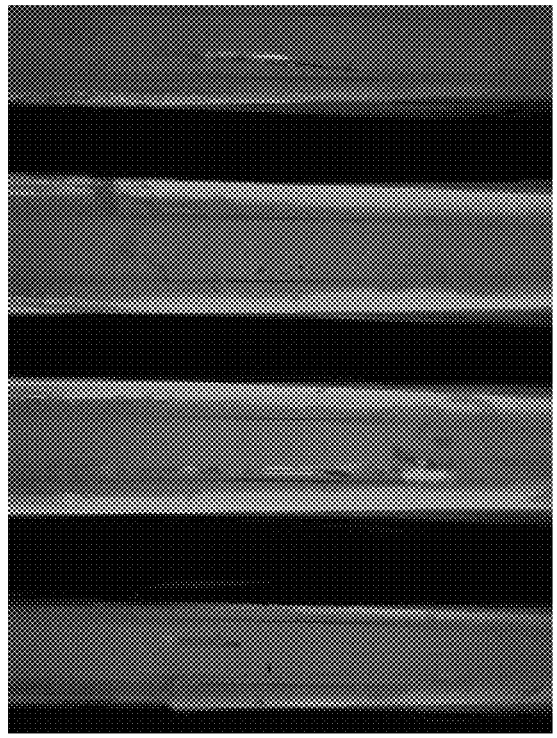
FIGS. 6(a) and 6(b) are PL and DIC images, respectively, of a backside of epi-layers after removal from a (10-10) substrate, according to one embodiment of the present invention.
Figure 6B:

FIGS. 6(a) and 6(b) are PL and DIC images, respectively, of the backside of the ELO III-nitride layers 105 after they were removed from a (10-10) substrate 101, wherein the substrate 101 did not have a mis-cut orientation. The DIC measurement image does not show pyramidal hillocks 111, but the PL image does show pyramidal hillocks 111, indicating that the pyramidal hillocks 111 are embedded within the ELO III-nitride layers 105.

The ELO III-nitride layers 105 are easily removed from the substrate 101, even though the ELO III-nitride layers 105 are homo-epitaxial layers, and there is no hetero-interface between the ELO III-nitride layers 105 and the surface of the substrate 101. However, using the grow restrict mask 102, the ELO III-nitride layers 105 can be removed from the III-nitride substrate 101 in a fast and easy manner.

For example, the growth restrict mask 102 may be a dielectric film or metals, such as $SiO_2$, SiN, $HfO_2$, $Al_2O_3$, MgF, W, Mo, Pt, Ir, Os, etc. The interface between the growth restrict mask 102 and any subsequent ELO III-nitride layers 105 grown on the mask 102 has a weak bonding strength. The bonding area, which is the opening area 103 width, is controlled to be more or less than the size of the device 110.

In addition, this method may use cleavage along an m-plane of the substrate 101, which is the easiest plane among GaN planes to cleave. Moreover, the edge of the growth restrict mask 102 provides a cleaving point and cleaving interface for removing the substrate 101 from the ELO III-nitride layers 105. The growth restrict mask 102 can also be at least partially dissolved using hydrofluoric acid (HF), buffered HF (BHF), or another etchant, before removing the substrate 101 from the ELO III-nitride layers 105. Finally, the substrate 101 can be removed from ELO III-nitride layers 105 using a polymer and/or adhesive tape.

Fabrication Method

The following describes the steps used to fabricate a device 110 according to one embodiment of the present invention.

Step 1. Forming a growth restrict mask 102 with a plurality of opening areas 103 directly or indirectly upon a substrate 101, wherein the substrate 101 is a III-nitride substrate or a hetero-substrate.

Step 2. Growing a plurality of island-like III-nitride semiconductor layers 109 upon the substrate 101 using the growth restrict mask 102, such that the growth extends in a direction parallel to the striped opening areas 103 of the growth restrict mask 102.

Step 3. Fabricating the device 110 on the flat surface region 107 by conventional methods. For example, a ridge structure, p-electrode, p-pad, etc., are disposed on the island-like III-nitride semiconductor layers 109 at pre-determined positions.

Step 4. Forming a support structure on the device 110 for cleaving at a side facet.

Step 5. At least partially dissolving the growth restrict mask 102 by wet etching.

Step 6. Removing a bar of the device 110 from the substrate 101.
  6.1. Attaching a polymer film to the bar of the device 110.
  6.2. Applying pressure to the polymer film and the substrate 101.
  6.3. Modifying (e.g., reducing) the temperature of the film and the substrate 101 while applying the pressure.
  6.4. Utilizing a difference in the thermal coefficient between the polymer film and the material of the substrate 101 for removing the bar of the device 110.

Step 7. Disposing an n-electrode at a separate area of the device 110.

Step 8. Breaking the bar of device 110 into one or more devices 110 or chips.

Step 9. Mounting the devices 110 on a heat sink.

Step 10. Using a coating bar to coat the facets of the devices 110.

Step 11. Dividing the coating bar.

Step 12. Screening the devices 110.

Step 13. Mounting the devices 110 on/into packages.

These steps are explained more in detail below.

Step 1. Forming a Growth Restrict Mask

As shown in FIG. 1, epitaxial GaN layers 105 are grown by ELO on a m-plane GaN substrate 101 patterned with $SiO_2$. Other planes can be adopted for the substrate 101, and hetero-substrates 101 may be used as well, with a GaN template grown on the hetero-substrate 101. The patterned $SiO_2$, which is the growth restrict mask 102, is comprised striped opening areas 103 with a width of 2-180 μm and an interval of 150 μm, wherein the $SiO_2$ stripes are oriented along the <0001> axis. The ELO GaN layers 105 do not coalesce on top of the growth restrict mask 102.

Step 2. Growing III-Nitride Semiconductor Layers

MOCVD may be used for epitaxial growth of the III-nitride semiconductor layers 105, 106, 109. Trimethylgallium (TMGa), trimethylindium (TMIn) and triethylaluminium (TMAl) are used as Group-III elements source. Ammonia ($NH_3$) is used as the raw gas to supply nitrogen. Hydrogen ($H_2$) and nitrogen ($N_2$) are used as carrier gases of the Group-III elements sources (it is important to include hydrogen in the carrier gas to obtain a smooth surface epi-layer). Saline and bis(cyclopentadienyl)magnesium ($Cp_2Mg$) is used as the n-type and p-type dopants.

The following growth conditions were used:

The growth pressure is from 60 to 760 Torr. For obtaining a wide width of the island-like III-nitride based semiconductor layers 109, the pressure is preferably 100-300 Torr.

The growth temperature generally ranges from 900-1200° C.

The V/III ratio ranges from 1000-30000, and preferably ranges from 3000-10000. TMG ranges from 2-20 sccm, and $NH_3$ ranges from 3 to 10 slm.

carrier gas may comprise only hydrogen gas, or a mix of hydrogen and nitrogen gasses.

To obtain a smooth surface, the growth conditions of each plane needs to be optimized by conventional method.

After growing about 2-8 hours, the ELO III-nitride layer 105 had a thickness of about 8-50 µm and a bar 901 width of about 20-150 µm, wherein the bar 901 width is the width of the island-like III-nitride semiconductor layers 109.

Figure 7A:
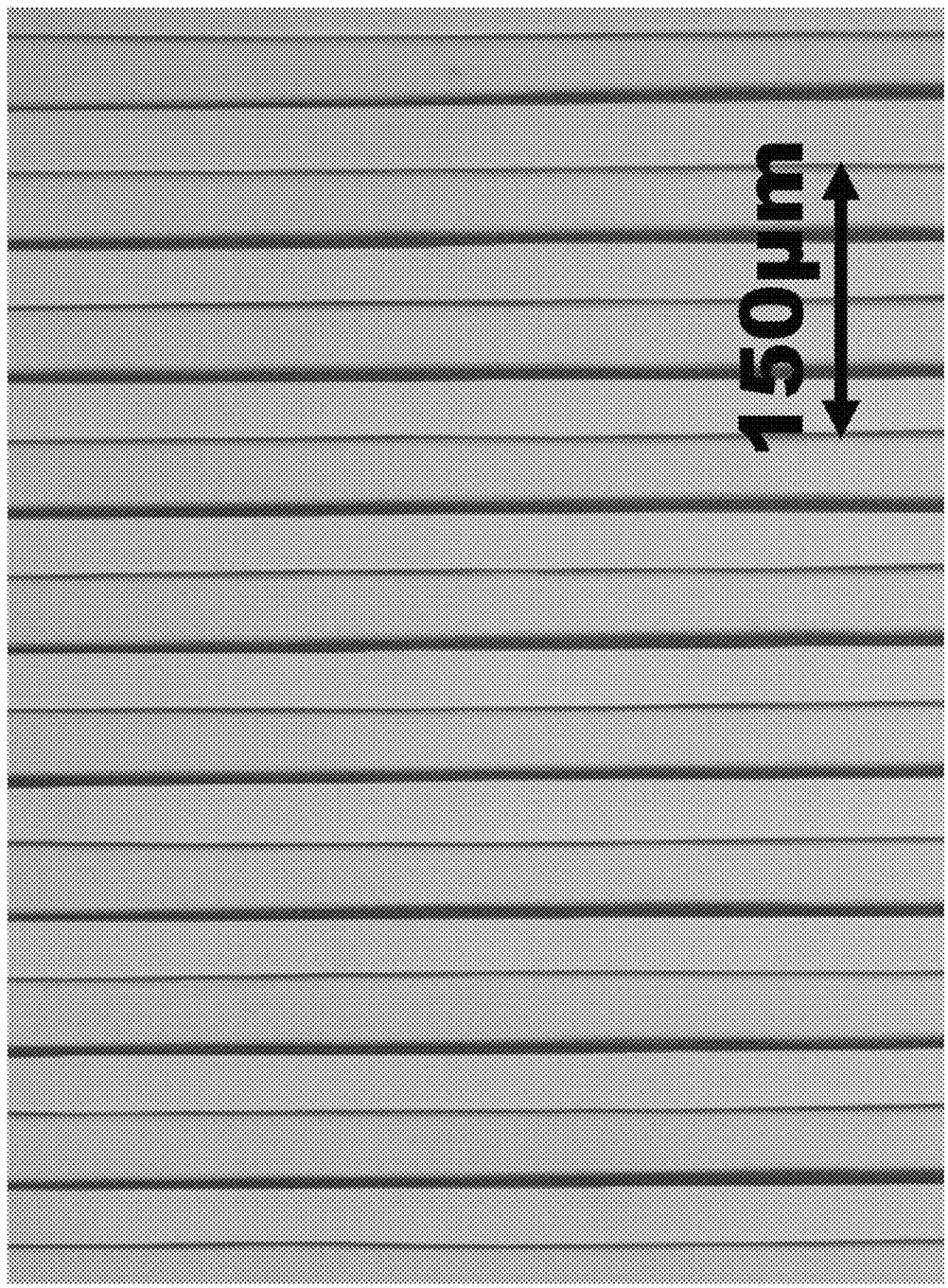
FIG. 7(a) is a SEM image of island-like III-nitride semiconductor layers oriented along an m-plane, according to one embodiment of the present invention.
Figure 7B:
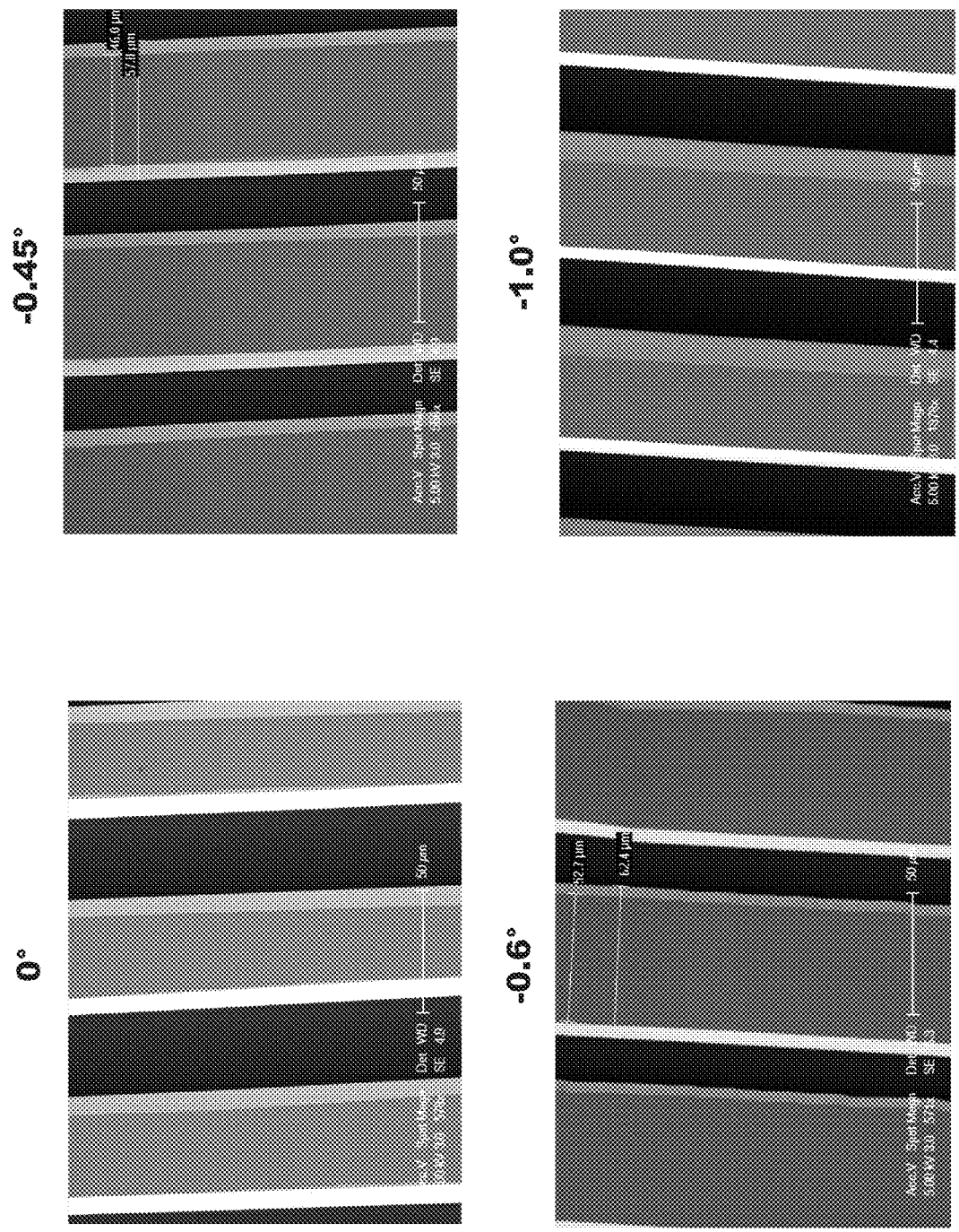
FIG. 7(b) shows four images of island-like III-nitride semiconductor layers labeled with different mis-cut orientations 0°, −0.45°, −0.6°, −1.0°, along an (1-100) m-plane, according to one embodiment of the present invention.

As shown in FIGS. 7(a)-7(b), the method obtained the island-like III-nitride semiconductor layers 109 with a smooth top surface without pyramidal hillocks 111 or depressed portions, with various mis-cut orientations. Specifically, FIG. 7(a) shows a SEM image of the island-like III-nitride semiconductor layers 109 oriented along an m-plane, while FIG. 7(b) shows four images of the island-like III-nitride semiconductor layers 109 labeled with different mis-cut orientations 0°, −0.45°, −0.6°, −1.0°, along an (1-100) m-plane.

Step 3. Device Process

As set forth in Step 2, after the III-nitride semiconductor device layers 106 have been grown on the ELO III-nitride layers 105, a flat region 107 is formed for each device 110. These flat regions 107 are separated from each other so that MOCVD growth is stopped before they coalesce.

III-Nitride Semiconductor Device Layers

Figure 8:
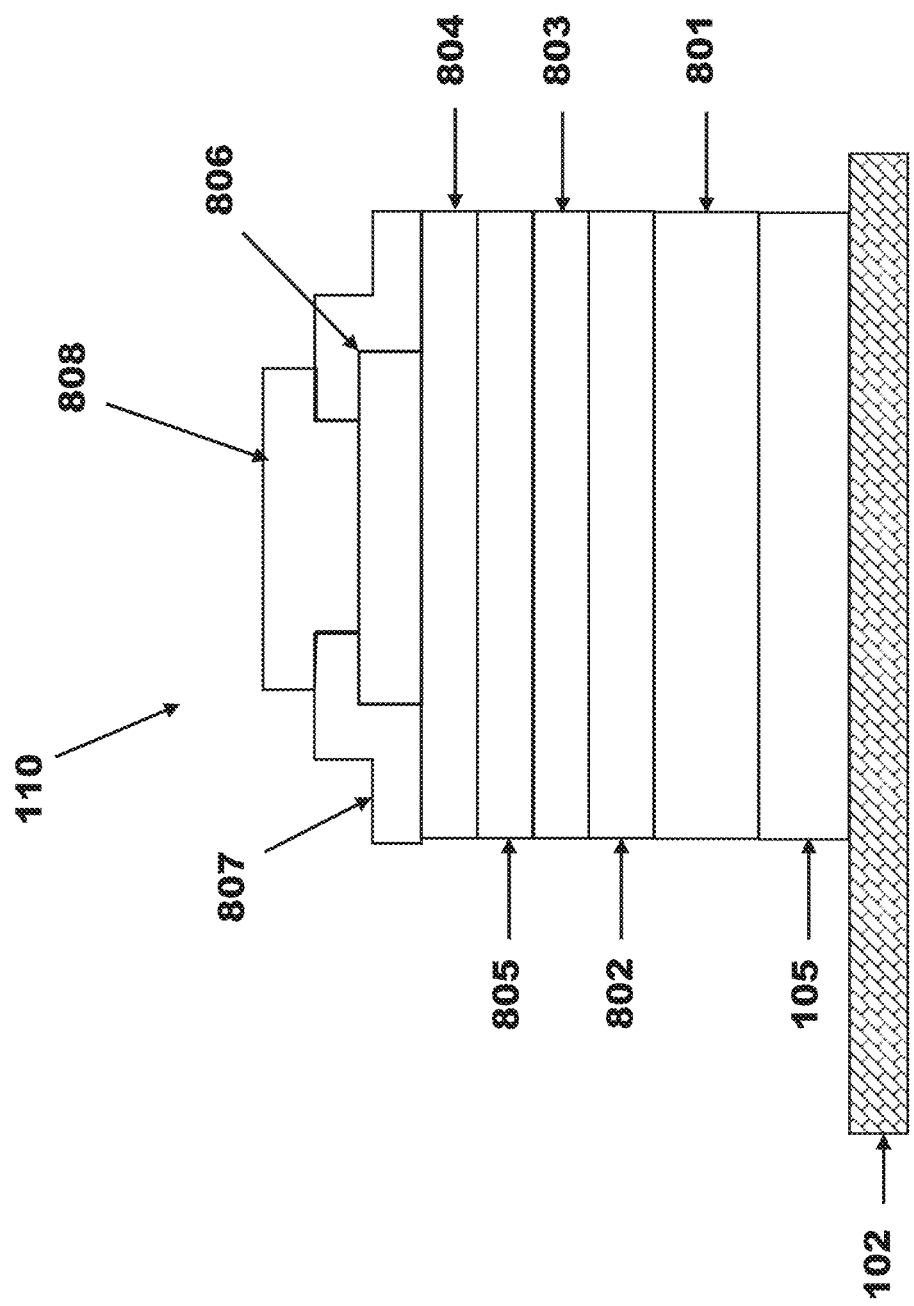
FIG. 8 is a cross-sectional side view of a III-nitride semiconductor laser diode device along a direction perpendicular to an optical resonator, according to one embodiment of the present invention.

FIG. 8 is a cross-sectional side view of a III-nitride semiconductor laser diode device 110 fabricated along a direction perpendicular to an optical resonator The device 110 is fabricated at the flat surface region 107 by conventional methods, wherein a ridge structure, p-electrode, n-electrode, pads, etc., are disposed on the island-like III-nitride semiconductor layers 109 at pre-determined positions. (The figure does not describe the bending region 108.)

The laser diode device 110 is comprised of the following III-nitride semiconductor device layers 106, laid one on top of another, in the order mentioned, grown on the ELO GaN-based layers 105 deposited on the growth restrict mask 102: an n-$Al_{0.06}$GaN cladding layer 801, an n-GaN waveguide layer 802, an InGaN/GaN multiple quantum well (MQW) active layer 803, an AlGaN EBL layer 804, a p-GaN waveguide layer 805, an ITO cladding layer 806, an $SiO_2$ current limiting layer 807, and a p-electrode 808.

The optical resonator is comprised of a ridge stripe structure, wherein the ridge stripe structure is comprised of the ITO cladding layer 806, the $SiO_2$ current limiting layer 807, and the p-electrode 808. The optical resonator provides optical confinement in a horizontal direction. The width of the ridge stripe structure is on the order of 1.0 to 30 µm and typically is 10 µm.

Conventional methods, such as photolithography and dry etching, can be used to fabricate the ridge stripe structure. The ridge depth (from the surface to the ridge bottom) is in the p-GaN waveguide layer 805. The ridge depth is pre-determined before dry etching is performed, based on simulation or previous experimental data.

In one embodiment, the p-electrode 808 may be comprised of one or more of the following materials: Pd, Ni, Ti, Pt, Mo, W, Ag, Au, etc. For example, the p-electrode 808 may comprise Pd—Ni—Au (with thicknesses of 3-30-300 nm). These materials may be deposited by electron beam evaporation, sputter, thermal heat evaporation, etc. In addition, the p-electrode 808 is typically deposited on the ITO cladding layer 806.

Step 4. Forming the Support Structure for Cleaving at a Side Facet and the Flat Surface Region.

Figure 9A:
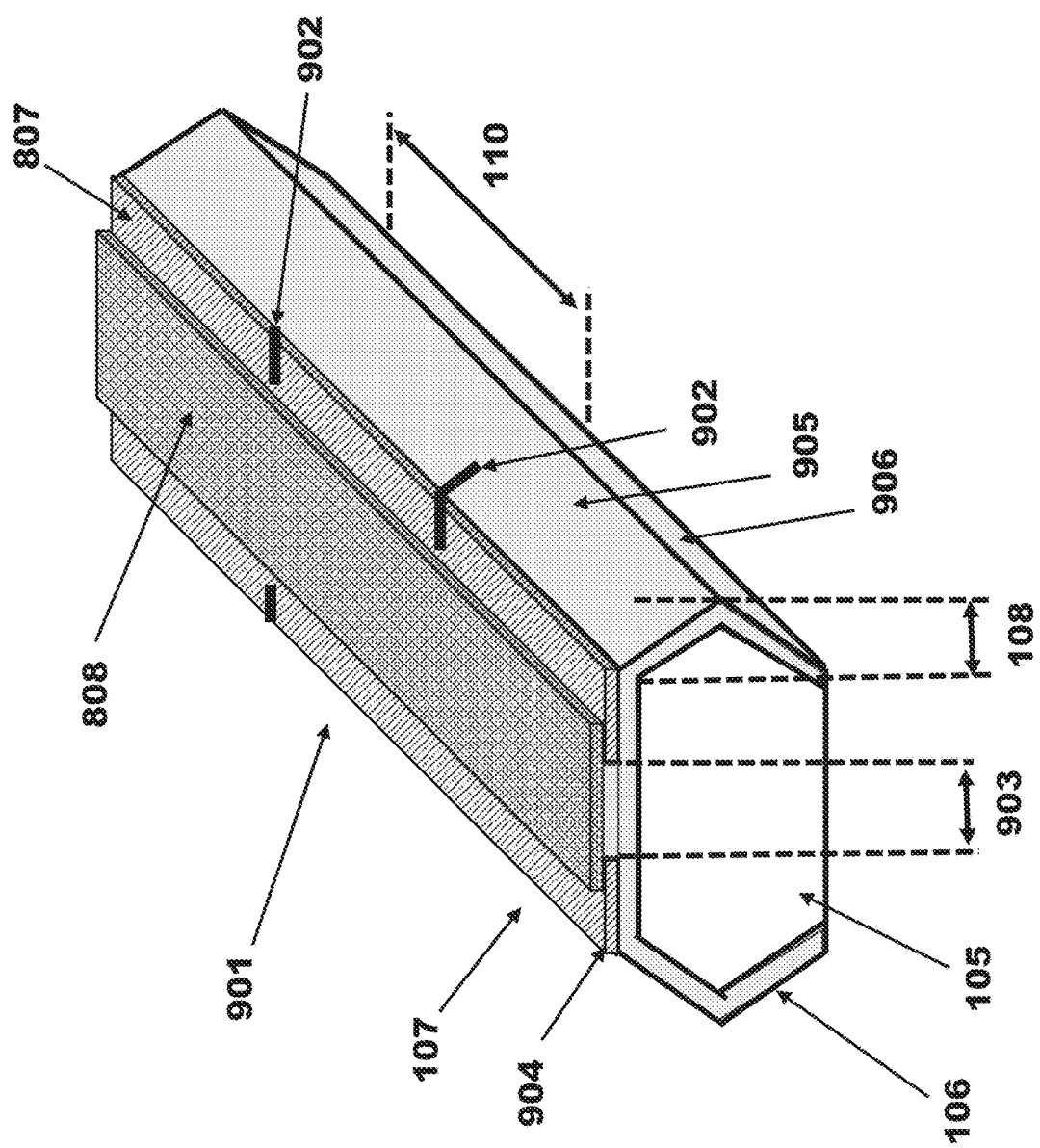
FIGS. 9(a) and 9(b) are schematics of a bar of a device, according to one embodiment of the present invention.
Figure 9B:
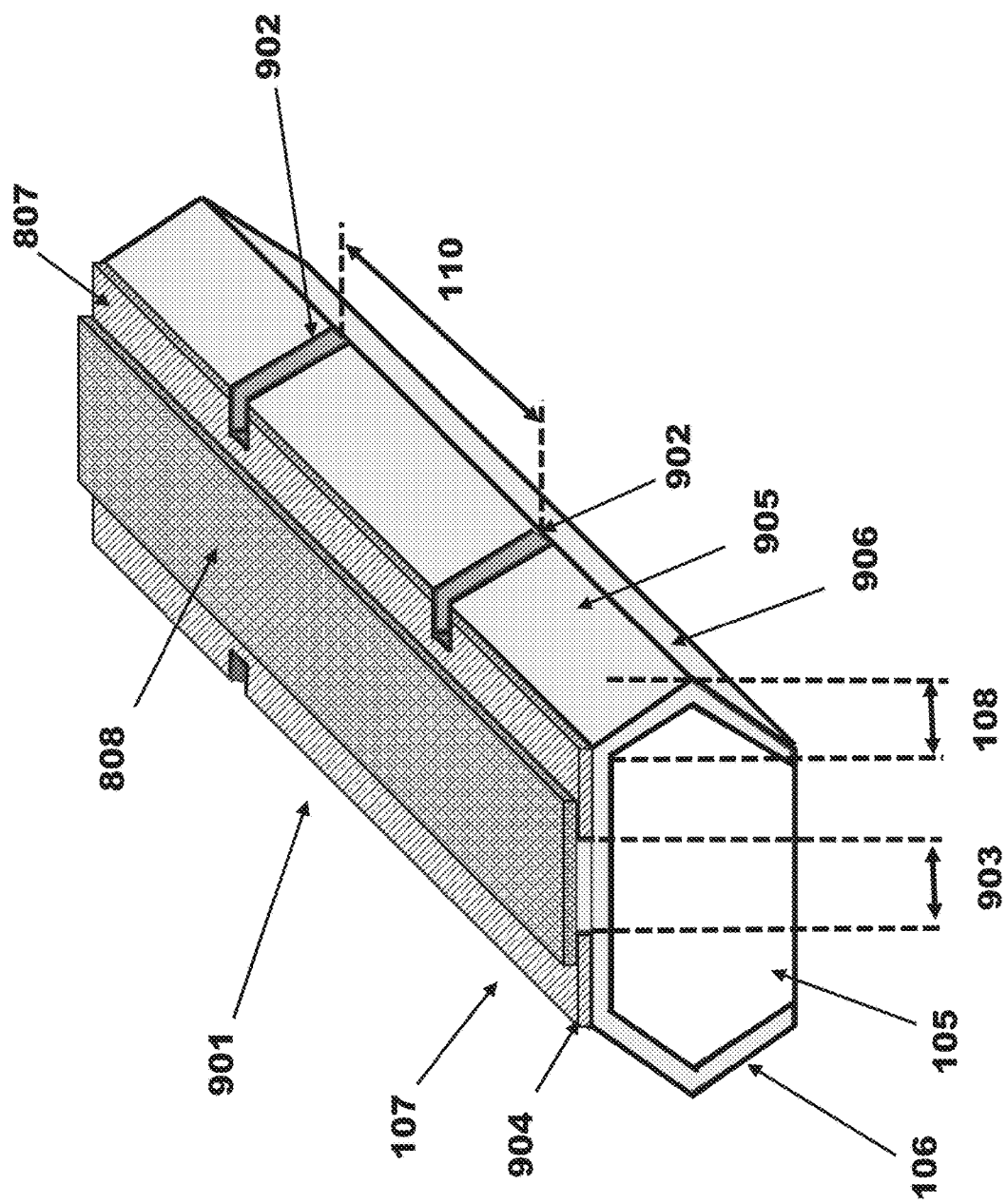

As shown in FIGS. 9(a) and 9(b), the aim of this step is to form a support structure for cleaving a bar 901 of the device 110, before the bar 901 is removed from the substrate 101. Dividing support regions 902 are formed at periodic lengths, wherein each period is determined by the device 110 length. For example, in the case of a laser diode device 110, one period is set to be 300-1200 µm.

Each dividing support region 902 is a line scribed by a diamond tipped scriber or laser scriber, as shown in FIG. 9(a); or a trench formed by dry-etching such as RIE (Reactive Ion Etching) or ICP (Inductively Coupled Plasma), as shown in FIG. 9(b); but is not limited to those methods. The dividing support region 902 may be formed on both sides of the bar 901 or on one side of the bar 901. The depth of the dividing support region 902 is preferably 1 µm or more.

Both cases can divide the bar 901 into separate devices 110 at the dividing support region 902, because the dividing support region 902 is weaker than any other part. The dividing support region 902 avoids breaking the bar 901 at unintentional positions, so that it can precisely determine the device 110 length.

The dividing support region 902 is created at the flat surface region 107 in a manner that avoids a current injection region 903, which is in the ridge structure, and the p-electrode 808, and the layer bending region 108, although it may encompass at least a portion of the $SiO_2$ current limiting layer 807.

As shown in FIGS. 9(a) and 9(b), the dividing support region 902 is formed at a first facet 904, and optionally, a second facet 905, which are easy to process because they are flattened areas. A third facet 906 may be avoided.

Figure 10A:
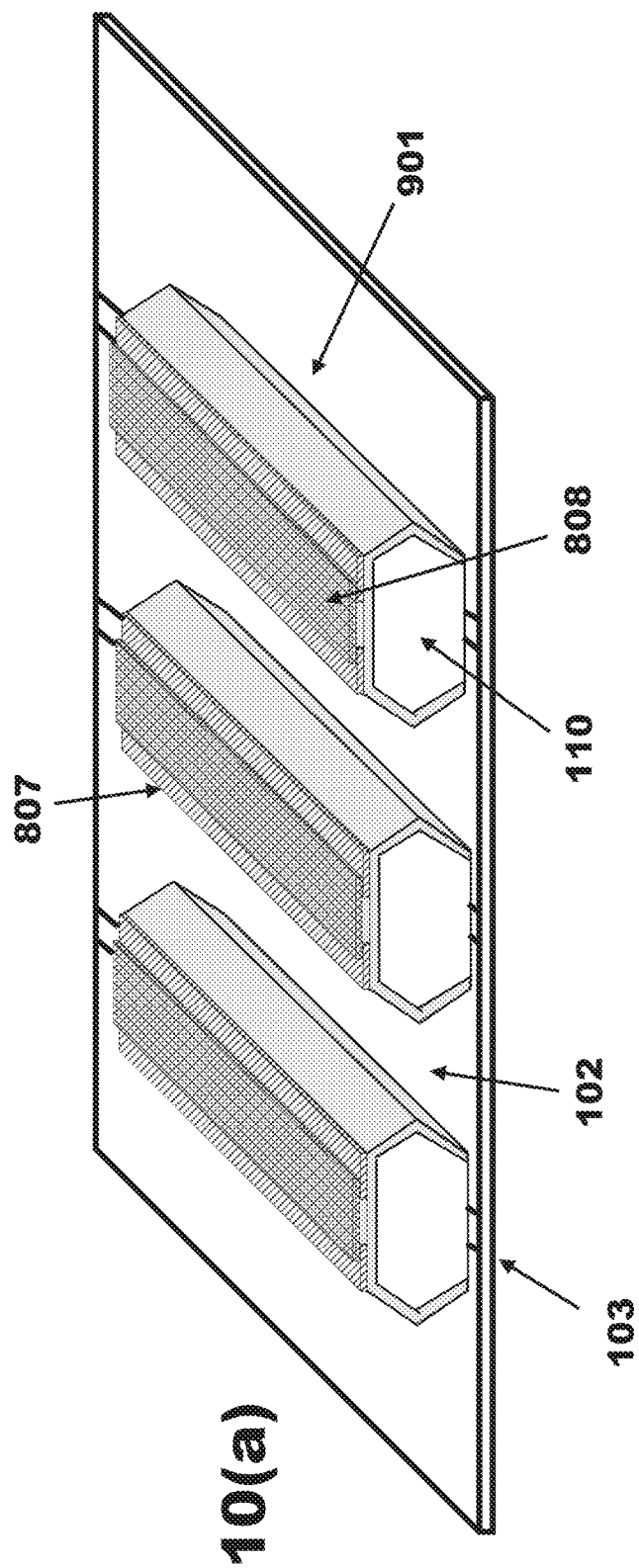
FIGS. 10(a) and 10(b) are schematics illustrating how a dividing support region is formed at periodic lengths along a bar of the device, according to one embodiment of the present invention.
Figure 10B:
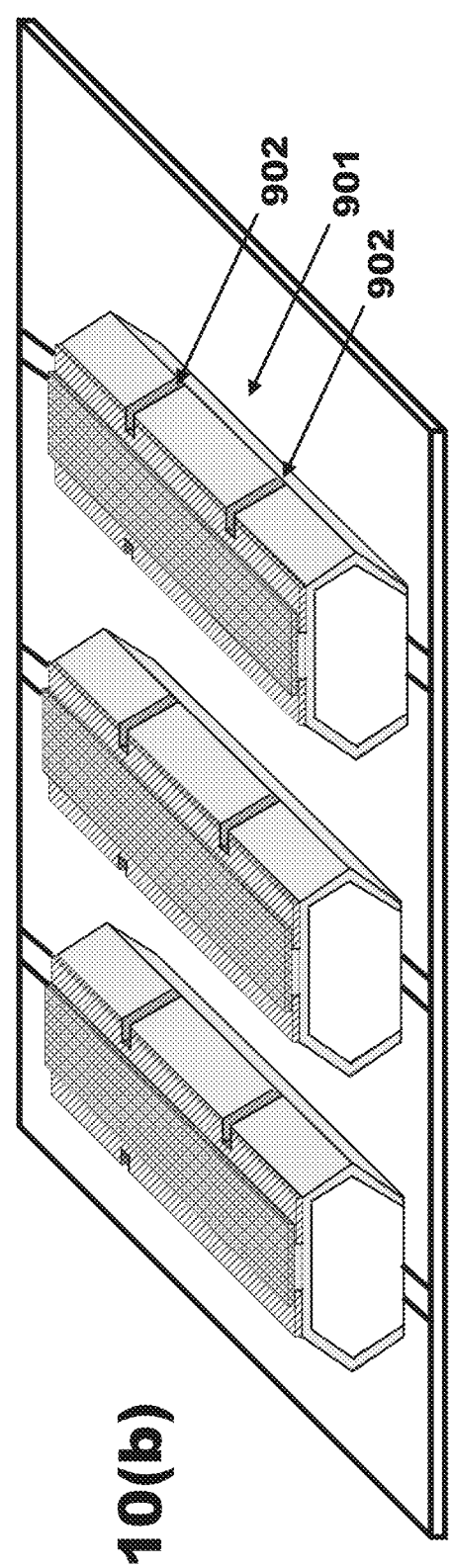

FIGS. 10(a) and 10(b) further illustrate how the dividing support regions 902 are formed at periodic lengths along a bar 901 of the device 110, according to one embodiment of the present invention.

Step 5. Dissolving the Growth Restrict Mask by Wet Etching.

The method may further comprise a step of removing, by wet etchant, at least a portion of, or preferably almost all of, or most preferably all of, the growth restrict mask 102.

The growth restrict mask 102 is removed by using a chemical solution, such as HF or BHF. This process allows the devices 110 to be easily removed from the GaN substrate 101. Moreover, this process would better be conducted before removing the epi-layers 105, 106, 109 from the substrate 101. This process also would better be conducted before processing the device 110 (Step 3).

Step 6. Removing the Bar of the Device from the Substrate

From here, the procedure for removing the bar 901 of the device 110 from the substrate 101 is explained using FIGS. 11(a)-11(e).

Step 6.1 comprises attaching a polymer film 1101 to the bar 901 of the device 110, as shown in FIG. 11(a). In this embodiment, the polymer film 1101 is comprised of a base film 1102, an adhesive 1103 and a backing film 1104.

Step 6.2 comprises applying pressure 1105 to the polymer film 1101 and the substrate 101 using plates 1106, as shown in FIG. 11(b). The aim of applying pressure 1105 is to put the polymer film 1101 in-between the bars 901 of the devices 110. The polymer film 1101 is softer than the bars 901 of the devices 110, so the polymer layer 1101 can easily surround the bars 901 of the devices 110. Preferably, the polymer film 1101 is heated in order to soften it, which makes it easy for the polymer film 1101 to cover the bars 901 of the devices 110.

Step 6.3 comprises reducing the temperature of the polymer film 1101 and the substrate 101, while maintaining the applied pressure 1105. However, it is not necessary to apply pressure 1105 during the changing of the temperature.

Step 6.4 comprises utilizing the differences in thermal coefficients between the polymer film 1101 and the substrate 101 for removing the bars 901 of the devices 110.

Figure 11C:
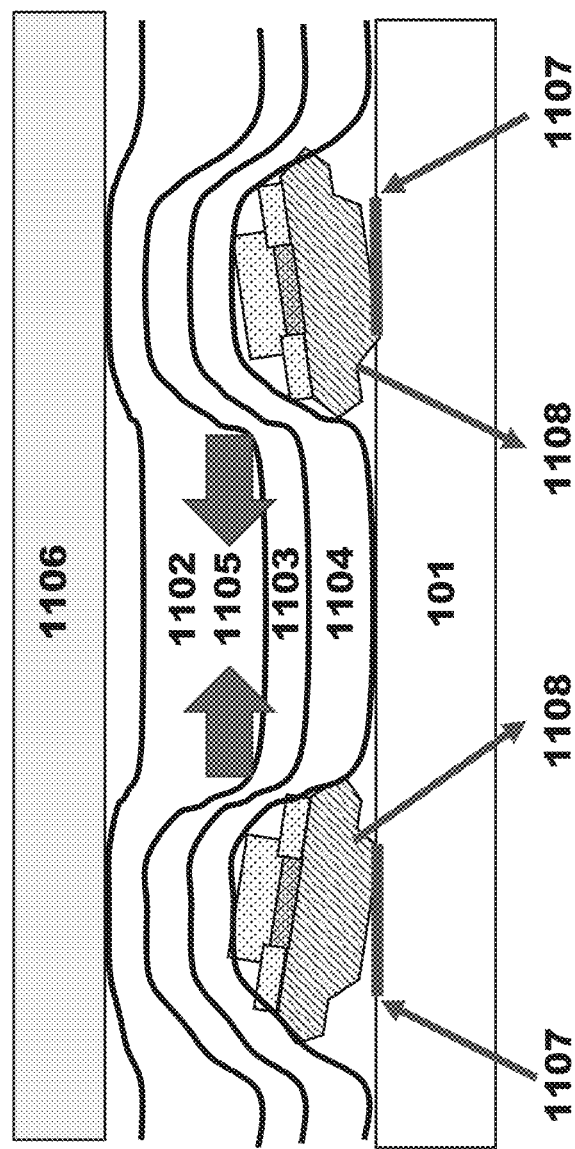

As shown in FIG. 11(c), the polymer film 1101 shrinks as the temperature decreases. As a result, the bottom of the polymer film 1101 is lower than the top of the bars 901 of the devices 110, as shown in FIG. 11(d).

As shown in FIG. 11(c), the polymer film 1101 can apply the pressure 1105 in the horizontal direction at side facets of the bars 901 of the devices 110, exposing cleaving points 1107 and tilting the bars 901 of the devices 110 downward obliquely 1108. This pressure 1105 applied from the side facets allows the bars 901 of the devices 110 to be effectively removed from the substrate 101. During low temperature, the polymer film 1101 maintains the applied pressure 1105 from the top of the polymer film 1101 to the bars 901 of the devices 110.

Various methods may be used to reduce the temperature. For example, the substrate 101 and the polymer film 1101 can be placed into liquid $N_2$ (for example, at 77° K) at the same time while applying pressure 1105. The temperature of the substrate 101 and the polymer film 1101 can also be controlled with a piezoelectric transducer. Moreover, the plate 1106 that applies the pressure 1105 to the polymer film 1101 can be cooled to a low temperature before and/or during contact with the polymer film 1101. By doing this, the polymer film 1101 is cooled and can apply pressure 1105 to the bars 901 of the devices 110 due to a large thermal expansion coefficient.

When reducing the temperature, the substrate 101 and the polymer film 1101 may be wetted by atmospheric moisture. In this case, the temperature reduction can be conducted in a dry air atmosphere or a dry $N_2$ atmosphere, which avoids the substrate 101 and the polymer film 1101 getting wet.

Thereafter, the temperature increases, for example, to room temperature, and the pressure 1105 is no longer applied to the polymer film 1101, as shown in FIG. 11(d). At that time, the bars 901 of the devices 110 can be removed from the substrate 101, and the polymer film 1101 is then separated from the substrate 101, as shown in FIG. 11(e). When using a polymer film 1101, especially a polymer film 1101 having adhesive 1103, the bars 901 of the devices 110 can be removed using the polymer film 1101 in an easy and quick manner.

Removing the Bar

Removing the bar 901 utilizing the different thermal expansion coefficients between the polymer film 1101 and the semiconductor material of the device 110 can apply horizontal direction pressure uniformly to the whole substrate 101. Thus, the bar 901 of device 110 can be removed from the substrate 101 without breaking the bar 901. This have been proven by the resulting high yield.

Figure 12A:
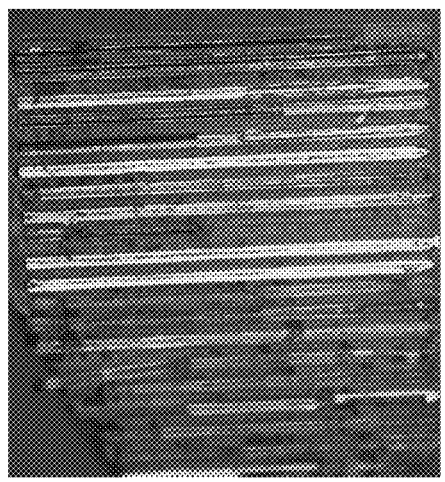
FIGS. 12(a) and 12(b) are SEM images showing a surface of the substrate and a surface of a bar of a device, according to one embodiment of the present invention.
Figure 12B:
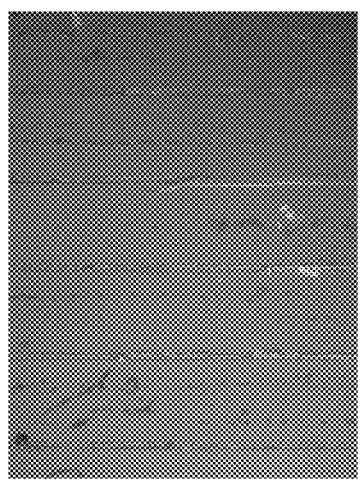

FIGS. 12(a) and 12(b) are SEM images of the bar 901, showing the surface of the substrate 101 in FIG. 12(a), and the surface of the bar in FIG. 12(b).

The bar 901 of the device 110 is a rectangular shape with long sides and short sides, as shown in FIGS. 13(a) and 13(b). Pressure is applied to the bar 901 of the device 110 having such a shape from a vertical direction and in a horizontal direction against the long side of the bar 901, as shown in FIG. 11(c). By doing this, an effective impact can be given to the cleaving point, which removes the bars 901 of the devices 110 from the substrate 101. The growth restrict mask 102 is preferably eliminated from the substrate 101 by wet etching, etc., before attaching the polymer film to the bars 901 of the devices 110. Eliminating the growth restrict mask 102 makes a space to apply pressure at the cleaving point underneath the bars 901 of the devices 110, which can tilt the bars 901 of the devices 110 obliquely downward as shown in FIG. 11(c).

Cleaving at a Separate Area of the M-Plane Surface

Figure 14A:
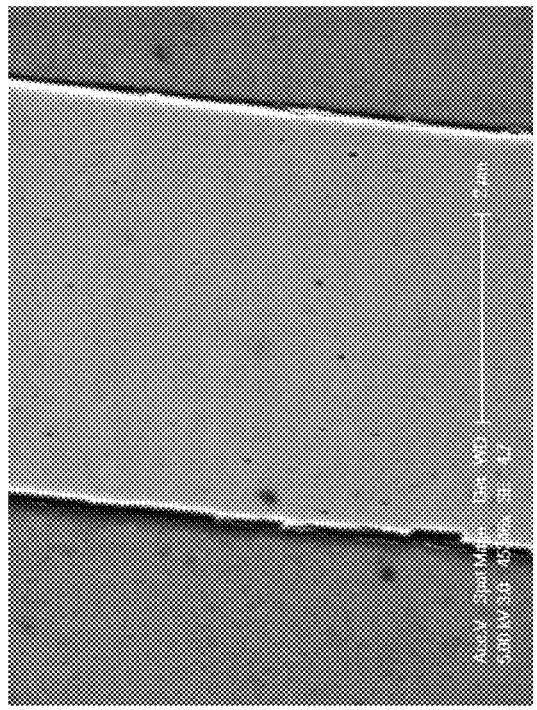
Figure 14A:
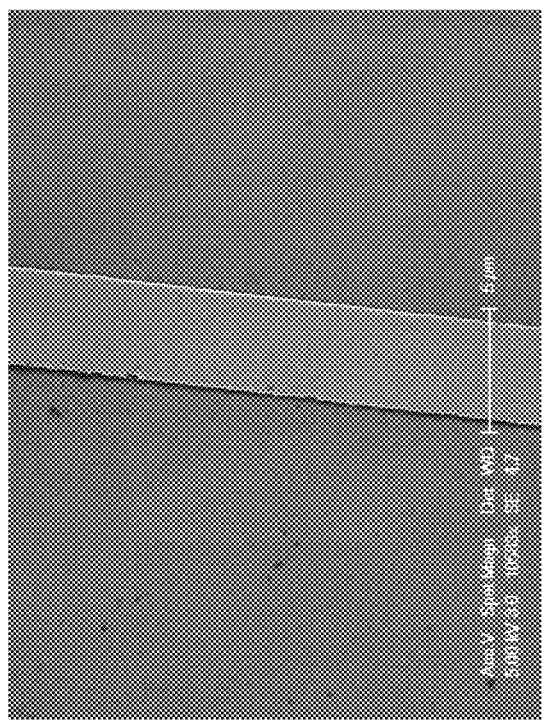

FIGS. 14(a) and 14(b) are SEM images at different magnifications of the surface of the substrate 101, which is a nonpolar (1-100) III-nitride substrate 101 without a miscut orientation. As shown in FIGS. 14(a) and FIG. 14(b), utilizing the m-plane facet for cleaving results in a very smooth surface for the substrate 101 after the bar 901 is removed. In this case, the resulting surface of the bar 901 could be adopted as a facet of a VCSEL for lasing.

Step 7: Fabricating an N-Electrode at the Separate Area of the Device

Figure 15A:
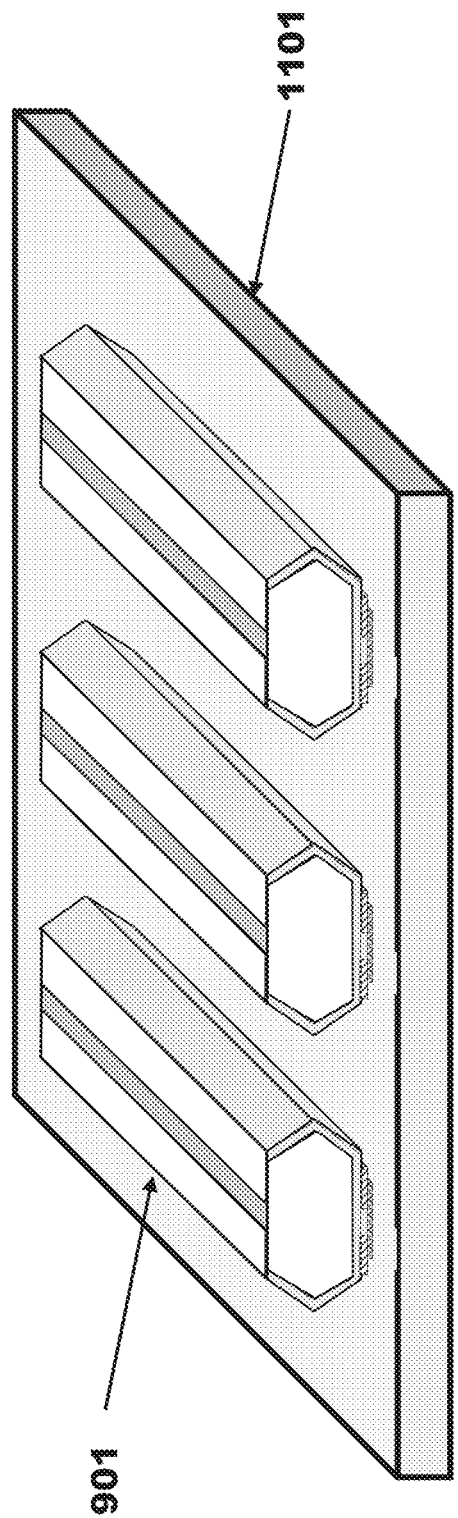
FIGS. 15(a), 15(b), 15(c), 15(d), 15(e) and 15(f) are schematics illustrating how a bar of a device is divided, according to one embodiment of the present invention.

After removing the bar 901 from the substrate 101, the bar 901 remains attached to the polymer film 1101, which is shown with the bar 901 positioned in an upside-down manner on the film 1101, as shown in FIG. 15(a).

Figure 15B:
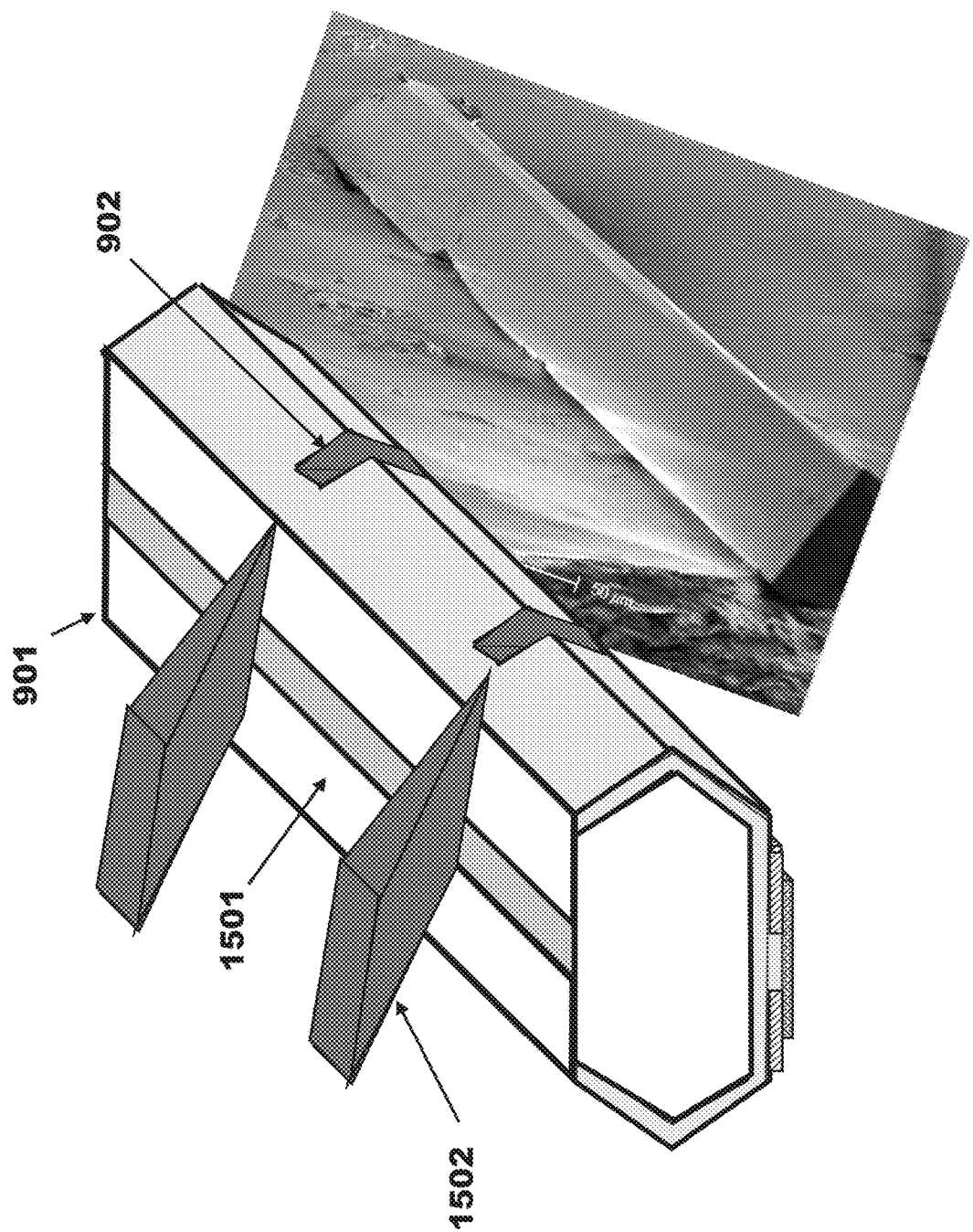

FIG. 15(b) shows the back side of the bar 901, both as a schematic and an SEM image, which has a separate area 1501 between the dividing support regions 902. The separate area 1501 contacts the substrate 101, or the underlying layer directly, but is not on the growth restrict mask 102. Cleaving blades 1502 are used at the dividing support regions 902.

Figure 15C:
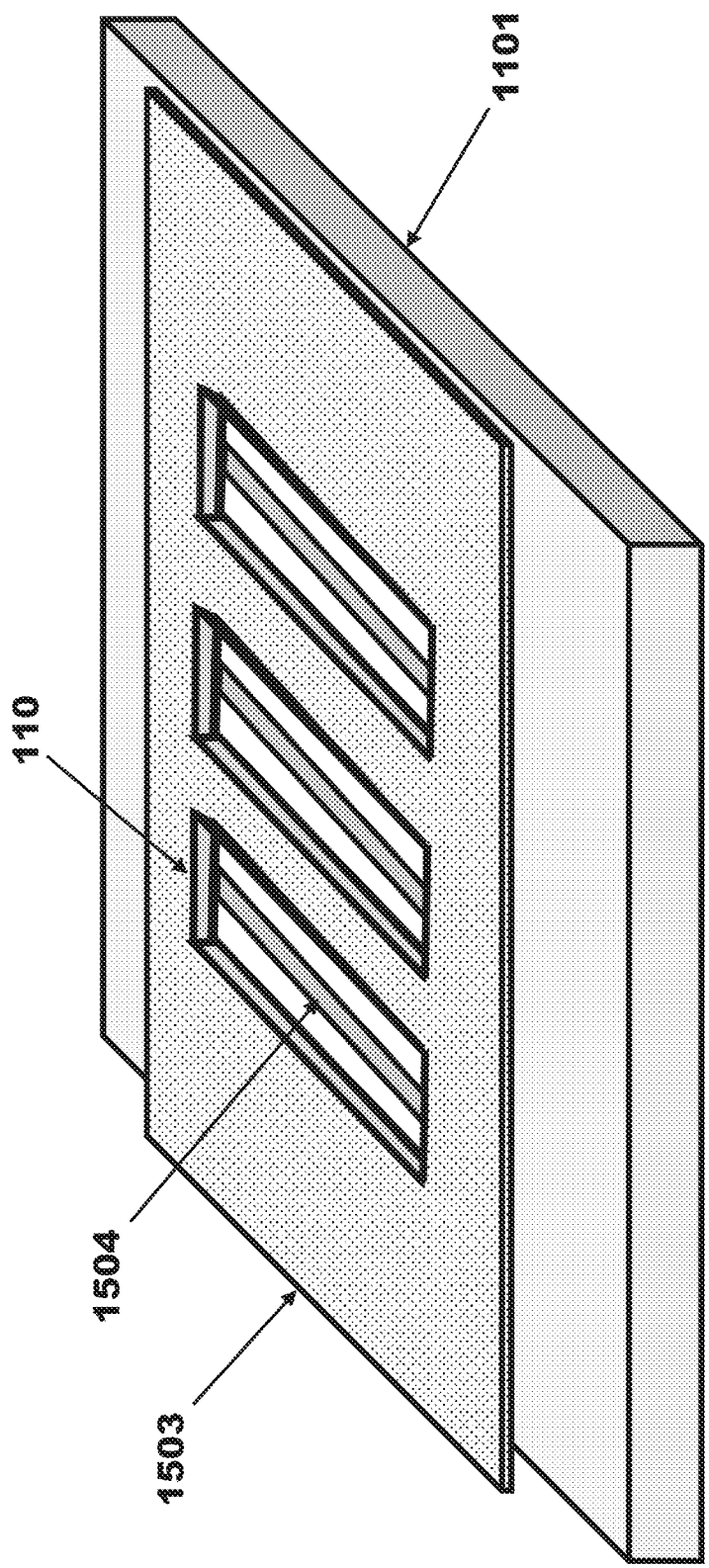

Then, as shown in FIG. 15(c), a metal mask 1503 can be used to dispose an n-electrode 1504 on the back side of the device 110.

In the case of forming the n-electrode 1504 of back side of the bar 901 after removing the bar 901 from the substrate 101, the n-electrode 1504 is preferably formed on the separate area 1501. This separate area 1501 is kept in a good surface condition for the n-electrode 1504 to obtain low contact resistivity. The present invention keeps this area 1501 clean until removing the island-like III-nitride semiconductor layers 109.

The n-electrode 1504 also can be disposed on the top surface of the bar 901, which is the same surface made for a p-electrode 808.

Typically, the n-electrode 1504 is comprised of the following materials: Ti, Hf, Cr, Al, Mo, W, Au. For example, the n-electrode 1504 may be comprised of Ti—Al—Pt—Au (with a thickness of 30-100-30-500 nm), but is not limited to those materials. The deposition of these materials may be performed by electron beam evaporation, sputter, thermal heat evaporation, etc.

Step 8. Breaking the Bar of the Device Into Chips

Figure 15D:
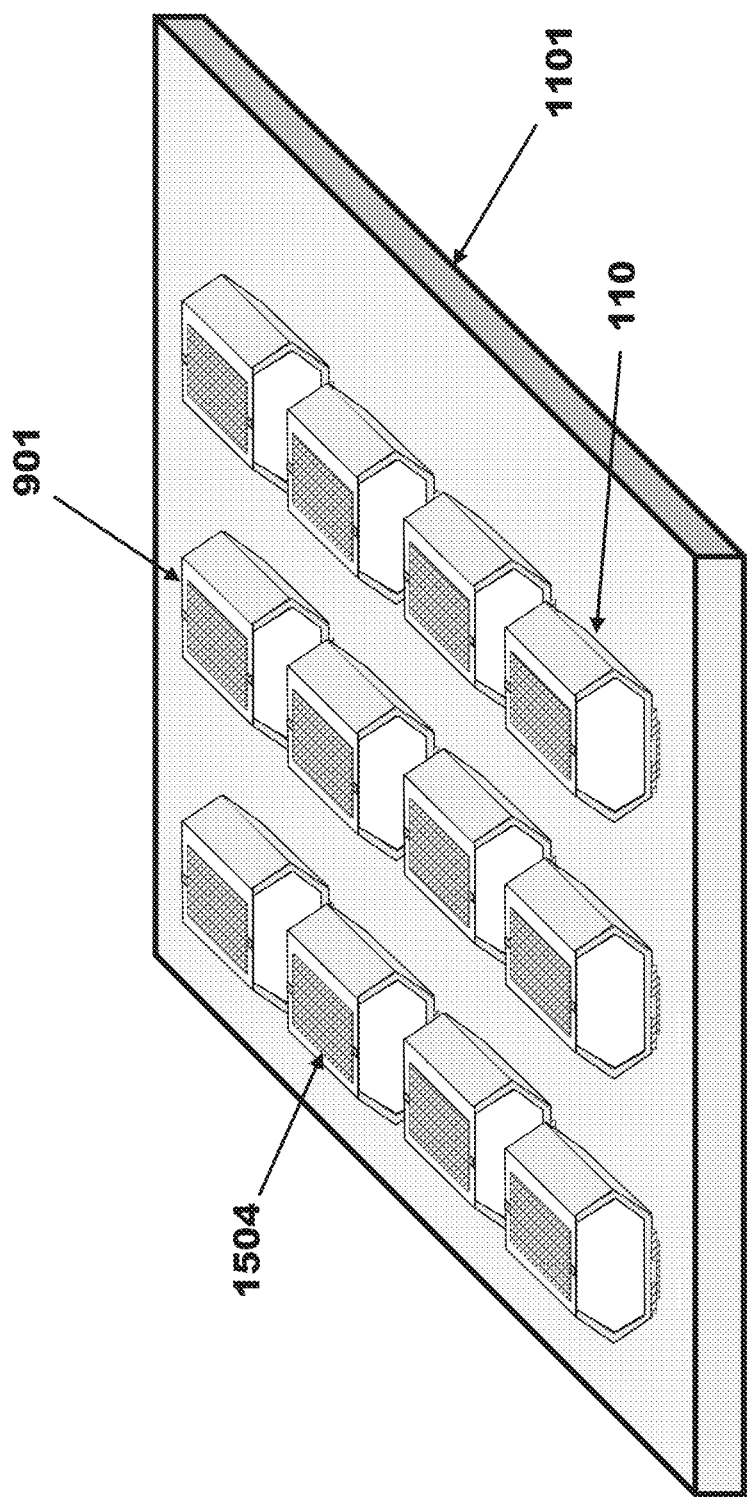
Figure 15E:
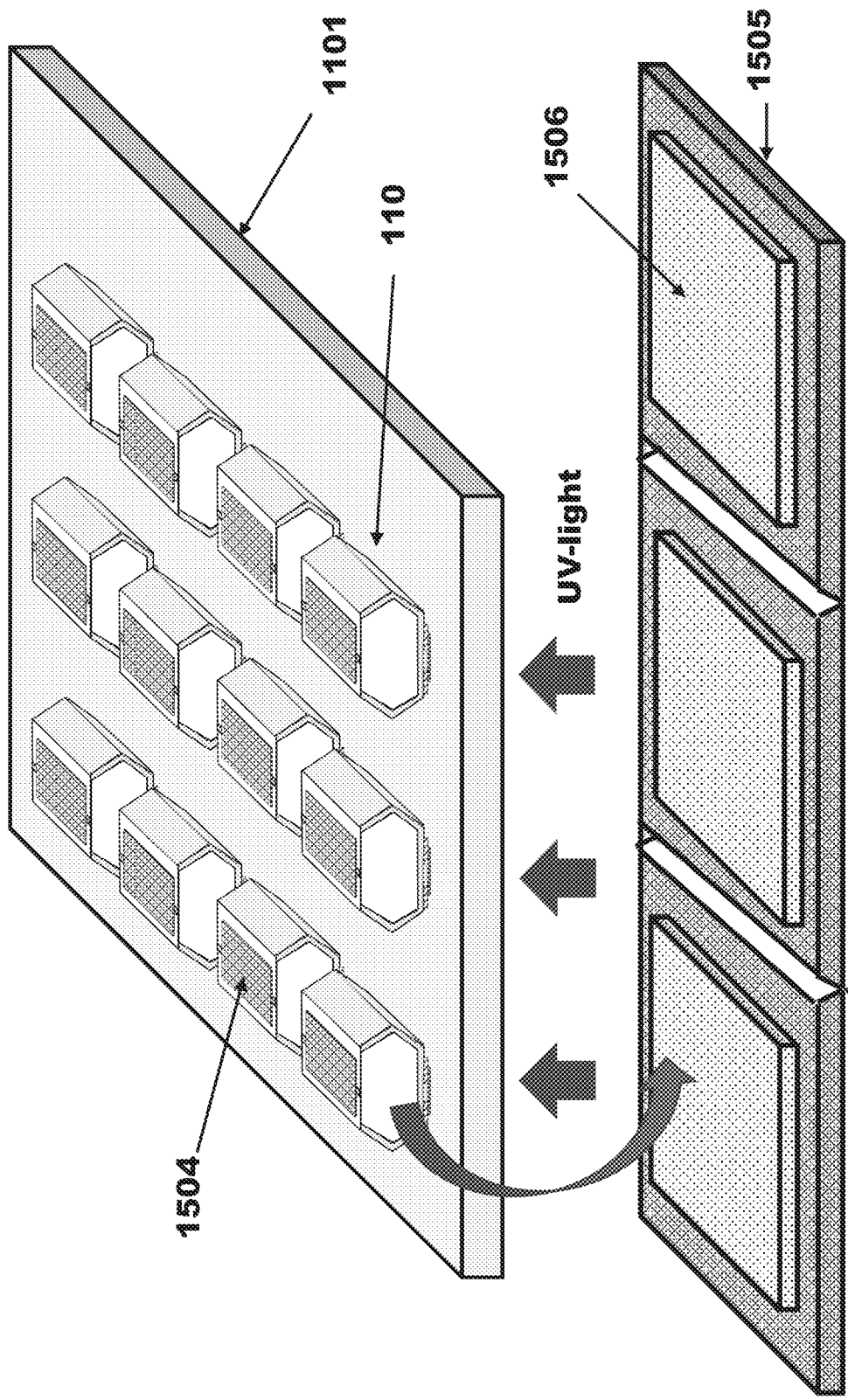
Figure 15F:
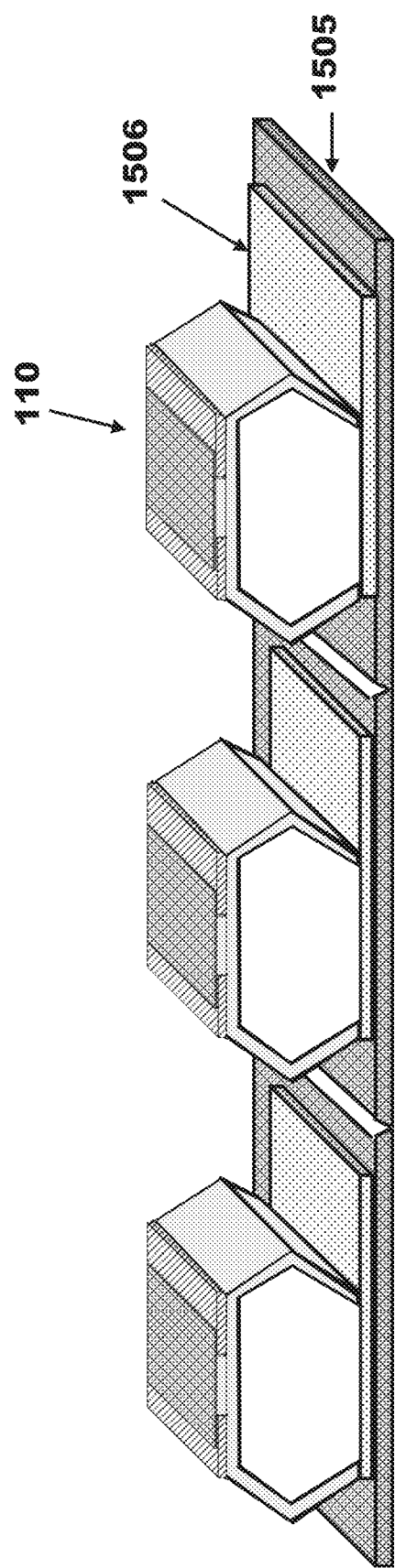

After disposing the n-electrode 1504, multiple bars 901 laterally disposed are divided into a plurality of devices 110, as shown in FIG. 15(d). The dividing support regions 902 help divide the bar 901 into the devices 110, as shown in FIG. 15(b). Although cleaving is used, a breaking method or other method can be used as well.

As shown in FIG. 16(a), it is possible that multiple bars 901 laterally disposed are both cleaved and broken into separate devices 110 at dividing support regions 902. Moreover, as shown in FIG. 16(b), it is also possible that multiple bars 901 both laterally and longitudinally disposed are cleaved at dividing support regions 902. Further, the dividing support regions 902 may be disposed on both sides 1601 or one side 1602 of the bars 901.

Step 9. Mounting the Device on a Heat Sink Plate

After Step 8, the divided bar 901 is still on the polymer film 1101. In one embodiment, the polymer film 1101 is an ultraviolet (UV) light-sensitive dicing tape that is exposed to UV light, which can reduce the adhesive strength of the film 1101, as shown in FIG. 15(*e*). This makes it easy to remove the devices 110 from the film 1101.

In this step, a heat sink plate 1505 comprised of AlN is prepared. An Au—Sn solder 1506 is disposed on the heat sink plate 1505, the heat sink plate 1505 is heated over the melting temperature of the solder 1506, and the devices 110 on the polymer film 1101 are bonded to the heat sink plate 1505 using the Au—Sn solder 1506. The devices 110 can be mounted on the heat sink plate 1505 in two ways: (1) n-electrode 1504 side down or (2) p-electrode 808 side down. FIG. 15(*e*) shows the devices 110 mounted to the heat sink plate 1505 using the solder 1506 with the n-electrode 1504 side down. Trenches 1507 in the heat sink plate 1505 separate the devices 110, wherein the trenches 1507 are used to divide the heat sink plate 1505, as described in more detail below.

Step 10. Coating the Facets of the Laser

The next step of device processing comprises coating the facets 904 of the device 110. While a laser diode device 110 is lasing, the light in the device 110 that penetrates through the facets 904 of the device 110 to the outside of the device 110 is absorbed by non-radiative recombination centers at the facets 904, so that the facet 904 temperature increases continuously. Consequently, the temperature increase can lead to catastrophic optical damage (COD) of the facet 904.

A facet 904 coating can reduce the non-radiative recombination center. Preventing the COD, it is necessary to coat the facet 904 using dielectric layers, such as AlN, AlON, $Al_2O_3$, SiN, SiON, $SiO_2$, $ZrO_2$, TiO2, $Ta_2O_5$ and the like. Generally, the coating film is a multilayer structure comprised of the above materials. The structure and thickness of the layers is determined by a predetermined reflectivity.

Figure 17:
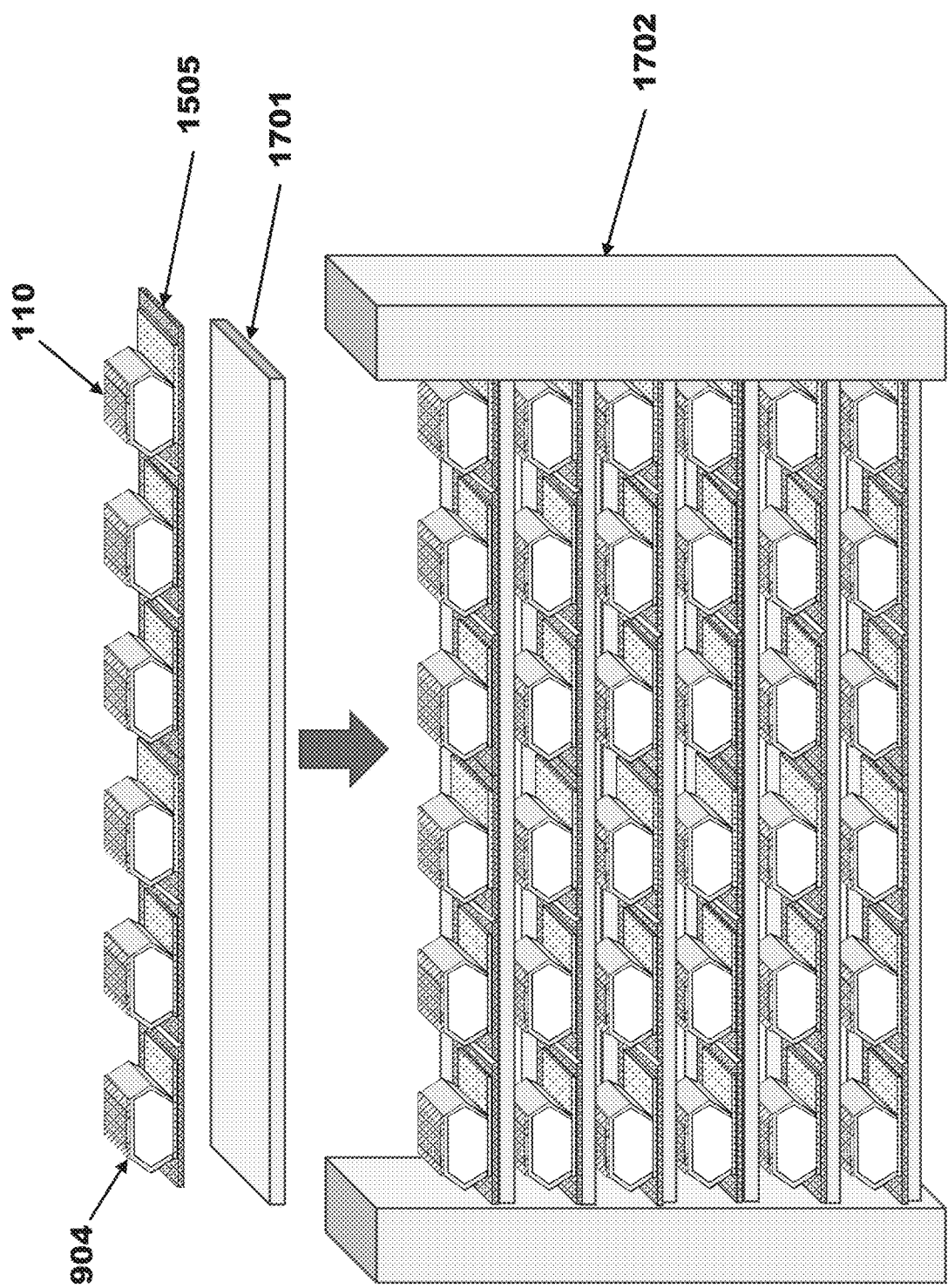
FIG. 17 is a schematic illustrating how facets are coated on a device, according to one embodiment of the present invention.

In the present invention, the bar 901 of device 110 may have been divided in Step 8 to obtain cleaved facets 904 for multiple devices 110. As a result, the method of coating the facets 904 needs to be performed on multiple devices 110 at the same time, in an easy manner. In one embodiment, the devices 110 are mounted in a horizontally offset manner on the heat sink plate 1505, e.g., towards one side of the heat sink plate 1505, as shown in FIG. 15(*f*). Then, as shown in FIG. 17, the devices 110 and the heat sink plate 1505 are placed on a spacer plate 1701, and a plurality of spacer plates 1701 are stored in a coating holder 1702.

Note that it is not always necessary to use a spacer plate 1701, and the heat sink plate 1505 could be used alone. Alternatively, the heat sink plate 1505 could be mounted on another bar or plate, that is then placed on the spacer plate 1701.

By doing this, the facets 904 of a number of devices 110 can be coated simultaneously. In one embodiment, the facet 904 coating is conducted at least two times—once for the front facet 904 of the devices 110 and once for the rear facet 904 of the devices 110. The length of the heat sink plate 1505 may be dimensioned to be about the cavity length of the laser diode device 110, which makes it quick and easy to perform the facet 904 coating twice.

Once the spacer plate 1701 is set in the coating holder 1702, both facets 904 of the devices 110 can be coated without setting the spacer plate 1701 in the coating holder 1702 again. In one embodiment, a first coating is performed on a front facet 904 which emits the laser light, and a second coating is performed on the rear facet 904 which reflects the laser light. The coating holder 1702 is reversed before the second coating in the facility that deposits the coating film. This reduces the lead time of the process substantially.

Step 11. Dividing the Coating Bar

As shown in FIG. 18(*a*), wire bonds 1801 and 1802 are attached to the devices 110, and then the heat sink plate 1505 is divided at the trenches 1507, for example, between one or more of the devices 110. FIG. 18(*b*) is a top view of FIG. 18(*a*) that shows the relative placements and positions of the devices 110, trenches 1507 and bonds 1801, 1802. FIG. 18(*c*) shows the use of separate probes 1803 and wire bonds 1804 with the devices 110.

FIGS. 19(*a*) and 19(*b*) further show how the heat sink plate 1505 is divided to separate the devices 110, which may occur before or after the attachment of the wire bonds 1801, 1802. By doing this, it is easy to separate the devices 110 after the coating process has been completed.

Step 12. Screening the Device

This step distinguishes between defective and non-defective devices 110. First, various characteristics of the devices 110 are checked under a given condition; such as output power, voltage, current, resistivity, FFP (Far Field Pattern), slope-efficiency and the like. At this point, the devices 110 have already been mounted on the heat sink plate 1505, so it is easy to check these characteristics.

Figure 20A:
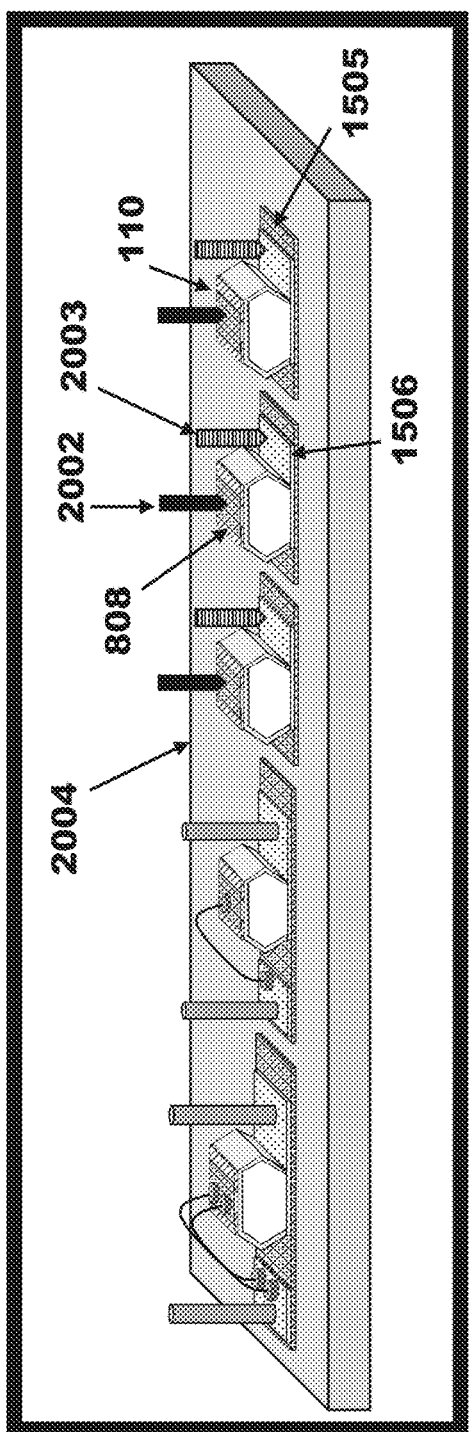
FIGS. 20(a) and 20(b) are schematics illustrating a testing apparatus for devices, according to one embodiment of the present invention.
Figure 20B:
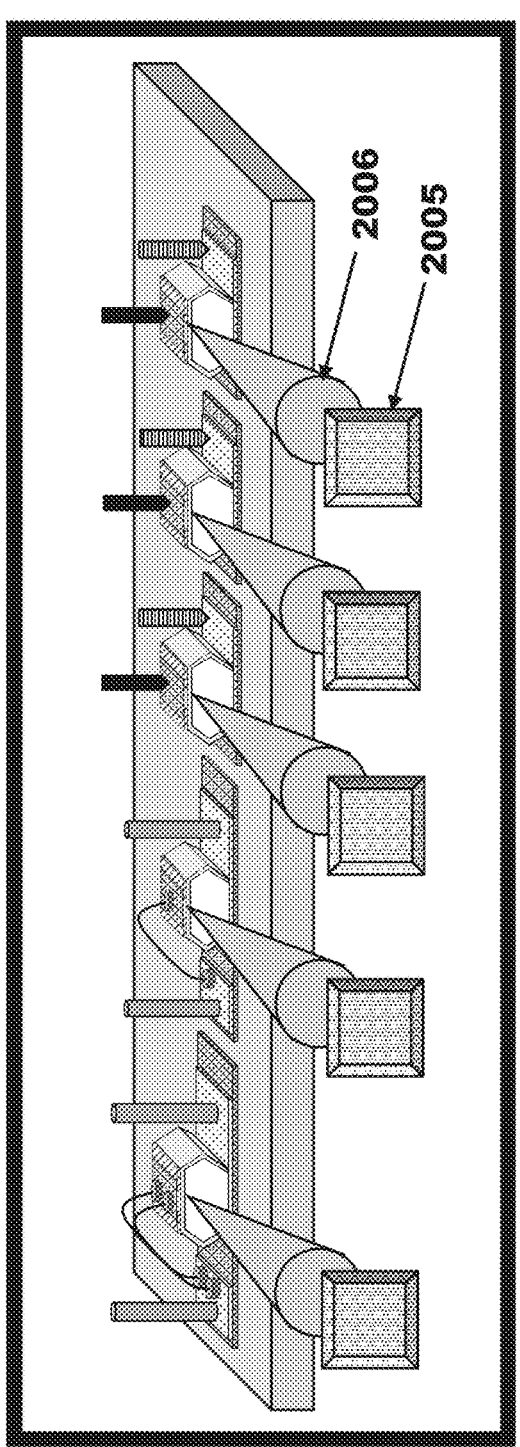

A testing apparatus 2001 is shown in FIGS. 20(*a*) and 20(*b*), wherein the p-electrode 808 and the solder 1506, which has an electrical continuity to the n-electrode 1504, are contacted by probes 2002, 2003. Then, non-defective devices 110 can be selected and screened by an aging test (life time test).

In one embodiment, it is preferable that testing apparatus 2001 comprise a box or other container, so that an aging test may be conducted with the devices 110 sealed in a dry air or nitrogen atmosphere. Moreover, a heat stage 2004 may be used to maintain the temperature of the devices 110 during the screening test, for example, 60 degrees, 80 degrees and so on. Photodetectors 2005 may be used to measure light output power 2006, which identifies non-defective devices 110 that have a constant output power, or which identifies defective devices 110.

In particularly, in the case of a III-nitride laser diode device 110, it is known that when a laser diode 110 is oscillated in a moisture-containing atmosphere, it deteriorates. This deterioration is caused by moisture and siloxane in the air, so the III-nitride laser diode device 110 needs to be sealed in dry air during the aging test.

Figure 21:
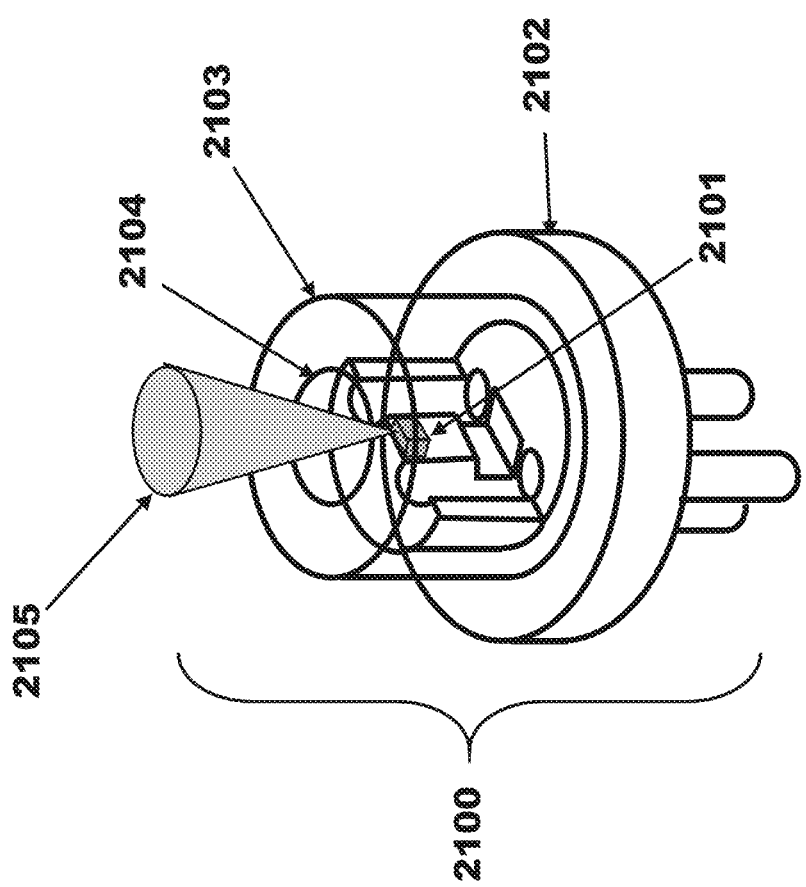
FIG. 21 is a schematic illustrating how a device is packaged, according to one embodiment of the present invention.

Consequently, as shown in FIG. 21, when a III-nitride laser diode device 2100 is shipped from a manufacturer, the chip 2101 itself (i.e., the device 110) is mounted on a stem 2102 and sealed in a dry air atmosphere using a TO-can package 2103, wherein the package 2103 includes a window 2104 for light emission.

Generally speaking, the screening or ageing tests are conducted before shipping, in order to screen out defective devices 110. For example, the screening condition is conducted according to the specifications of the laser diode device 110, such as a high temperature and a high power.

Moreover, an aging test may be conducted with the device 110 mounted on/into the package 2100, with the package 2100 sealed in dry air and/or dry nitrogen before screening. This fact makes the flexibility of packaging and mounting of the laser device restrictive.

In the prior art, if defective production happens, the defective products are discarded in the whole TO-CAN package 2100, which is a great loss for production. This makes it difficult to reduce the production costs of laser diode devices 110. There is a need to detect defective devices 110 at an earlier step.

In the present invention, coating the facets 904 of the device 110 using a heat sink plate 1505, on which can be mounted a plurality of the devices 110 in a low horizontal position and then, after the coating process, dividing the heat sink plate 1505 and the devices 110 using the trenches 1507, allows the devices 110, with the sub-mount of the heat sink plate 1505, to be checked in the screening test in a dry air or nitrogen atmosphere.

When doing the screening test, the devices 110 already has two contacts, namely the p-electrode 808 and the solder 1506 on the heat sink plate 1505, or in the case of flip-chip bonding, the n-electrode 1504 and the solder 1506 on the heat sink plate 1505. Moreover, the present invention can select defective products using the screening test, when the device 110 is only comprised of the device 110 and the heat sink plate 1505. Therefore, in the case of discarding the defective products, the present invention can reduce the loss more than the prior art, which has great value.

Figure 18C:
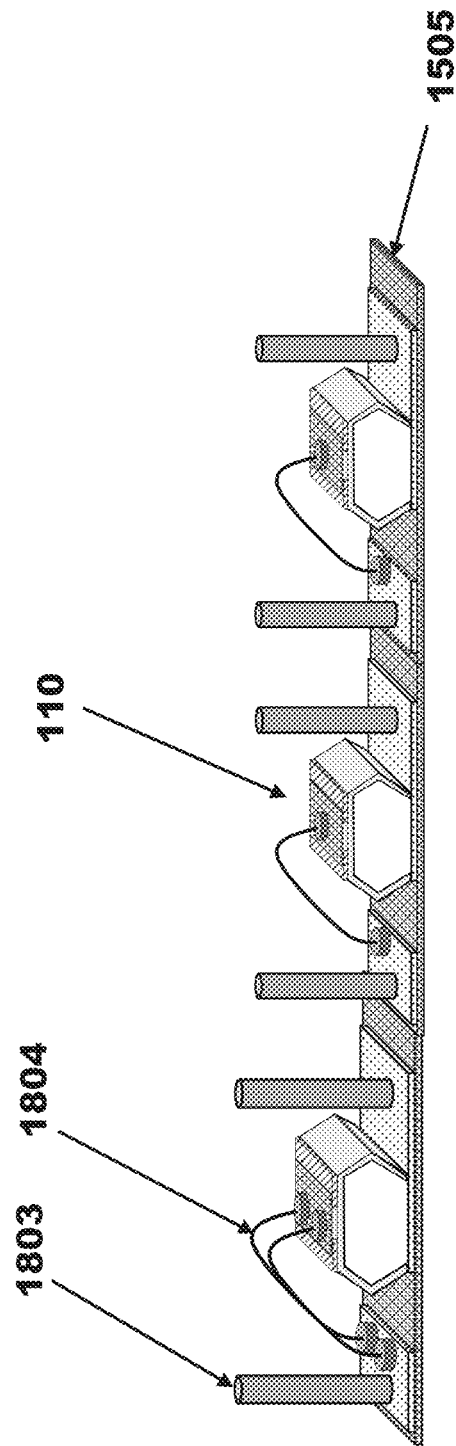

In the case of screening of high-power laser diode devices 110, it may be preferable that the heat sink plate 1505 has two parts of solder 1506 disposed without electrical continuity. One part of solder 1506 is connected to the p-electrode 808 with a wire (not shown), and another part of solder 1506 is connected to the n-electrode 1504 with a wire (not shown). Moreover, it may be preferable that the p-electrode 808 and n-electrode 1504 are connected by two or more wires to the solder parts 1506, for example, as shown in FIG. 18(c), which shows the p-electrode 808 connected by two or more wires 1804 to the solder 1506. In this way, the probes 1803 for applying current to the device 110 can avoid contacting the p-electrode 808 (or n-electrode 1504) directly, which, in the case of screening of high-power laser diode devices 110, is critical. Specifically, the probes 1803 could break the contacted parts, in particular, in the case of applying a high current density.

Step 13. Mounting the Devices on/into the Packages

Figure 22:
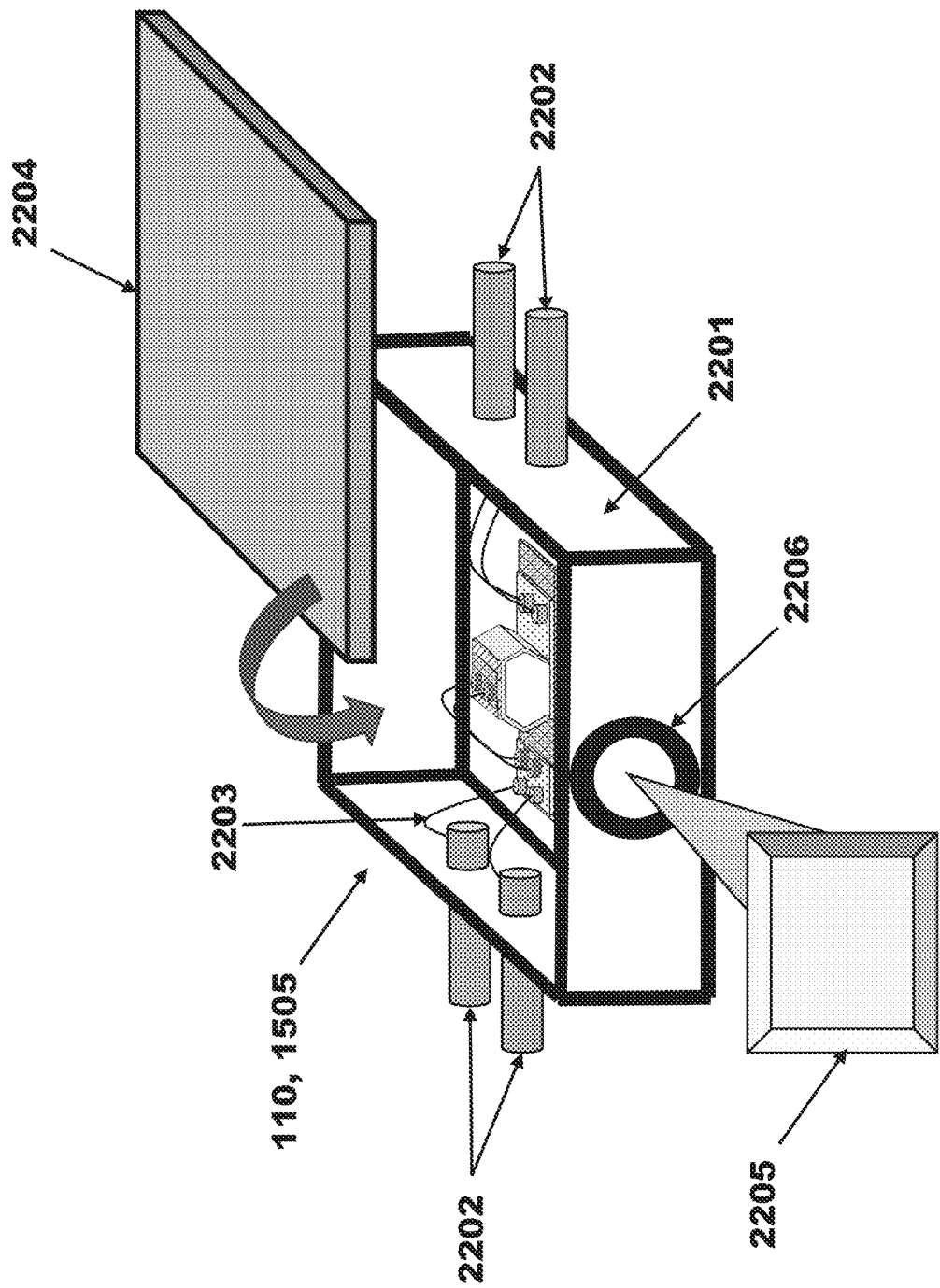
FIG. 22 is a schematic illustrating how a device is packaged, according to one embodiment of the present invention.

As shown in FIG. 22, the device 110 (including the heat sink plate 1505) may be mounted in a package 2201 using solder or another metal to bond the device 110 at the bottom of the package 2201. Pins 2202 of the package 2201 are connected to the device 110 by wires 2203. By doing this, current from an external power supply can be applied to the device 110.

This is more preferable than bonding between the package 2201 and the heat sink plate 1505 using a metal, such as Au—Au, Au—In, etc. This method requires a flatness at the surface of package 2201 and at the back side of the heat sink plate 1505. However, without the solder, this configuration accomplishes a high thermal conductivity and low temperature bonding, which are big advantages for the device process.

Thereafter, a lid 2204 may enclose the package 2201. Moreover, a phosphor 2205 can be set outside and/or inside the package 2201, with a window 2206 allow the light emission to exit the package 2201. By doing this, the package 2201 can be used as a light bulb or a head light of an automobile.

As set forth herein, these processes provide improved methods for obtaining a laser diode device 110. In addition, once the device 110 is removed from the substrate 101, the substrate 101 can be recycled a number of times. This accomplishes the goals of eco-friendly production and low-cost modules. These devices 110 may be utilized as lighting devices, such as light bulbs, data storage equipment, optical communications equipment, such as Li-Fi, etc.

It is difficult to package with a plurality of different types of laser devices 110 in one package 2201. However, this method can overcome this issue, due to being able to perform an aging test without the packaging. Therefore, it is easy to mount the different types of devices 110 in one package 2201.

Fabricating an LED Device

Although the above description refers to fabricating a laser diode device 110, an LED device 110 may also be fabricated using the same method until Step 3.

Specifically, the method can make two types of LED: a Type 1 LED that has two electrodes on one side of the chip, both the p-electrode and the n-electrode, or a Type 2 LED that has electrodes on both sides of the chip.

In the case of the Type 1 LED, in Step 3, the p-electrode and n-electrode are formed on a top surface of the device. Then, from Step 4 to Step 9, the method is the same. Steps 10-11 are omitted, but Steps 12-13 may be performed.

In the case of the Type 2 LED, almost the same method is used as the Type 1 LED, except that an ITO electrode is formed on the p-GaN contact layer.

Definition of Terms

III-Nitride Based Substrate

As long as a III-nitride based substrate 101 enables growth of III-nitride semiconductor layers 105, 106, 109 through the growth restrict mask 102, any GaN substrate 101 that is sliced on a {1-100} plane or other plane, and from a bulk GaN and AlN crystal, can be used.

Hetero-Substrate

Moreover, the present invention can use a hetero-substrate 101 with, for example, a III-nitride semiconductor template deposited thereon, wherein the hetero-substrate 101 is a foreign substrate 101, such as sapphire, Si, GaAs, SiC, etc., and the template is GaN or another III-nitride semiconductor. The template is typically grown to a thickness of about 2-6 μm, and then the growth restrict mask 102 is disposed on the template.

Growth Restrict Mask

The growth restrict mask 102 typically comprises a dielectric layer, such as SiN, SiON, $Al_2O_3$, AlN, AlON, MgF, $ZrO_2$, etc., or a refractory metal or precious metal, such as W, Mo, Ta, Nb, Rh, Ir, Ru, Os, Pt, etc. The growth restrict mask 102 may be a laminate structure selected from the above materials. It also can use a multiple-stacking layer structure which is choose above materials.

In one embodiment, the thickness of the growth restrict mask 102 is about 0.05-3 μm. The width of the mask is preferably larger than 20 μm, and more preferably, the width is larger than 40 μm.

The growth restrict mask 102 may be deposited by sputter or electron beam evaporation or PECVD (plasma-enhanced chemical vaper deposition), ion beam deposition (IBD); but is not limited to those methods.

The growth restrict mask 102, as shown in FIGS. 13(a) and 13(b) comprises a plurality of striped opening areas 103, which are arranged in a first direction parallel to the 11-20 direction of the (1-100) plane-oriented III-nitride based semiconductor substrate 101 and a second direction parallel to the 0001 direction of the III-nitride based semiconductor substrate 101, periodically at intervals p1 and p2, respectively, extending in the second direction. The length a of the opening area 103 is, for example, 200 to 35000 µm; the width b is, for example, 2 to 180 µm; the interval p1 of the opening area 102 is, for example, 20 to 180 µm; and the interval p2 is, for example, 200 to 35000 µm; the width of the mask portion is 60 µm; and the distance between the opening area 103 and the opening area 103 in the 1-100 direction is 100 µm.

Another version of the growth restrict mask 102 is shown in FIGS. 23(a) and 23(b). This growth restrict mask 102 also comprises a plurality of striped opening areas 103, each of which are used to form bars 901 of devices 110, wherein the devices are separated laterally by the no-growth regions and the bars 901 are separated longitudinally by dividing support regions 902.

III-Nitride Based Semiconductor Layers

The ELO III-nitride layer 105, the III-nitride semiconductor device layers 106 and the island-like III-nitride semiconductor layers 110 are typically GaN layers, but can include In, Al and/or B, as well as other impurities, such as Mg, Si, Zn, O, C, H, etc.

The III-nitride semiconductor device layers 106 generally comprise more than two layers, including at least one layer among an n-type layer, an undoped layer and a p-type layer. The III-nitride semiconductor device layers 106 specifically comprise a GaN layer, an AlGaN layer, an AlGaInN layer, an InGaN layer, etc.

In the case where the device 110 has a plurality of III-nitride semiconductor layers 105, 106, 109, the distance between the island-like III-nitride based semiconductor layers 109 adjacent to each other is generally 30 µm or less, and preferably 10 µm or less, but is not limited to these figures.

Epitaxial Lateral Overgrowth

The crystallinity of the ELO III-nitride layers 105 laterally growing upon the growth restrict mask 102 from a striped opening area 103 of the growth restrict mask 102 is very high, and III-nitride based semiconductor layers 105, 106, 109 made of high-quality semiconductor crystal can be obtained.

Furthermore, two advantages may be obtained using ELO with a III-nitride substrate 101. One advantage is that a high-quality III-nitride semiconductor layers 105, 106, 109 can be obtained, such as with a very low defects density, as compared with using a sapphire substrate 101. Another advantage is that, by using a similar or same material for both the epilayers 105, 106, 109 and the substrate 101, strain in the epitaxial layers 105, 106, 109 can be reduced. Also, thanks to a similar or same thermal expansion, the method can reduce the amount of bending of the substrate 101 during epitaxial growth. The effect is that, as above, the production yield can be high in order to improve the uniformity of temperature.

On the other hand, a hetero-substrate 101, such as sapphire (m-, c-plane) LiAlO SiC, Si, etc., can be used, with a III-nitride template layer. The merit of the hetero-substrate 101 is low-cost, such as with sapphire, Si and the like, which is important for mass production. Also, a hetero-substrate 101 is easy to remove, due to weaker bonding strength at cleaving points.

When a plurality of island-like III-nitride semiconductor layers 109 are grown, and these layers are separated from each other, that is, are formed in isolation, tensile stress or compressive stress is limited to the island-like III-nitride semiconductor layers 109, and the effect of the tensile stress or compressive stress does not affect other III-nitride semiconductor layers.

Also, as the growth restrict mask 102 and the ELO III-nitride layers 105 are not bonded chemically, the stress in the ELO III-nitride layers 105 can be relaxed by a slide caused at the interface between the growth restrict mask 102 and the ELO III-nitride layers 105.

Also, the existence of gaps between the island-like III-nitride semiconductor layers 109, which are no-growth regions 104, results in the substrate 101 having rows of island-like III-nitride semiconductor layers 109, which has flexibility, and therefore, is easily deformed when external force is applied and can be bent. Therefore, even if there occurs a slight warpage, curvature, or deformation in the substrate 101, this can be easily corrected by a small external force, to avoid the occurrence of cracks. As a result, the handling of substrates 101 by vacuum chucking is possible, which makes the manufacturing process of the semiconductor devices 110 more easily carried out.

Moreover, island-like III-nitride semiconductor layers 109 made of high quality semiconductor crystal can be grown by suppressing the curvature of the substrate 101, and further, even when the III-nitride semiconductor layers 105, 106, 109 are very thick, the occurrences of cracks, etc., can be suppressed, and thereby a large area semiconductor device 110 can be easily realized.

Flat Surface Region

The flat surface region 107 is between band bending regions 108. Furthermore, the flat surface region 107 is on the growth restrict mask 102.

Fabrication of the semiconductor device 110 is mainly performed on the flat surface region 107. The width of the flat surface region 107 is preferably at least 5 µm, and more preferably is 10 µm or more. The flat surface region 107 has a high uniformity of the thickness of each semiconductor layer 105, 106, 109 in the flat surface region 107.

No-Growth Region

The no-growth region 104 defines the distance between the island-like III-nitride based semiconductor layers 109 adjacent to each other, and is generally 20 µm or less, and preferably 5 µm or less, but is not limited to these values.

Layer Bending Region

Figure 24A:
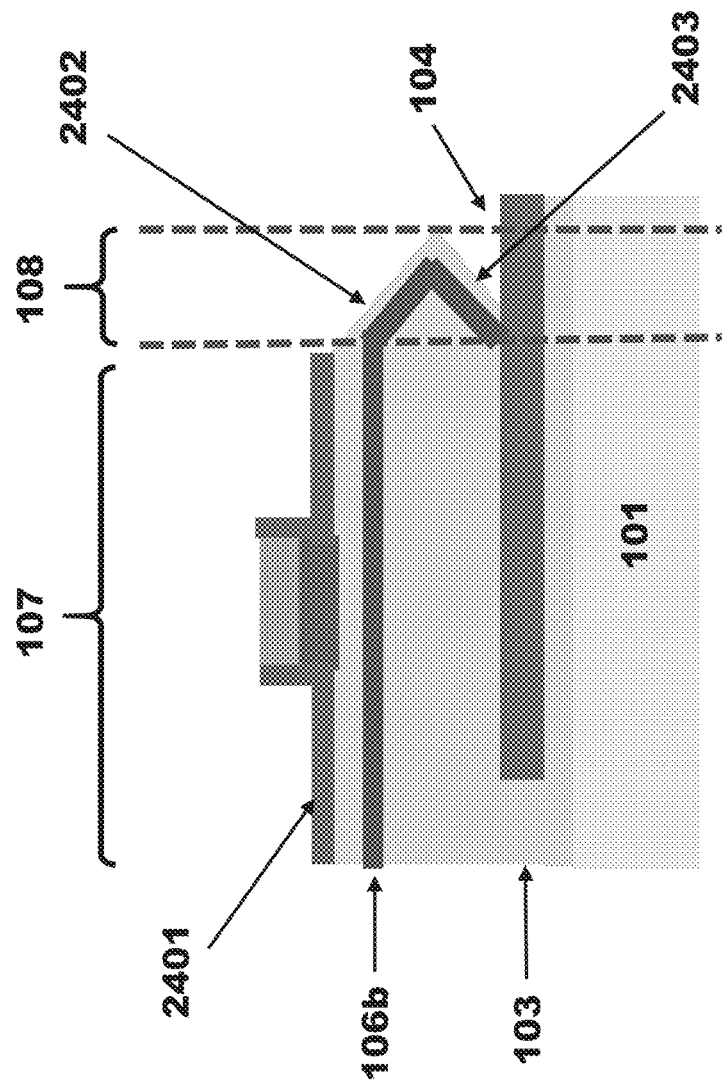
FIGS. 24(a) and 24(b) are schematics illustrating layer bending regions of a device, according to one embodiment of the present invention.
Figure 24B:
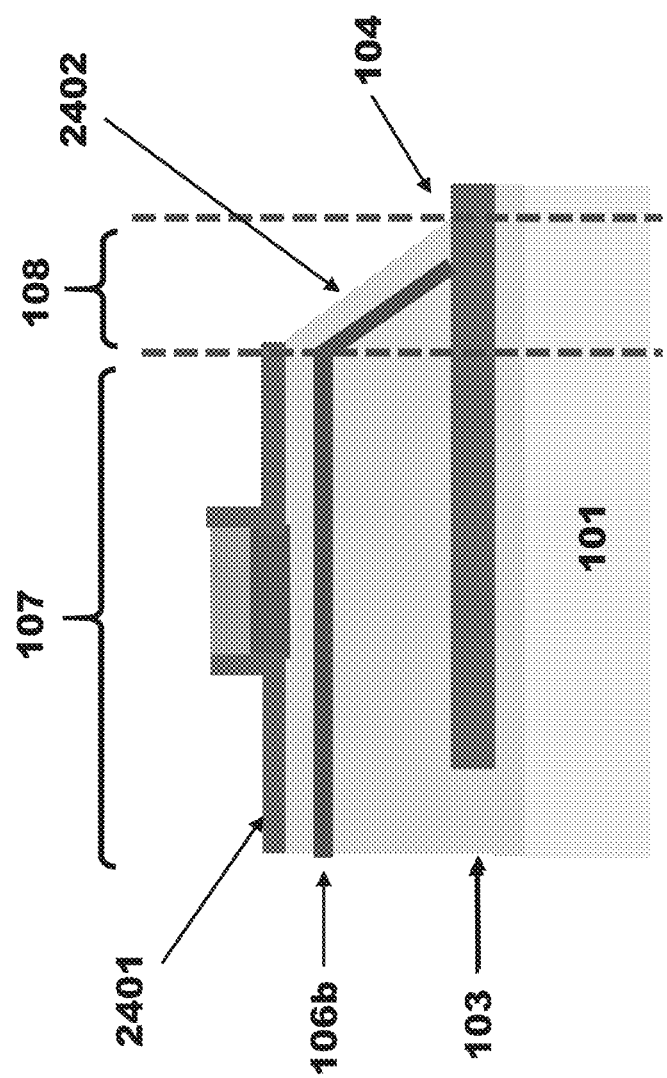

FIGS. 24(a) and 24(b) illustrate the layer bending regions 108. If a nonpolar or semipolar substrate 101 is used, there may be a first facet 2401 in the flat surface region 107, which is the main area for forming a ridge structure, and a second facet 2402, as well as a possible third facet 2403, in the layer bending region 108.

If the layer bending region 108 that includes the active layer 106b remains in the LED device 110, a portion of the emitted light from the active layer 106b is reabsorbed. As a result, it is preferable to remove at least a part of the active layer 106b in the layer bending region 108 by etching.

If the layer bending region 108 that includes an active layer 106b remains in the laser diode device 110, the laser mode may be affected by the layer bending region 108 due to a low refractive index (e.g., an InGaN layer). As a result, it is preferable to remove at least a part of the active layer 106b in the layer bending region 108 by etching.

Two etchings may be performed to remove the active layer 106b, wherein a first etching is performed to remove the active layer 106b in the region of the second facet 2402, before removing epi-layers 105, 106, 109 from the substrate 101, and a second etching is performed to remove the active layer 106b in a region of the third facet 2403, after removing the epi-layers 105, 106, 109 from the substrate 101.

The emitting region formed by the active layer 106b is a current injection region. In the case of a laser diode device 110, the emitting region is a ridge structure. In the case of an LED, the emitting region is the region for forming a p-contact electrode.

For both the LD and LED, the edge of the emitting region should be at least 1 μm or more from the edge of the layer bending region 108, and more preferably 5 μm.

From another point of view, an epitaxial layer of the flat surface region 107 except for the opening area 103 has a lesser defect density than an epitaxial layer of the opening area 103. Therefore, it is more preferable that the ridge stripe structure should be formed in the flat surface region 107 including on a wing region.

Devices

The device 110 may comprise, for example, a Schottky diode, a light-emitting diode, a semiconductor laser, a photodiode, a transistor, etc., but is not limited to these devices. This invention is particularly useful for micro-LEDs and laser diodes, such as edge-emitting lasers and vertical cavity surface-emitting lasers (VCSELs), and especially semiconductor lasers that require cleaved facets.

Polymer Film

Figure 25A:
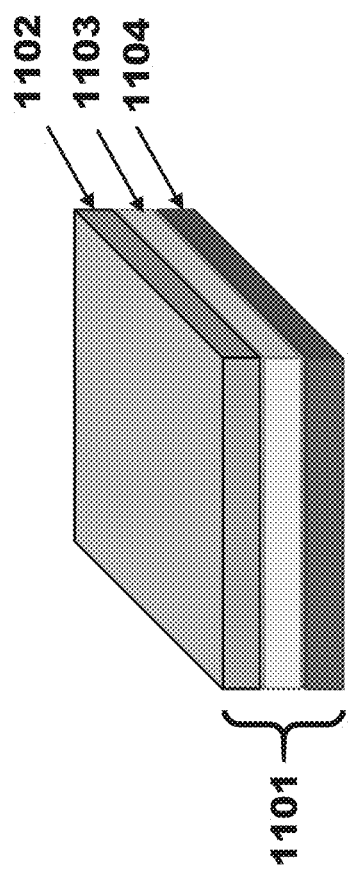
FIGS. 25(a) and 25(b) are schematics illustrating a polymer film used to remove a bar of a device from a substrate, according to one embodiment of the present invention.
Figure 25B:
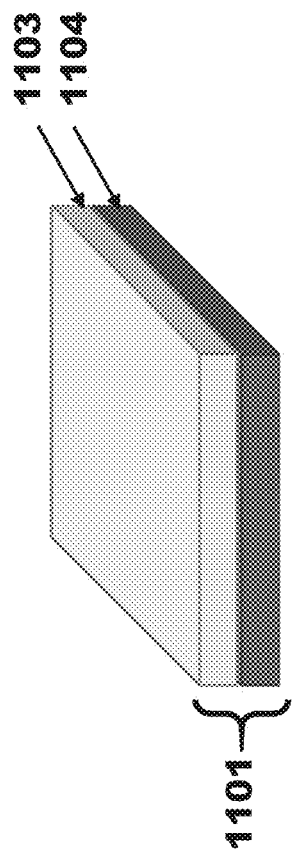

The polymer film 1101 is used in order to remove the island-like III-nitride semiconductor layers 109 from the III-nitride-based substrate 101 or a GaN template used with a hetero-substrate 101. In the present invention, dicing tape, including UV-sensitive dicing tape, which are commercially sold, can be used as the polymer film 1101. For example, the structure of the polymer film 1101 may comprise triple layers 1102, 1103, 1104 or double layers 1103, 1104, as shown in in FIGS. 25(*a*) and 25(*b*), respectively, but is not limited to those examples. The base film 1102 material, for example, having a thickness of about 80 μm, may be made of polyvinyl chloride (PVC). The backing film 1103 material, for example, having a thickness of about 38 μm, may be made of polyethylene terephthalate (P.E.T.). The adhesive layer 1104, for example, having a thickness of about 15 μm, may be made of acrylic UV-sensitive adhesive.

When the polymer film 1101 is a UV-sensitive dicing tape and is exposed to UV light, the stickiness of the film 1101 is drastically reduced. After removing the island-like III-nitride semiconductor layers 109 from the substrate 101, the polymer film 1101 is exposed by the UV light, which makes it is easy to remove.

Heat Sink Plate

The heat sink plate 1505 is preferably made of AlN, SiC, Si, Cu, CuW and the like, and the solder is preferably Au—Sn, Su—Ag—Cu, Ag paste and the like.

DIFFERENT EMBODIMENTS

The following describes different embodiments for manufacturing III-nitride devices 110.

First Embodiment

In a first embodiment, the substrate 101 used is an m-plane III-nitride substrate 101 with no mis-cut orientation. As shown in FIGS. 7(*a*) and 7(*b*) (0°), the ELO III-nitride layers 105 are uniform with a very smooth surface.

The ELO layer was measured by PL measurement. As shown in FIG. 3(*b*), it can be seen that the pyramidal hillocks 111 are almost completely contained within the opening area 103.

After that, as shown in FIGS. 4(*a*) and 12, the island-like III-nitride semiconductor layers 109 are removed using the method shown in FIGS. 11(*a*)-11(*e*).

After the removal, the PL and DIC images of FIGS. 12(*a*) and 12(*b*) were made of the ELO III-nitride layers 105. As shown in FIGS. 12(*a*) and 12(*b*), the ELO III-nitride layers, after removal, contained the pyramidal hillocks 111 and its back surface was not affected by the pyramidal hillocks 111. By doing this, the ELO III-nitride layers 105, and devices 110, are not affected by the pyramidal hillocks 111. The ability to embed the pyramidal hillocks 111 in the epi-layers 105 provides an important new method for obtaining a smooth surface of the epi-layers 105.

Figure 26A:
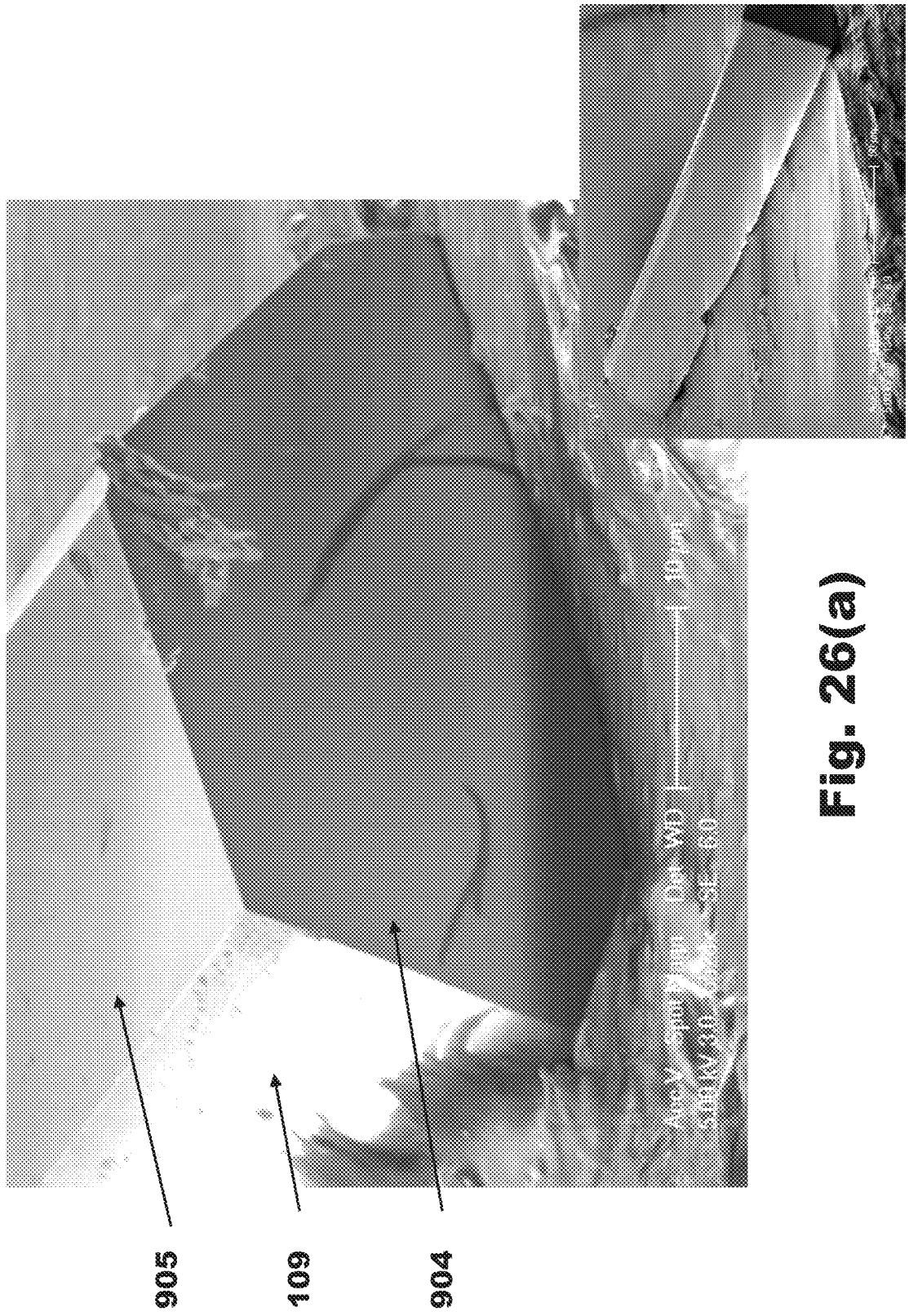
FIGS. 26(a) and 26(b) are images show facets of island-like III-nitride semiconductor layers after cleaving, according to one embodiment of the present invention.
Figure 26B:
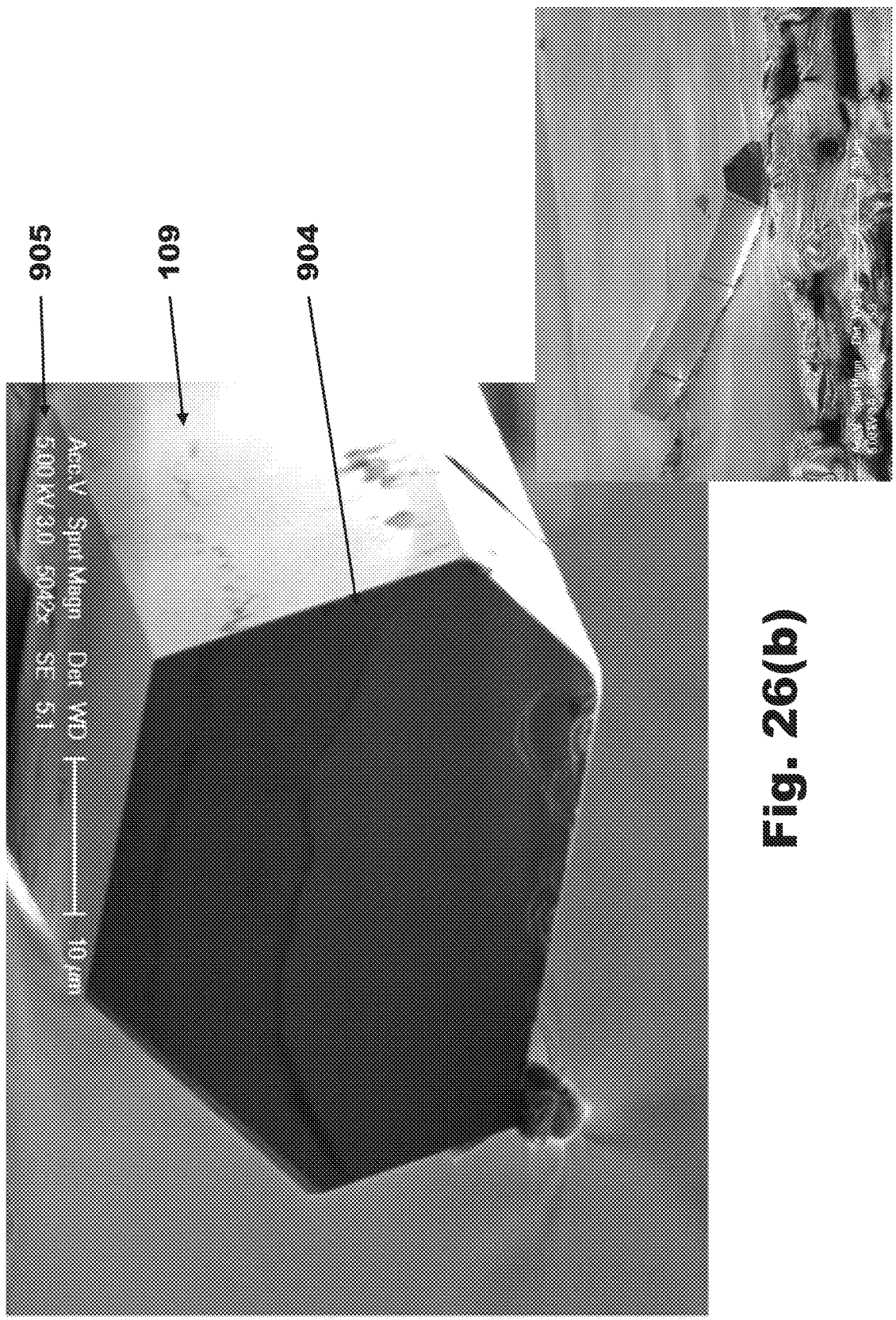
Figure 27A:
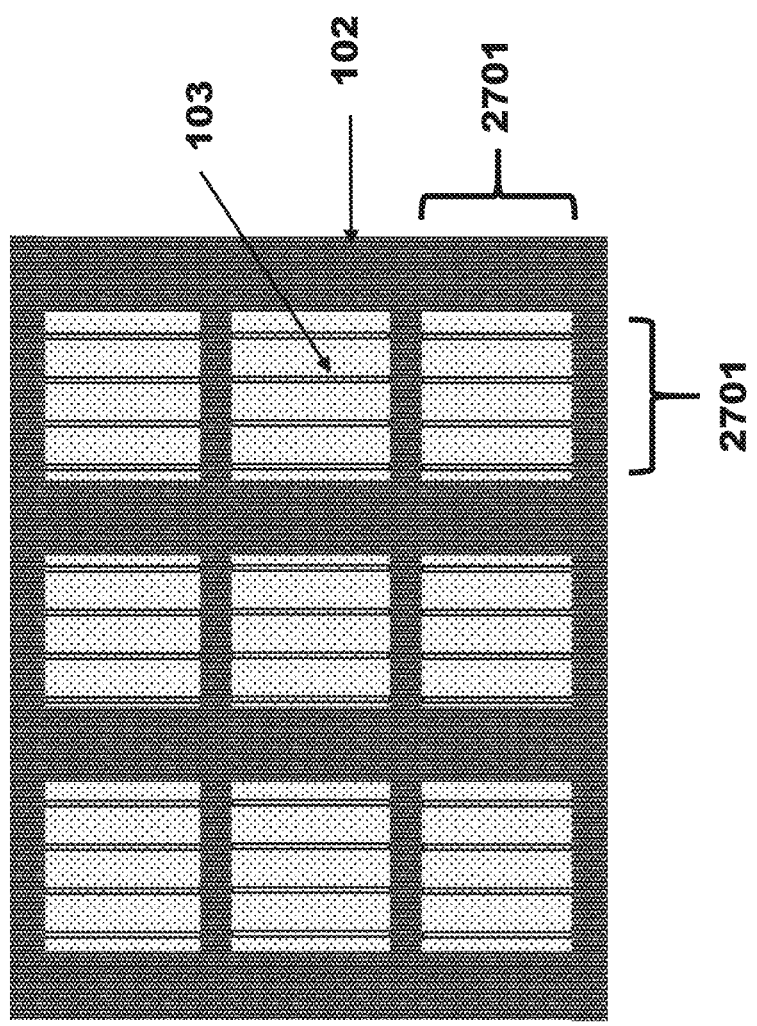
Figure 27E:
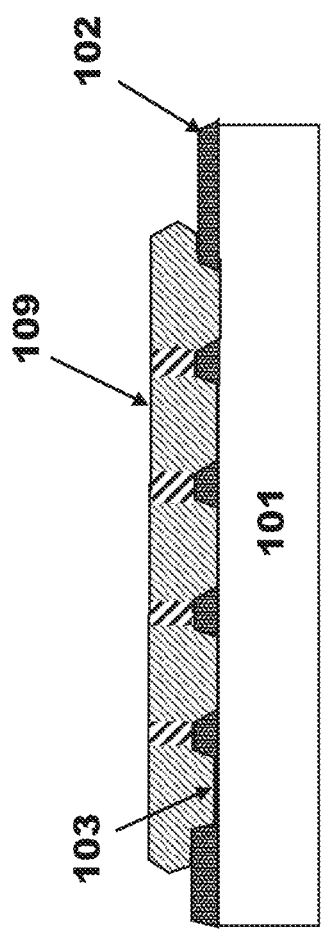
Figure 27F:
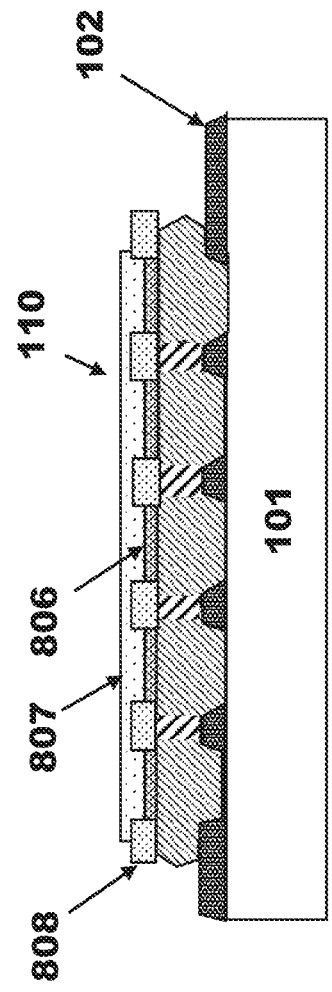
Figure 27G:
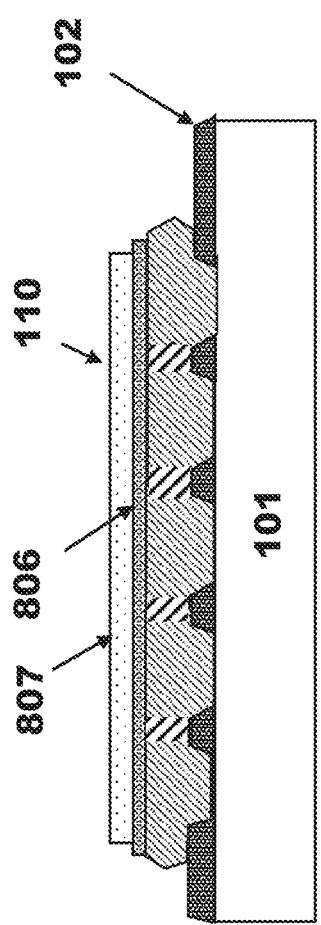

Then, the island-like III-nitride semiconductor layers 109 are divided into devices 110. FIGS. 26(*a*) and 26(*b*) show the facet 904 of the island-like III-nitride semiconductor layer 109 after cleaving, wherein the resulting facet 904 is atomically smooth.

The island-like semiconductor layer 109 can is processed by the method set forth above, namely Steps 1-13. By doing this, a laser diode device 110 can be obtained.

Second Embodiment

In a second embodiment, ELO structures are obtained, as illustrated in FIGS. 27(*a*)-27(*g*). These structures are suitable for an LED device 110.

In a Type 2 design, as shown in FIG. 27(*a*), the growth restrict mask 102 has several sub masks 2701. Each sub mask 2701 has length and breadth dimensions varied from 30 μm to 300 μm. In each sub mask 2701, the growth restrict mask 102 has open areas 103 with a width of 3 μm to 7 μm, and at an interval of 7 μm to 3 μm. The ELO III-nitride layers 105 grown in every sub mask 2701 are made to coalesce and care is taken to stop the coalescence between adjacent sub masks 2701.

In a Type 3 design, as shown in FIG. 27(*b*), the growth restrict mask 102 has opening areas 103 width of 3 μm to 7 μm at an interval of 7 μm to 3 μm, which are patterned throughout the entire growth restrict mask 102, wherein the growth restrict mask 102 stripes are vertical to a <11-20> axis for semipolar and nonpolar III-nitride-based substrates 101 and along a nonpolar direction for C-plane III-nitride-based substrates 101.

The ELO III-nitride layers 105 grown from opening areas 103 in the growth restrict mask 102 are made to coalesce on top of the growth restrict mask 102 covering the entire surface, as shown in FIG. 27(*b*). The ELO III-nitride layers 105 are then divided into sub mask 2701 patches 2702 via etching in regions 2703, as shown in FIG. 27(*c*). The sub mask 2701 patches 2702 are enlarged in FIG. 27(*d*).

A cross-sectional side view of the resulting structure, including the substrate 101, growth restrict mask 102, opening areas 103, and island-like III-nitride semiconductor layers 109, is shown in FIG. 27(*e*). As shown in FIG. 27(*f*), a ridge process may be performed to form an LD device 110, which may include a cladding layer 806, a current limiting layer 807, and a p-electrode 808. Otherwise, as shown in FIG. 27(*g*), a ridge process is not necessary to form an LED device 110, and a cladding layer 806 and p-electrode 808 are deposited.

Figure 28:
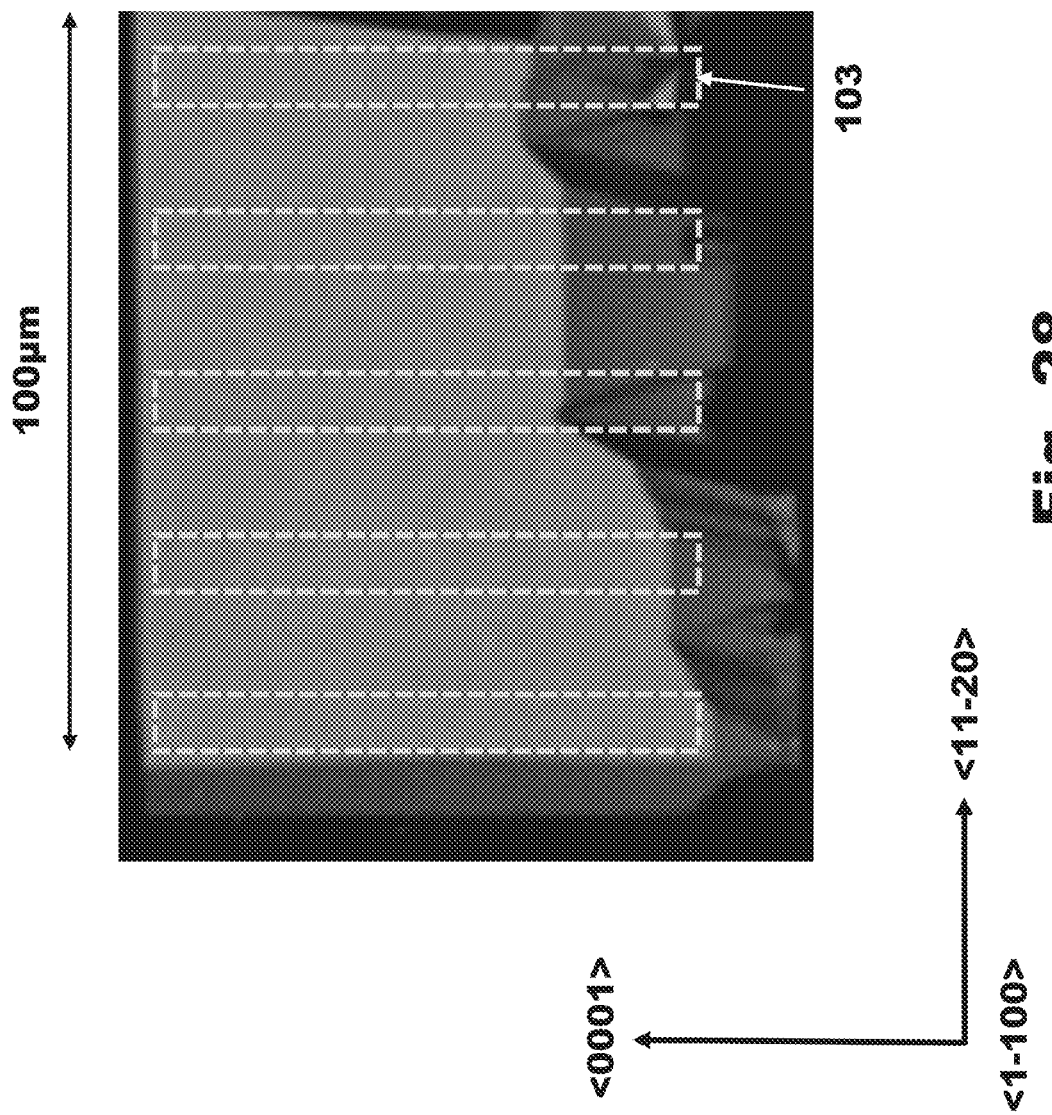
FIG. 28 is an image showing smooth surfaces of ELO structures embedding pyramidal hillocks, according to one embodiment of the present invention.

In this case, as shown in FIG. 28, a smooth surface can be obtained. This invention also embeds the pyramidal hillocks 111.

Third Embodiment

A third embodiment is almost same the first embodiment, except for not removing the ELO III-nitride layers 105.

This embodiment process is same for Step 1 through the Step 5 as described above. After Step 5, the back-side of the substrate 101, opposite the ELO III-nitride layers 105, is polished until the substrate 101 thickness is under 120 μm.

Then, an n-electrode 1504 is disposed on the back-side of the substrate 101, wherein the back-side of the substrate 101 is scribed by a laser to divide it into bars 901. The substrate 101 is divided into the bars 901 by a conventional breaking method, wherein the bar 901 is coated as shown in Step 10, and then the bar 901 is broken into the devices 110. Next, the devices 110 are mounted on the heat sink 1505. Finally, the devices 110 are mounted on stems 2102, as illustrated in FIG. 21.

In this case, the pyramidal hillocks 111 can also be embedded in the ELO III-nitride layers 105.

Process Steps

Figure 29:
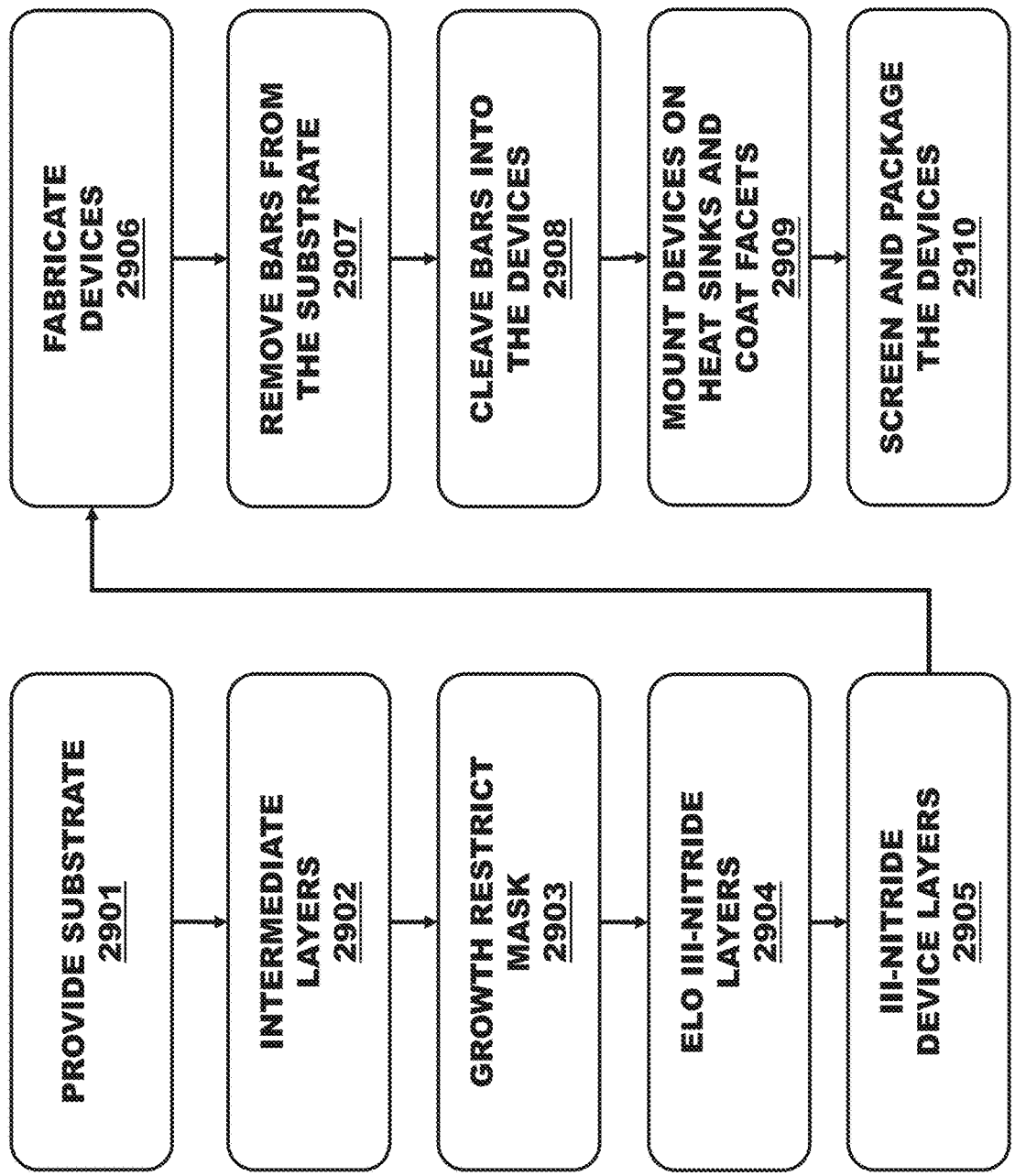
FIG. 29 is a flowchart that illustrates a method of fabricating a III-nitride semiconductor device, according to one embodiment of the present invention.

FIG. 29 is a flowchart that illustrates a method of fabricating a III-nitride semiconductor device 110, wherein island-like III-nitride semiconductor layers 109 are grown on a substrate 101 using a growth restrict mask 102 and epitaxial lateral overgrowth, and the epitaxial lateral overgrowth is stopped before the island-like III-nitride semiconductor layers 109 coalesce.

Block 2901 represents the step of providing a base substrate 101. In one embodiment, the base substrate 101 is a III-nitride based substrate 101, such as a GaN-based substrate 101, or a foreign or hetero-substrate 201.

Block 2902 represents an optional step of depositing an intermediate or template layer on the substrate 101. In one embodiment, the template layer is a III-nitride based layer, such as a GaN-based layer.

Block 2903 represents the step of forming a growth restrict mask 102 on or above the substrate 101, i.e., on the substrate 101 itself or on the template layer. The growth restrict mask 102 is patterned to include a plurality of striped opening areas 103.

Block 2904 represents the step of growing one or more III-nitride based layers 105 on or above the growth restrict mask 102 using epitaxial lateral overgrowth, wherein the epitaxial lateral overgrowth of the III-nitride layers 105 extends in a direction parallel to the opening areas 103 of the growth restrict mask 102, and the epitaxial lateral overgrowth is stopped before the III-nitride layers 105 coalesce on the growth restrict mask 102. In one embodiment, the ELO III-nitride layers 105 are ELO GaN-based layers 105.

Block 2905 represents the step of growing one or more additional III-nitride semiconductor device layers 106 on the ELO III-nitride layers 105. These additional III-nitride semiconductor device layers 106, along with the ELO III-nitride layers 105, form one or more of the island-like III-nitride semiconductor layers 109, which may be shaped as bars 901.

Block 2906 represents the step of fabricating devices 110 from the island-like III-nitride semiconductor layers 109 on the flat surface region 107 by conventional methods, wherein a ridge structure, p-electrode, p-pad, etc., are disposed on the island-like III-nitride semiconductor layers 109 at pre-determined positions, and the devices 110 may comprise laser diode devices 110 or light emitting diode devices 110. This step may also include forming a support structure for cleaving at side facets of the device 110.

Block 2907 represents the step of applying a polymer/adhesive film 1101 to the bars 901 of the devices 110, applying a pressure on the film 1101 from one or more sides, changing a temperature of the film 1101 and/or peeling the film 1101 with the devices 110 from the substrate 101, after the pressure is applied and/or the temperature is changed, wherein at least a portion of the island-like III-nitride semiconductor layers 109 may remain with the substrate 101 after the peeling. This step may also include dissolving the growth restrict mask 102 by wet etching.

Block 2908 represents the step of cleaving the bar 901 into one or more devices 110 or chips.

Block 2909 represents the step of mounting the devices 110 onto heat sink plates 1505, mounting the heat sink plates 1505 onto a spacer plate 1701, storing the spacer plates into a coating holder 1702, and then using the coating holder 1702 to coat the facets 904 of the laser device 110. This step may also include dividing the spacer plates 1701 into individual devices 110.

Block 2910 represents the step of screening the devices 110, and then mounting the devices 110 on/into packages.

The resulting product of the method comprises one or more III-nitride based semiconductor devices 110 fabricated according to this method, as well as a substrate 101 that has been removed from the devices 110 and is available for recycling and reuse, as described and illustrated herein.

Nomenclature

The terms "Group-III nitride" or "III-nitride" or "nitride" as used herein refer to any composition or material related to (B, Al, Ga, In)N semiconductors having the formula $B_wAl_xGa_yIn_zN$ where $0 \leq w \leq 1$, $0 \leq x \leq 1$, $0 \leq y \leq 1$, $0 \leq z \leq 1$, and $w+x+y+z=1$. These terms as used herein are intended to be broadly construed to include respective nitrides of the single species, B, Al, Ga, and In, as well as binary, ternary and quaternary compositions of such Group III metal species. Accordingly, these terms include, but are not limited to, the compounds of AlN, GaN, InN, AlGaN, AlInN, InGaN, and AlGaInN. When two or more of the (B, Al, Ga, In)N component species are present, all possible compositions, including stoichiometric proportions as well as off-stoichiometric proportions (with respect to the relative mole fractions present of each of the (B, Al, Ga, In)N component species that are present in the composition), can be employed within the broad scope of this invention. Further, compositions and materials within the scope of the invention may further include quantities of dopants and/or other impurity materials and/or other inclusional materials.

This invention also covers the selection of particular crystal orientations, directions, terminations and polarities of Group-III nitrides. When identifying crystal orientations, directions, terminations and polarities using Miller indices, the use of braces, { }, denotes a set of symmetry-equivalent planes, which are represented by the use of parentheses, ( ). The use of brackets, [ ], denotes a direction, while the use of brackets, < >, denotes a set of symmetry-equivalent directions.

Many Group-III nitride devices are grown along a polar orientation, namely a c-plane {0001} of the crystal, although this results in an undesirable quantum-confined Stark effect (QCSE), due to the existence of strong piezoelectric and spontaneous polarizations. One approach to decreasing polarization effects in Group-III nitride devices is to grow the devices along nonpolar or semipolar orientations of the crystal.

The term "nonpolar" includes the {11-20} planes, known collectively as a-planes, and the {10-10} planes, known collectively as m-planes. Such planes contain equal numbers of Group-III and Nitrogen atoms per plane and are charge-neutral.

Subsequent nonpolar layers are equivalent to one another, so the bulk crystal will not be polarized along the growth direction.

The term "semipolar" can be used to refer to any plane that cannot be classified as c-plane, a-plane, or m-plane. In crystallographic terms, a semipolar plane would be any plane that has at least two nonzero h, i, or k Miller indices and a nonzero l Miller index. Subsequent semipolar layers are equivalent to one another, so the crystal will have reduced polarization along the growth direction.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A device, comprising:
a plurality of III-nitride semiconductor layers, wherein:
at least one of the plurality of III-nitride semiconductor layers is grown from an opening area in a growth restrict mask, on or above a substrate, and on top of the growth restrict mask, using epitaxial lateral overgrowth,
the at least one of the plurality of III-nitride semiconductor layers contains at least one pyramidal hillock embedded therein,
the pyramidal hillock is formed within the opening area of the growth restrict mask during the epitaxial lateral overgrowth of the at least one of the plurality of III-nitride based semiconductor layers,
the epitaxial lateral overgrowth proceeds until the at least one of the plurality of III-nitride semiconductor layers completely embeds the pyramidal hillock to create a smooth epi-layer surface,
the at least one of the plurality of III-nitride semiconductor layers from adjacent opening areas do not coalesce on top of the growth restrict mask during the epitaxial lateral overgrowth,
the at least one of the plurality of III-nitride semiconductor layers has one or more flat surface regions and bending regions at the edges thereof, and
one or more III-nitride semiconductor device layers are grown on or above the flat surface regions.

2. The device of claim 1, wherein the growth restrict mask limits expansion of the pyramidal hillock in a lateral direction.

3. The device of claim 1, wherein the plurality of III-nitride semiconductor layers are grown on or above a III-nitride substrate.

4. The device of claim 1, wherein the plurality of III-nitride semiconductor layers are grown on or above a hetero-substrate, and a III-nitride template is deposited on or above the hetero-substrate before the plurality of III-nitride semiconductor layers.

5. The device of claim 1, wherein the plurality of III-nitride semiconductor layers are removed from the III-nitride substrate.

6. A method, comprising:
fabricating a device comprised of a plurality of III-nitride semiconductor layers, wherein:
at least one of the plurality of III-nitride semiconductor layers is grown from an opening area in a growth restrict mask, on or above a substrate, and on top of the growth restrict mask, using epitaxial lateral overgrowth,
at least one of the plurality of III-nitride semiconductor layers contains at least one pyramidal hillock embedded therein,
the pyramidal hillock is formed within the opening area of the growth restrict mask during the epitaxial lateral overgrowth of the at least one of the plurality of III-nitride semiconductor layers,
the epitaxial lateral overgrowth proceeds until the at least one of the plurality of III-nitride semiconductor layers completely embeds the pyramidal hillock to create a smooth epi-layer surface,
the at least one of the plurality of III-nitride semiconductor layers from adjacent opening areas do not coalesce on top of the growth restrict mask during the epitaxial lateral overgrowth,
the at least one of the plurality of III-nitride semiconductor layers has one or more flat surface regions and bending regions at the edges thereof, and
one or more III-nitride semiconductor device layers are grown on or above the flat surface regions.

7. The method of claim 6, wherein the growth restrict mask limits expansion of the pyramidal hillock in a lateral direction.

8. The method of claim 6, wherein the plurality of III-nitride semiconductor layers are grown on or above a hetero-substrate, and a III-nitride template is deposited on or above the hetero-substrate before the plurality of III-nitride semiconductor layers.

9. The method of claim 6, wherein the plurality of III-nitride semiconductor layers are removed from the III-nitride substrate.

10. The method of claim 9, wherein the plurality of III-nitride semiconductor layers are removed from the III-nitride substrate by:
applying a film to the III-nitride semiconductor layers;
applying a pressure on the film;
changing a temperature of the film and the substrate; and
peeling the film with the III-nitride semiconductor layers from the substrate, after the pressure is applied and the temperature is changed.

* * * * *